(12) United States Patent
Sato

(10) Patent No.: US 7,813,404 B2
(45) Date of Patent: Oct. 12, 2010

(54) LASER PROCESSING APPARATUS AND SOLID LASER RESONATOR

(75) Inventor: Masao Sato, Osaka (JP)

(73) Assignee: Keyence Corporation, Osaka (JP)

( * ) Notice: Subject to any disclaimer, the term of this patent is extended or adjusted under 35 U.S.C. 154(b) by 148 days.

(21) Appl. No.: 12/042,758

(22) Filed: Mar. 5, 2008

(65) Prior Publication Data

US 2008/0225917 A1 Sep. 18, 2008

(30) Foreign Application Priority Data

| Mar. 15, 2007 | (JP) | ............................... 2007-066798 |
| Mar. 15, 2007 | (JP) | ............................... 2007-066799 |
| Mar. 15, 2007 | (JP) | ............................... 2007-066800 |

(51) Int. Cl.
*H01S 3/09* (2006.01)
*H01S 3/091* (2006.01)

(52) U.S. Cl. .............................. 372/69; 372/70; 372/72

(58) Field of Classification Search ............ 372/69–72, 372/75, 92–93, 97–99, 107–108
See application file for complete search history.

(56) References Cited

U.S. PATENT DOCUMENTS

| 4,894,831 | A | * | 1/1990 | Alfrey | ......................... 372/19 |
| 5,271,031 | A | * | 12/1993 | Baer | ......................... 372/93 |
| 5,530,711 | A | * | 6/1996 | Scheps | ......................... 372/20 |
| 5,696,780 | A | * | 12/1997 | Pieterse et al. | ................. 372/19 |
| 5,987,049 | A | * | 11/1999 | Weingarten et al. | ........... 372/70 |
| 6,137,820 | A | * | 10/2000 | Maag et al. | .................. 372/108 |
| 6,287,298 | B1 | | 9/2001 | Nighan et al. | |
| 6,710,918 | B2 | * | 3/2004 | Birk et al. | ................... 359/385 |
| 7,016,389 | B2 | * | 3/2006 | Dudley et al. | .................. 372/75 |
| 2002/0085608 | A1 | * | 7/2002 | Kopf et al. | ..................... 372/75 |
| 2002/0191665 | A1 | * | 12/2002 | Caprara et al. | ................. 372/75 |
| 2005/0074047 | A1 | * | 4/2005 | Boggy et al. | ................... 372/69 |
| 2005/0211680 | A1 | * | 9/2005 | Li et al. | ................. 219/121.68 |
| 2007/0053403 | A1 | * | 3/2007 | Cox | ............................. 372/92 |
| 2008/0143888 | A1 | * | 6/2008 | Chilla et al. | ................. 348/759 |

FOREIGN PATENT DOCUMENTS

JP 11-505376 5/1999

* cited by examiner

*Primary Examiner*—Minsun Harvey
*Assistant Examiner*—Phillip Nguyen
(74) *Attorney, Agent, or Firm*—Kilyk & Bowersox, P.L.L.C.

(57) ABSTRACT

To provide a laser processing apparatus compatible with increase in the output of the pumping light source without increasing the reflectance of the output mirror. A solid laser medium for generating laser oscillation when pumping light from an pumping light source enters through two end surfaces, a splitting part for splitting pumping light outputted from the pumping light source into two paths so that the respective pumping components of pumping light enter through the respective end surfaces of the solid laser medium along the respective split paths, dichroic mirrors which are arranged along the split paths in such a manner as to face the respective end surfaces, allow pumping light to transmit and reflect laser oscillation light toward the end surface sides, and condenser lenses which are arranged along the split paths in such a manner as to face the dichroic mirrors and condense pumping light that transmits through the dichroic mirrors so that the diameter of the spot where the end surfaces of the solid laser medium are irradiated is smaller than in the $TEM_{00}$ mode of the solid laser medium are provided, and the configuration allows pumping light to enter through the respective end surfaces of the solid laser medium, so that the solid laser medium can be excited.

34 Claims, 34 Drawing Sheets

LASER PROCESSING APPARATUS AND SOLID LASER RESONATOR

BACKGROUND OF THE INVENTION

1. Field of the Invention

The present invention relates to a laser processing apparatus and solid laser resonator for processing, for example, printing, through irradiation of an object to be processed with a laser beam, including a laser marking apparatus.

2. Description of the Related Art

Using a laser processing apparatus, a predetermined region is scanned with a laser beam, and the surface of the object to be processed (workpiece), for example parts or products, is irradiated with a laser beam so as to be processed, for example through printing or marking. FIG. 33 shows an example of the configuration of a laser processing apparatus. The laser processing apparatus shown in this figure includes a laser control portion 901, a laser output portion 902 and an input portion 904. Pumping light generated by a laser pumping portion 910 of the laser control portion 901 is transferred to the laser output portion 902 so that a solid laser medium 921 which forms a resonator in a laser resonant portion 920 can be irradiated, and thus, laser oscillation is generated. Laser oscillation light is emitted through an end surface for emission of the solid laser medium 921 and the diameter of the beam enlarged by a beam expander 936, and is reflected from an optical member and led to a laser beam scanning system 930. The laser beam scanning system 930 reflects the laser beam and polarizes it in a desired direction, and the surface of the workpiece W is scanned with a laser beam LB outputted from a work region light condensing portion 940, and a process, such as printing, is carried out.

In terms of the configuration for exciting a solid laser medium, a one-directional pumping system where pumping light for exciting a solid laser medium enters through only one end surface for pumping and a laser beam is emitted through the other end surface, that is, so-called end pumping, is used, is known. In addition to this, a two-directional pumping system where the front and rear end surfaces of a solid laser medium are respectively irradiated with pumping light has also been proposed. In terms of two-directional pumping, a configuration where semiconductor lasers (Laser Diodes; LD), which are pumping light sources, are respectively placed against the end surfaces, as well as a configuration where pumping light from a single LD 928 is split by an optical fiber 932 so that a solid laser medium 921 is pumped from the two end surfaces, and the output comes from an output coupler 918, as disclosed in FIG. 34, is known (see for example Japanese Translation of Unexamined International Patent Publication H11 (1999)-505376).

SUMMARY OF THE INVENTION

In this technology, the diameter of the spot of pumping light (pump beam size) where the respective end surfaces of the solid laser medium are irradiated is slightly greater in size than the diameter in the $TEM_{00}$ mode of the solid laser medium. In the case where the diameter of the spot of pumping light is small, there is a risk that pumping may become concentrated in a small area and pumping may not occur in deep portions of the solid laser medium, and thus a thermal lens or strong thermal lens effect may be generated. Therefore, the thermal lens effect can be reduced through pumping in a broad area.

Meanwhile, further increase in the output of laser processing apparatuses has been in demand in recent years, and therefore, further increase in the output of LDs has been required. However, in the case where increase in the gain within the crystal of the solid laser medium is attempted with a pump beam size which is slightly greater in size than the diameter in the above described $TEM_{00}$ mode, a problem arises, such that the limit can be set only to a low level. Therefore, in the case where the output of the LD is set as high as 10 W or higher, the reflectance of optical members, including the output mirror of an output coupler 18 and the like, must be set high, and as a result, it becomes necessary to use highly reliable parts to form the resonator, and thus, a problem arises, such that the cost becomes high.

Furthermore, in the case where the reflectance of the output mirror is high, a problem arises, such that the energy increases inside the resonator and the optical members becomes susceptible to be damaged. In particular, in the case of a pulse laser having a Q switching function, the peak power is several tens of kW, and therefore, the load on the inside of the resonator further becomes high and the risk of damage becomes high.

The present invention is provided in order to solve these conventional problems. A main object of the present invention is to provide a laser processing apparatus and a solid laser resonator which is compatible with increase in the output of the pumping light source and does not increase the reflectance of the output mirror.

In order to achieve the above described object, the laser processing apparatus according to a first invention is a laser processing apparatus provided with: a laser control portion including a laser pumping portion for generating a laser beam; an pumping light transfer medium for transferring a laser beam generated by the laser control portion to a laser output portion described below; and a laser output portion including a laser beam scanning system for performing scanning with a laser beam transferred through the pumping light transfer medium, and the laser output portion can be formed of: a crystal solid laser medium which extends in one direction, has two end surfaces and generates laser oscillation when pumping light from the laser pumping portion enters through the two end surfaces; a splitting part for splitting pumping light outputted from the laser pumping portion into two paths so that different pumping components of pumping light enter through the respective end surfaces of the solid laser medium along the respective split paths; dichroic mirrors which are placed along the split paths in such a manner as to face the respective end surface, allow pumping light to transmit and reflect laser oscillation light toward the end surfaces; an output mirror which is placed in such a location as no-interference with the split paths and oriented in a direction approximately perpendicular to the laser oscillation light, and outputs the laser oscillation light from the dichroic mirrors; and condenser lenses which are placed along the split paths in such a manner as to face the dichroic mirrors and condense pumping light that transmits through the dichroic mirrors so that the diameter of the spot where the end surfaces of the solid laser medium are pumped becomes smaller than in the $TEM_{00}$ mode of the solid laser medium, so that pumping light enters through the respective end surfaces of the solid laser medium and the solid laser medium is pumped. As a result, the diameter of the spot of pumping light can be made smaller than in the $TEM_{00}$ mode of the solid laser medium in two-directional pumping, and thus, increase in the efficiency can be achieved.

Further, the laser processing apparatus according to a second invention is a laser processing apparatus provided with: a laser control portion including a laser pumping portion for generating a laser beam; an pumping light transfer medium for transferring a laser beam generated by the laser control portion to a laser output portion described below; and a laser output portion including a laser beam scanning system for performing scanning with a laser beam transferred through the pumping light transfer medium, and the laser output portion can be formed of: a crystal solid laser medium which extends in one direction, has two end surfaces and generates laser oscillation when pumping light from the laser pumping portion enters through two end surfaces, where the end surfaces are a first end surface which forms a surface through which pumping light enters, and a second end surface which is on the opposite side to the first end surface and forms a surface through which pumping light enters and is emitted; a splitting part for splitting pumping light outputted from the laser pumping portion into two paths: a first split path and a second split path, in such a manner that first and second pumping components of pumping light enter the first and second end surfaces of the solid laser medium along the first and second split paths, respectively; a first dichroic mirror which is placed along the first split path in such a manner as to face the first end surface, allows pumping light to transmit, and reflects laser oscillation light toward the first end surface side; a second dichroic mirror which is placed along the second split path in such a manner as to face the second end surface, allows pumping light to transmit, and reflects laser oscillation light toward an output mirror described below; an output mirror which is placed in such a location as not to interfere with the split paths and oriented in a direction approximately perpendicular to the laser oscillation light, and outputs light reflected from the second dichroic mirror; a first condenser lens which is placed along the first split path in such a manner as to face the first dichroic mirror and condense a first pumping component of pumping light that transmits through the first dichroic mirror in such a manner that the diameter of the spot where the first end surface is pumped becomes smaller than in the $TEM_{00}$ mode of the solid laser medium; and a second condenser lens which is placed along the second split path in such a manner as to face the second dichroic mirror and condense a second pumping component of pumping light that transmits through the second dichroic mirror in such a manner that the diameter of the spot where the second end surface is pumped becomes smaller than in the $TEM_{00}$ mode of the solid laser medium, so that the first and second pumping components of pumping light enter through the first and second end surfaces of the solid laser medium and the solid laser medium is pumped. As a result, the diameter of the spot of pumping light can be made smaller than in the $TEM_{00}$ mode of the solid laser medium in two-directional pumping, and thus, increase in the efficiency can be achieved.

Furthermore, the solid laser resonator according to a third invention is provided with: a pumping light source for generating pumping light; a crystal solid laser medium which extends in one direction, has two end surfaces and generates laser oscillation when pumping light from the pumping light source enters through the two end surfaces; a splitting part for splitting pumping light outputted from the pumping light source into two paths in such a manner that different pumping components of pumping light enter through the respective end surfaces of the solid laser medium along the respective split paths; dichroic mirrors which are placed along the split paths in such a manner as to face the respective end surfaces, allow pumping light to transmit, and reflect laser oscillation light toward the end surfaces; an output mirror which is placed in such a location as not to interfere with the split paths and oriented in a direction approximately perpendicular to the laser oscillation light, and outputs laser oscillation light from the dichroic mirrors; and condenser lenses which are placed along the split paths in such a manner as to face the dichroic mirrors and condense pumping light that transmits through the dichroic mirrors in such a manner that the diameter of the spot where the end surfaces of the solid laser medium are pumped is smaller than in the $TEM_{00}$ mode of the solid laser medium, and can be formed so that pumping light enters the respective end surfaces of the solid laser medium and the solid laser medium is pumped. As a result, the diameter of the spot of pumping light in two-directional pumping can be made smaller than in the $TEM_{00}$ mode of the solid laser medium, so that increase in the efficiency can be achieved.

DETAILED DESCRIPTION OF THE PREFERRED EMBODIMENTS

Figure 1:
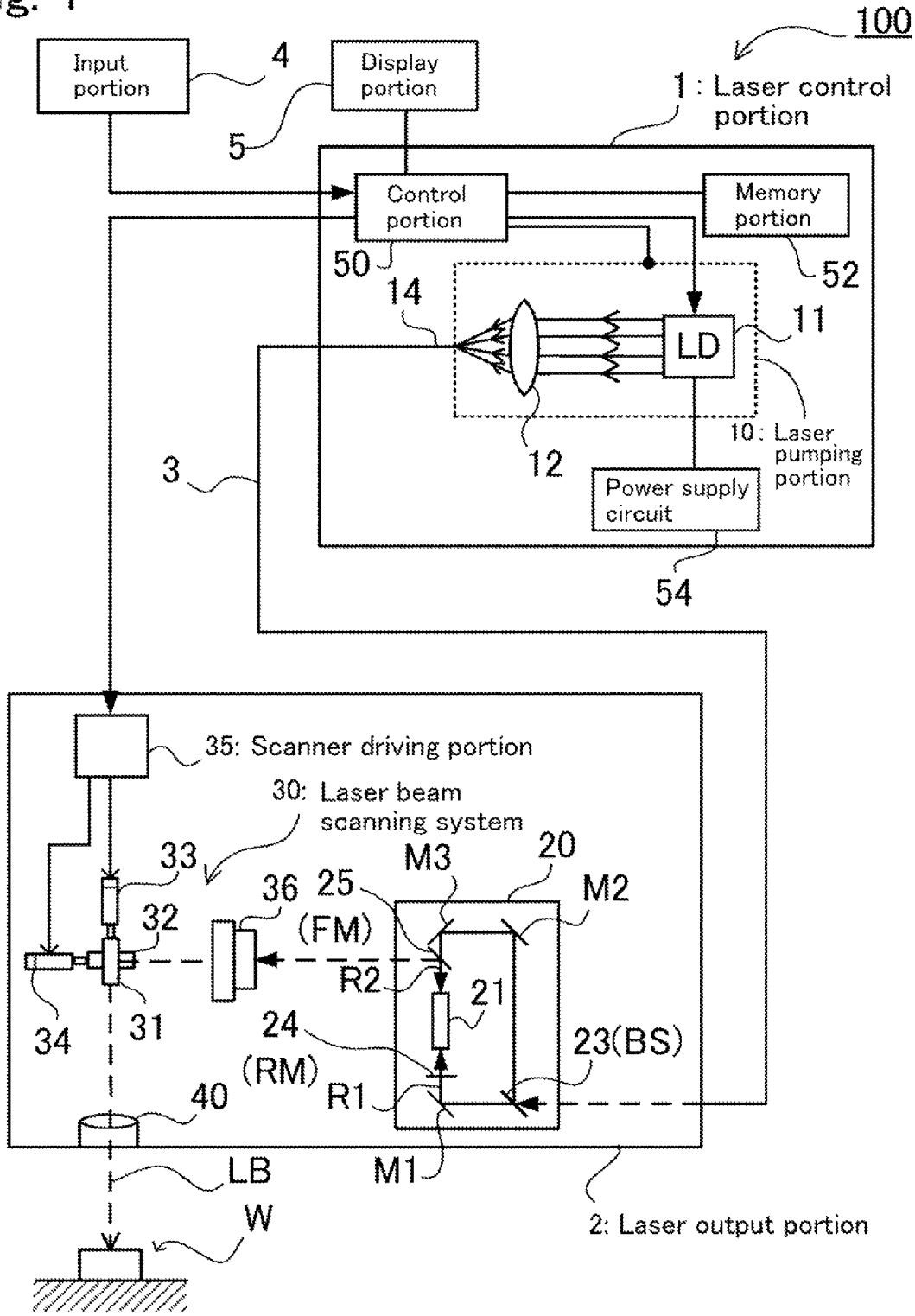
FIG. 1 is a block diagram showing the configuration of the laser processing apparatus according to Embodiment 1 of the present invention.

The present invention will be described with reference to the drawings. Here, the embodiments described below illustrate a laser processing apparatus and a solid laser resonator for implementing the technological idea of the present invention, and the present invention does not limit the laser processing apparatus and solid laser resonator to those below. Further, the present specification by no means limits the members described in the claims to the members in the embodiments. Particularly, the dimensions, materials, form, relative arrangement and the like of the components described in the embodiments are not intended to limit those in the scope of the present invention unless otherwise stated, and are merely illustrative. Here, the dimensions and the positional relationship of the members shown in the figures may be exaggerated in order to make the illustration more clear. Furthermore, in the following description, the same names and symbols denote members which are the same or similar, and detailed description for these is omitted. Furthermore, in terms of the components of the present invention, a number of components may be formed of the same member so that one member has the function of the number of components in some embodiments, or the function of one member may be performed by a number of members.

In the present specification, the laser processing apparatus is electrically connected to the computer for carrying out processes for operation, control, input/output, display and the like, the printer, the external memory apparatus and other peripheral devices through serial connection, for example IEEE1394, RS-232x, RS-422, RS-423, RS-485, USB or PS2, parallel connection or a network, for example 10BASE-T 100BASE-TX or 1000BASE-T for communication. The connection is not limited to physical connection using wires, and may be wireless connection using radio waves, infrared rays, optical communication or the like through a wireless LAN, for example IEEE 802.1x or an OFDM system, or Bluetooth (registered trademark). Furthermore, memory cards, magnetic discs, optical discs, magnet-optical discs, semiconductor memories and the like can be used as the recording medium for storing the data and settings of observed images.

In the following embodiments, a laser marker is described as an example of a laser processing apparatus which implements the present invention. Here, in the present specification, the laser processing apparatus can be used for general laser applied devices, irrespectively of the name, and applied broadly to processing using laser irradiation, for example laser resonators and a variety of laser processing apparatuses, laser processing, for example drilling, marking, trimming, scribing and surface processing, as well as other laser application fields using laser light sources, for example material processing, spectrometry, wafer inspection, medical diagnosis and laser printing, and can also be used for such applications as microscopic processing of semiconductors, display repair and trimming systems. As described above, the laser processing apparatus in the present specification, including the processing described above, is referred to as laser processing apparatus, irrespectively of the name. Further, in the present specification, printing is described as a typical example of processing, but the present invention is not limited to printing processing, and can be used in various processes using a laser beam, for example fusing, peeling, surface oxidation, cutting, changing of color and the like.

Embodiment 1

FIG. 1 is a block diagram showing the configuration of a laser processing apparatus 100 according to Embodiment 1. The laser processing apparatus 100 shown in this diagram comprises a laser control portion 1 and a laser output portion 2. The laser control portion 1 forms a controller portion for controlling the laser output portion 2, and is optically connected to the laser output portion 2 through an pumping light transfer medium 3. Further, the laser output portion 2 outputs an output laser beam as a head portion for laser marking. This laser control portion 1 includes a laser pumping portion 10 which forms an pumping light source. Furthermore, an input portion 4 for inputting a process pattern when necessary and a display portion 5 for displaying screens of various settings are connected to the laser control portion 1. Meanwhile, the laser output portion 2 includes a laser resonant portion 20 for generating laser oscillation by entering the pumping light into the solid laser medium, and a laser beam scanning system 30 for scanning the surface of the object W to be processed (workpiece) with an outputted laser beam. A work region light condensing portion 40, for example an fθ lens, is placed on the output side of the laser beam scanning system 30 if necessary.

(Input Portion 4, Display Portion 5)

The input portion 4 is connected to the laser control portion 1, and allows the setting required to operate the laser processing apparatus 100 to be inputted and transmits it to the laser control portion 1. The contents of the setting are the conditions for operating the laser processing apparatus 100, the concrete contents of processing and the like. The input portion 4 is an input device, such as a keyboard, a mouse or a console. An additional display portion with which input information inputted through the input portion 4 is confirmed and which displays the state of the laser control portion 1 can be separately provided. A monitor, for example an LCD or cathode ray tube, can be used as the display portion 5. Further, in the case where a touch panel system is used, the display portion may be used as the input portion. Thus, the required settings for the laser processing apparatus 100 can be provided through the input portion without connecting to an external computer and the like.

(Laser Control Portion 1)

The laser control portion 1 includes a control portion 50, a memory portion 52, a laser pumping portion 10 and a power supply circuit 54. The contents of the setting inputted through the input portion 4 are recorded in the memory portion 52. The control portion 50 reads the contents of the setting from the memory portion 52 if necessary, and operates the laser pumping portion 10 based on a processing signal corresponding to the contents of processing so that the solid laser medium 21 in the laser output portion 2 is excited. Semiconductor memories, such as RAMs and ROMs, can be used as the memory portion 52. Further, semiconductor memory cards, for example PC cards and SD cards (registered trademark) which can be built in or inserted into the laser control portion 1, as well as memory cards, for example card-type hard discs, can be used as the memory portion 52. The memory portion 52 formed of a memory card can be easily rewritten with an external device, such as a computer, so that the contents set by the computer are written into the memory card which is then set in the laser control portion 1, and thus, the setting can be initiated without connecting the input portion to the laser control portion. In particular, semiconductor memories provide high speed read-in and write-in of data, and no mechanically operating portions, and thus are tough against vibration, and therefore, can prevent accidental data erasure due to clashing, such as that which occurs in hard discs.

Furthermore, the control portion 50 scans a laser beam oscillated by the solid laser medium 21 in order to carry out the set process on a workpiece W, and therefore, outputs a scanning signal for operating the laser beam scanning system 30 of the laser output portion 2 to the laser beam scanning system 30. The power supply circuit 54 applies a predetermined voltage to the laser pumping portion 10 as a constant voltage power supply. The processing signal for controlling the processing operation is a PWM signal based on the HIGH/LOW of which ON/OFF switching of the laser beam is carried out and of which each pulse corresponds to one pulse of the oscillating laser beam. Though the laser intensity is defined based on the duty ratio depending on the frequency of the PWM signal, the PWM signal can be formed so that the laser intensity varies depending on the scanning rate based on the frequency.

(Laser Pumping Portion 10)

Figure 2:
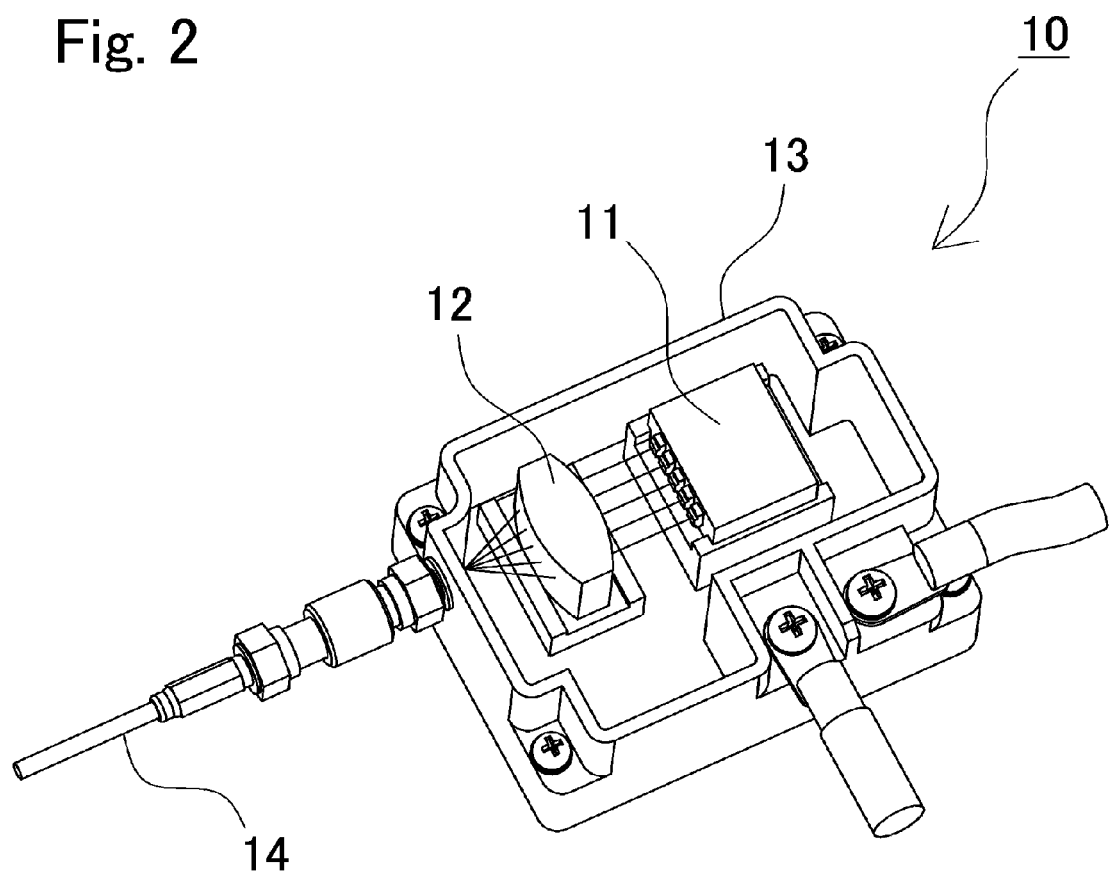
FIG. 2 is a perspective view showing the internal structure of the laser pumping portion in FIG. 1.

The laser pumping portion 10 includes an pumping light source 11 and an pumping light condensing portion 12 which are optically connected. An example of the laser pumping portion 10 is shown in the perspective view of FIG. 2. In the laser pumping portion 10 shown in this view, the pumping light source 11 and the pumping light condensing portion 12 are secured in an pumping casing 13. The pumping casing 13 is made of a metal having high thermal conductivity, such as copper, and efficiently releases heat from the pumping light source 11 to the outside. The pumping light source 11 is formed of a semiconductor laser (LD) or a lamp. In FIG. 2, an LD array or an LD bar where a plurality of LD elements are aligned in linear form is used, so that the laser oscillation from the respective elements is outputted in line shape. The emitting laser enters through the entrance surface of the pumping light condensing portion 12 and is outputted through the emission surface as a condensed laser pumping beam. The pumping light condensing portion 12 has a focusing lens and the like. The laser pumping beam from the pumping light condensing portion 12 enters the laser resonant portion 20 through an optical fiber 14 and the like. The pumping light source 11 and the pumping light condensing portion 12, as well as the optical fiber 14, are optically connected through space or an optical fiber. Further, an LD unit or an LD module in which such members are incorporated in advance can be used as the laser exciting portion 10. Here, an LD unit having an output of as high as 40 W to 50 W is used, and the pumping light is split by a splitting part. Furthermore, the pumping light emitted from the laser pumping portion 10 may be non-polarized light. Thus, it becomes unnecessary to take change in the state of polarization into consideration, and thus, the design is advantageous. In particular, it is preferable for the LD unit for bundling light gained from the respective LD elements in the LD array, where several tens of LD elements are aligned, by means of an optical fiber, and outputting light to be provided with a mechanism for converting the output light to non-polarized light. Alternatively, light may be in a non-polarized state (random polarization) during the process of transfer from the laser pumping portion 10 through an optical fiber cable, the process for optical coupling with a split path using an pumping light coupling part and the like in the configuration.

The laser pumping portion 10 is provided with a temperature adjusting mechanism for adjusting the temperature of the pumping light source 11. In particular, semiconductor light emitting elements, such as LD elements, are temperature-dependent, such that the wavelength changes depending on the temperature, and therefore, the temperature adjusting mechanism is controlled so that an appropriate temperature is maintained when the temperature of the LD elements is measured, and a laser pumping beam having a desired wavelength can be gained. The temperature adjusting mechanism can use a Pelletier element or the like.

(Laser Output Portion 2)

The laser pumping beam generated by the laser pumping portion 10 as described above is transferred to the laser output portion 2 through the pumping light transfer medium 3. An optical fiber cable or the like is used as the pumping light transfer medium 3. Further, the optical fiber 14 of the laser pumping portion 10 may be used as the pumping light transfer medium 3 as it is. The laser output portion 2 allows the laser pumping light to enter the laser resonant portion 20 so that the laser output beam is generated through laser oscillation, and at the same time, allows the laser beam scanning system 30 to scan a work region with the laser beam in a desired processing pattern.

(Laser Resonant Portion 20)

The laser resonant portion 20 is a solid laser resonator or a laser oscillator unit for generating a laser beam by the laser oscillation. This laser resonant portion 20 includes an pumping light coupling part 22 for introducing pumping light from the pumping light source 11, a splitting part 23 for splitting pumping light introduced from the pumping light coupling part 22 into a first split path B1 and a second split path B2, a solid laser medium 21 into which pumping light enters through respective end surfaces from the first split path B1 and the second split path B2 and which is thus excited, a first dichroic mirror 24 and a second dichroic mirror 25 which are placed in such a manner as to face each other at a predetermined distance along the optical path of the induced emission light emitted by the solid laser medium 21, and an output mirror 26 which is placed in such a location as not to interfere with the split paths and outputs light reflected from the second dichroic mirror 25. Here, the first dichroic mirror 24 is referred to as a rear side mirror RM and the second dichroic mirror 25 is referred to as an emission side mirror FM. The rear side mirror RM is secured perpendicular to the direction in which the laser oscillation beam goes and the emission side mirror FM is secured diagonally at 45° relative to the direction of the entrance so that the laser oscillation beam is reflected toward the output mirror 26 side.

Meanwhile, an aperture 27, a Q switch 28, a laser shutter and the like are placed between the output mirror 26 and the emission side mirror FM. An optical fiber cable, which is the pumping light transfer medium 3, is connected to the pumping light coupling part 22 so that pumping light generated by the laser pumping portion 10 is introduced into the laser resonant portion 20 and at the same time split by the splitting part 23 so as to enter the solid laser medium 21 through the respective end surfaces. The induced emission light emitted by the solid laser medium 21 is amplified through multiple reflections between the emission side mirror FM and the rear side mirror REM, and the mode is selected by the aperture 27 while the laser beam is allowed to pass and blocked in short periods through the operation of the Q switch 28, so that the laser beam is outputted through the output mirror 26. The path from this rear side mirror RM to the output mirror 26 through the emission side mirror FM forms a laser resonator.

The aperture 27 is an opening smaller than the diameter of the solid laser medium 21, and provided in a blocking plate of which the center is adjusted to that of the optical path of the induced emission light, and functions as a mode selector having a function of selecting the mode for suppressing oscillation of unnecessary modes. Through this selection of the mode, the quality of laser processing can be improved.

Further, the Q switch 28 opens and blocks the optical path of the induced emission light which reciprocates between the output mirror 26 and the reflection mirror in short periods, increases the number of merits (Q value) as the resonator, and carries out an operation for controlling ON/OFF of the laser beam at high speed. In the present embodiment, the frequency of the Q switch is variable between 1 kHz to 400 kHz, and CW oscillation is also possible.

The output mirror 26 is a half mirror for outputting light reflected from the emission side mirror FM and placed in such a location as not to interfere with the split paths, and receives light reflected from the second dichroic mirror in a direction approximately perpendicular to the laser oscillation beam.

Meanwhile, the pumping light coupling part 22 is a member for optically connecting the pumping light transfer medium 3 to the splitting part 23, and provided with an optical fiber coupling portion 22a for connecting an optical fiber cable and a collimate lens 22b which is placed between the optical fiber coupling portion 22a and the splitting part 23 and reshapes pumping light entering from the LD unit through the optical fiber coupling portion 22a to parallel light. A plano-convex lens can be used as the collimate lens 22b.

Pumping light that is made parallel by the collimate lens 22b is transferred to the end surface sides of the solid laser medium 21 through the first split path B1 and the second split path B2, and after that, condenses light with a condenser lens, before entering through the rear side mirror RM and the emission side mirror FM. Here, a first condenser lens 61 and a second condenser lens 62 are placed along the first split path B1 and the second split path B2 in such a manner as to face the rear side mirror RM and the emission side mirror FM, respectively. As described below, the first condenser lens 61 condenses pumping light that transmits through the rear side mirror RM so that the diameter of the spot where the first end surface of the solid laser medium 21 is irradiated with a first pumping component R1 becomes smaller than in the $TEM_{00}$ mode of the solid laser medium 21. Further, the second condenser lens 62 condenses pumping light that transmits through the emission side mirror FM so that the diameter of the spot where the second end surface of the solid laser medium 21 is irradiated with the second pumping component R2 becomes smaller than in the $TEM_{00}$ mode of the solid laser medium 21. Plano-convex lenses can be used as the first condenser lens 61 and second condenser lens 62.

(Arrangement of Laser Resonant Portion 20)

The splitting part 23 splits pumping light outputted from the pumping light source 11 into the first pumping component R1 and the second pumping component R2. The split first pumping component R1 and the second pumping component R2 are respectively allocated to the first split path B1 and the second split path B2 so that the first pumping component R1 and the second pumping component R2 of pumping light enter from the first split path B1 and the second split path B2 through the first end surface and the second end surface of the solid laser medium 21, respectively. A beam splitter BS, such as a half mirror or the like, can be used as the split part 23.

The first split path B1 and the second split path B2 are respectively formed of optical members, for example a beam splitter BS, a reflection mirror and the like. That is, a first reflection mirror M1 for reflecting the first pumping component R1 or the second pumping component R2 split by the beam splitter BS approximately perpendicularly, a second reflection mirror M2 for further reflecting reflection light reflected from the first reflection mirror M1 or the second pumping component R2 or first pumping component R1 split by the beam splitter BS in an approximately perpendicular direction, and a third reflection mirror M3 for reflecting reflection light reflected from the second reflection mirror M2 approximately perpendicularly form a split path. The split paths are formed in rectangular form in this manner, and thus, the split paths for exciting the solid laser medium 21 in two directions can be made compact, and furthermore, the arrangement of the respective reflection mirrors and the adjusting work can be made easy. In particular, the beam splitter BS, the first reflection mirror M1, the second reflection mirror M2 and the third reflection mirror M3 are arranged in the same plane, and thus, the adjusting work for positioning the respective members is easy to carry out. In this example, all of the optical members are placed on one structural substrate 63, and thus, a solid laser resonator can be designed with a simple configuration. Further, the medium for transferring light from the pumping light source 11 to the beam splitter BS may be one member when only one pumping light source 11 is provided, and this can contribute to simplification of the configuration. Further, the configuration where light is split from one pumping light source 11 has an advantage such that it can be formed at low cost in comparison with conventional configurations, where the medium is excited through the respective end surfaces with two LDs.

Furthermore, the above described configuration can increase the freedom in terms of the layout of the respective members, including the solid laser medium 21 and the pumping light coupling part 22 and the like. That is, the solid laser medium 21, the rear side mirror RM and the emission side mirror FM can be arranged along any side of the rectangular form, and pumping light from the pumping light source 11 can enter through any apex of the rectangular form along a line which extends from any of the sides of the rectangular form with the apexes in the arrangement. In this manner, the arrangement of the members can be changed, and thus, there is an advantage, such that an appropriate layout can be adopted in accordance with the space and form provided for the laser resonant portion 20.

Figure 3:
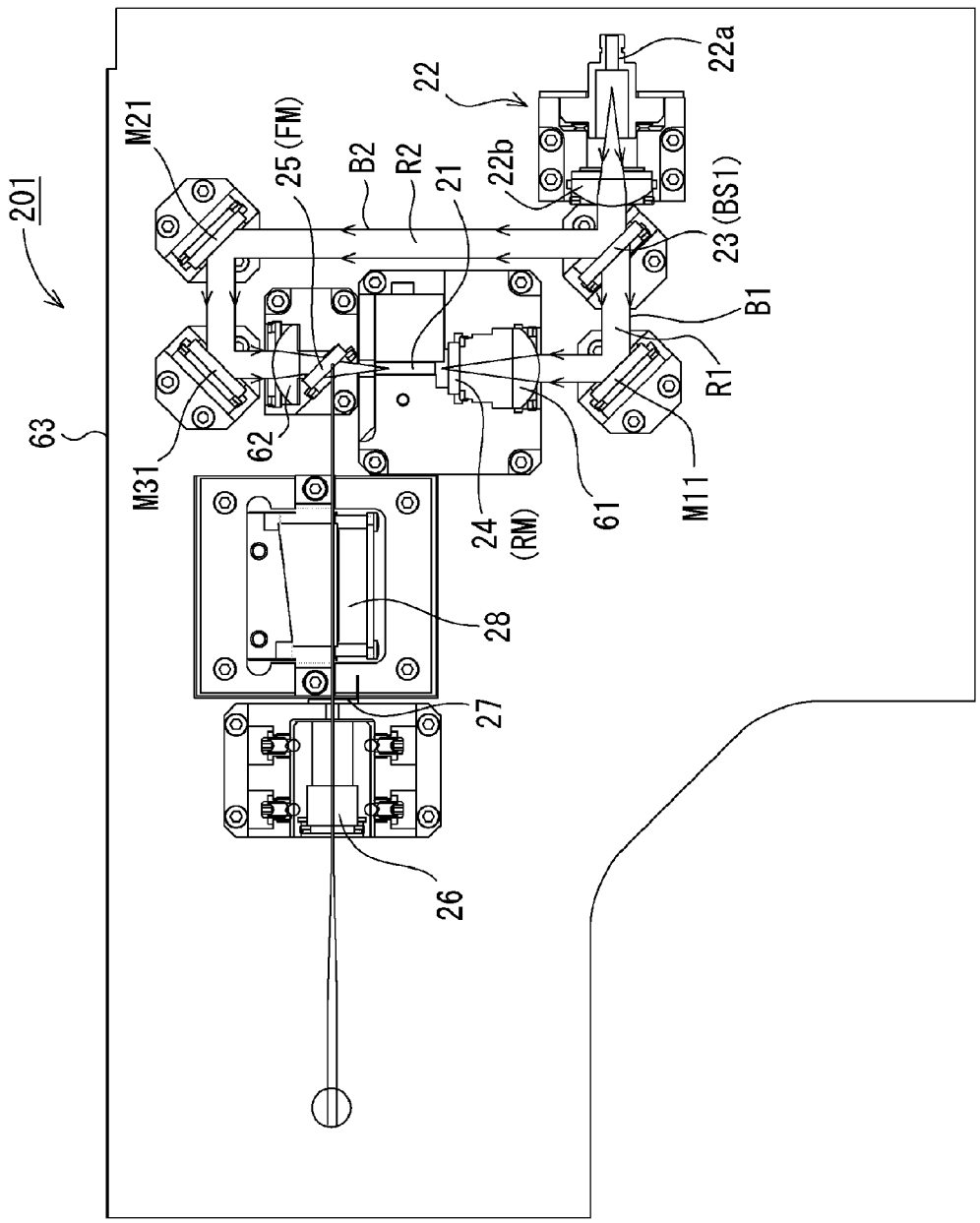
FIG. 3 is a plan view showing an example of the arrangement of optical members in the laser resonant portion according to Embodiment 1.

FIG. 3 shows a concrete example of the arrangement of optical members. In a laser resonant portion 201 shown in this figure, a solid laser medium 21, a rear side mirror RM and an emission side mirror FM are arranged on one long side of the split path in rectangular form (left in FIG. 3) and a beam splitter BS1 is arranged at the apex along the other long side (right in FIG. 3), on the side closer to the rear side mirror RM, so that the arrangement of the pumping light coupling part 22 in close proximity to the beam splitter BS1 allows pumping light to enter in a direction perpendicular to the long sides. That is, in FIG. 3, the beam splitter BS1 is arranged at the lower right apex of the rectangular form which is long in the longitudinal direction. A first reflection mirror M11 is arranged at the lower left apex, a second reflection mirror M21 is arranged at the upper right apex, and a third reflection mirror M31 is arranged at the upper left apex. Further, the first, second and third reflection mirrors M11 to M31 are secured in such a manner as to be inclined in a chamfering direction, that is, relative to the respective sides in such a direction that the interior angle is 135°, so that entering light is reflected at a right angle from each mirror. Meanwhile, the beam splitter BS1 is secured in such a manner as to be inclined in such a direction that the interior angle is 45° relative to each side, in order to split entering light into transmission light which goes straight and reflection light reflected at a right angle. An pumping light coupling part 22 is arranged on the right side of the beam splitter BS1 so that pumping light from the LD unit that enters through the optical fiber coupling portion 22a which is linked to the optical fiber cable is reshaped to parallel light through the collimate lens 22b and the pumping light enters toward the beam splitter BS1 (toward the left in FIG. 3). The beam splitter BS1 is secured in such a position as to be inclined at an angle of 45° relative to the entering light, so as to split pumping light into transmission light in the direction in which light goes straight, which is the first pumping component R1, and reflection light reflected upward, which is the second pumping component R2. The first reflection mirror M11 is secured on the left side of the beam splitter BS1 in such a manner as to be inclined by 45° relative to the entering light, so that the first pumping component R1 is reflected in the upward direction. This reflection light is condensed through the first condenser lens 61 and enters the rear side mirror RM. As described above, the first split path B1 is formed in L shape.

Meanwhile, the second pumping component R2 reflected by the beam splitter BS1 in the upward direction is reflected from the second reflection mirror M21, which is secured in such a position as to be inclined by 45° relative to the entering light in the horizontal direction (toward the left in FIG. 3). Reflection light goes parallel to transmission light which transmits through the beam splitter BS1, and is reflected from the third reflection mirror M31 which is secured in such a position as to be inclined by 45° relative to the entering light in the downward direction. This reflection light of the second pumping component R2 is condensed through the second condenser lens 62 so as to enter into the emission side mirror FM. As described above, the second split path B2 is formed in reverse L shape. As a result, the reflection light of the first pumping component R1 reflected from the first reflection mirror M11 and the reflection light of the second pumping component R2 reflected from the third reflection mirror M31 face each other along the same axis. Further, the first pumping component R1 and the second pumping component R2 enter the rear side mirror RM and the emission side mirror FM, respectively, so that the laser is oscillated by the solid laser medium 21 placed between the dichroic mirrors, and induced emission light is emitted from the emission side mirror FM. That is, the laser oscillation light is reflected from the emission side mirror FM, which is secured in such a manner as to be inclined by 45° in the lateral direction (toward the left in FIG. 3) and reaches the output mirror 26 through the Q switch 28 and the aperture 27, and thus, laser output light is outputted.

Embodiment 2

Figure 4:
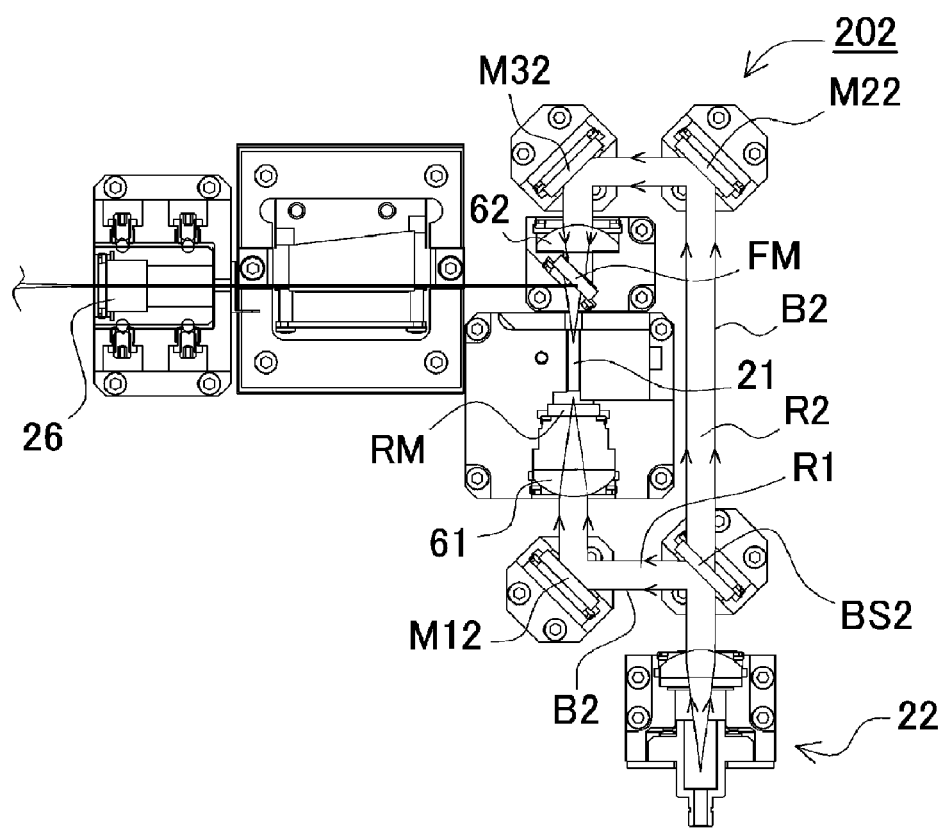
FIG. 4 is a plan view showing an example of the arrangement of optical members in the laser resonant portion according to Embodiment 2.

The above described layout is one example, and the arrangement of the beam splitter BS, the pumping light coupling part 22 and the solid laser medium 21 can be changed. Next, FIG. 4 shows an example of the arrangement of the optical members of the solid laser oscillator according to Embodiment 2 as an example of a layout where the location of an pumping light coupling part 22 is changed. In a laser resonant portion 202 shown in this figure also, a solid laser medium 21, a rear side mirror RM and an emission side mirror FM are arranged along one long side of the split path formed in rectangular form (left side in FIG. 4), and a beam splitter BS2 is arranged at the apex along the other long side (left side in FIG. 4), on the side close to the rear side mirror RM. Here, the pumping light coupling part 22 is arranged in close proximity to the beam splitter BS2 so that pumping light enters in a direction which coincides with the long sides. Here, the arrangement of the optical members is similar to that in FIG. 3, and the beam splitter BS2 is arranged at the lower right apex of the rectangular form, which is long in the longitudinal direction, a first reflection mirror M12 is arranged at the lower left apex, a second reflection mirror M22 is arranged at the upper right apex, and a third reflection mirror M32 is arranged at the upper left apex. Further, the first, second and third reflection mirrors M12 to M32 are secured in such a direction as to chamfer the respective apexes, that is, in such a manner as to be inclined in such a direction that the interior angle is 135° relative to each side, in order to reflect the entering light at a right angle. Meanwhile, the beam splitter BS2 is secured at an angle of 45° so that the interior angles of the rectangular form is divided into two equal angles, in order to split the entering light into transmission light which goes straight and reflection light which is reflected at a right angle, in the same manner as in FIG. 3. Pumping light enters through the pumping light coupling part 22 arranged on the lower side of the beam splitter BS2 (in the upward direction in FIG. 4). The beam splitter BS2 is secured in an inclined position which is different from that in FIG. 3 by 90°, and splits pumping light into transmission light which goes straight, which is a second pumping component R2, and reflection light reflected in the horizontal direction (toward the left in FIG. 4), which is a first pumping component R1. The first reflection mirror M12 is secured on the left side of the beam splitter BS2 in such a manner as to be inclined by 45° relative to the entering light, in the same manner as in FIG. 3, and reflects the first pumping component R1 in the upward direction. The reflection light is condensed through a first condenser lens 61 and enters a rear side mirror RM. As described above, a first split path B1 is formed in L shape.

Meanwhile, the second pumping component R2, which transmits through the beam splitter BS2 in the upward direction, is reflected from the second reflection mirror M22, which is secured in such a position as to be inclined by 45° relative to the entering light in the horizontal direction (toward the left in FIG. 4). Reflection light goes parallel to light reflected from the beam splitter BS2 and is reflected from the third reflection mirror M32, which is secured in such a position as to be inclined by 45° relative to the entering light in the downward direction. The reflection light of the second pumping component R2 is condensed through a second condenser lens 62 and enters an emission side mirror FM. As described above, the second split path B2 is formed in reverse L shape. Subsequently, reflection light of the first pumping component R1 reflected from the first reflection mirror M12 and reflection light of the second pumping component R2 reflected from the third reflection mirror M32 face each other along the same axis, in the same manner as in FIG. 3, so that the first pumping component R1 and the second pumping component R2 enter the rear side mirror RM and the emission side mirror FM, respectively, and the laser is oscillated.

Embodiment 3

Figure 5:
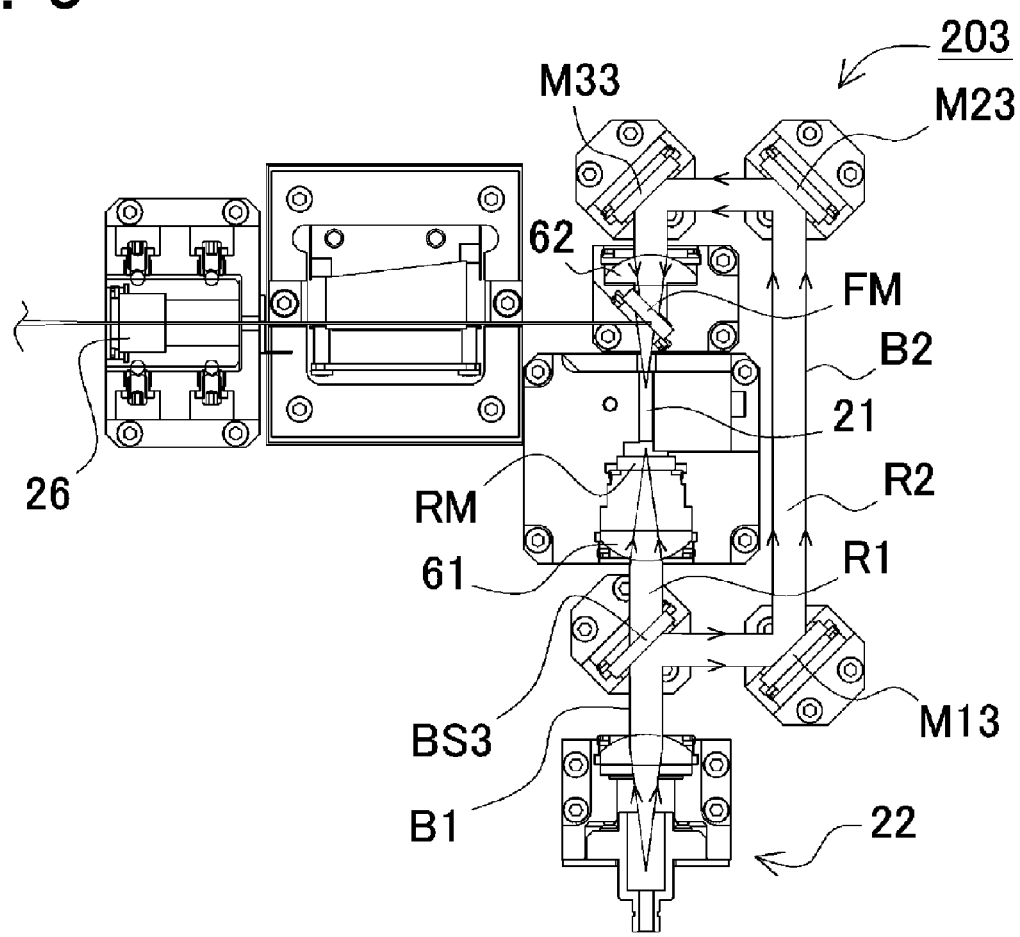
FIG. 5 is a plan view showing an example of the arrangement of optical members in the laser resonant portion according to Embodiment 3.

FIG. 5 shows an example of the arrangement of the optical members of the solid laser oscillator according to Embodiment 3 as still another example of the layout. In a laser resonant portion 203 shown in this figure also, a solid laser medium 21, a rear side mirror RW and an emission side mirror FM are arranged along one long side of the split path formed in rectangular form (left side in FIG. 5). Here, a beam splitter BS3 is arranged at the apex along the same long side, and on the side close to the rear side mirror RM. Further, an pumping light coupling part 22 is arranged in close proximity to the beam splitter BS3 in such a manner that pumping light enters in a direction which coincides with the long side. Furthermore, in the arrangement of the optical members, the beam splitter BS3 is arranged at the lower left apex of the rectangular form, which is long in the longitudinal direction, a first reflection mirror M13 is arranged at the lower right apex, a second reflection mirror M23 is arranged at the upper right apex, and a third reflection mirror M33 is arranged at the upper right apex. Furthermore, the first, second and third reflection mirrors M13 to M33 are secured in such a position as to be inclined in such a direction as to chamfer each apex, that is, in such a direction that the interior angle is 135° relative to each side, in order to reflect the entering light at a right angle. Meanwhile, the beam splitter BS3 is secured at an angle of 45° so as to divide the interior angle of the rectangular form into two equal angles, in order to split the entering light into transmission light, which goes straight, and reflection light, which is reflected at a right angle, in the same manner as in FIG. 3, and the like. Pumping light enters through the pumping light coupling part 22, which is arranged on the lower side of the beam splitter BS3 (in the upward direction in FIG. 5), in the same manner as in FIG. 4, so that pumping light is split into transmission light which goes straight, which is a first pumping component R1, and reflection light reflected in the horizontal direction (toward the right in FIG. 5), which is a second pumping component R2. The first pumping component R1, which is transmission light, is condensed through a first condenser lens 61 and enters a rear side mirror RM. In this example, a first split path B1 is formed in linear form.

Meanwhile, the second pumping component R2 reflected from the beam splitter BS3 in the horizontal direction (toward the right in FIG. 5) is reflected from the first reflection mirror M13, which is secured in such a position as to be inclined by 45° relative to the entering light in a perpendicular direction (in the upward direction in FIG. 5). Reflection light goes parallel with light which transmits through the beam splitter BS3, and is reflected from the second reflection mirror M23, which is secured in such a position as to be inclined by 45° relative to the entering light in the horizontal direction (to the right in FIG. 5). Furthermore, the light is reflected from the third reflection mirror M33, which is secured in such a position as to be inclined by 45° relative to the entering light in the perpendicular direction (in the downward direction in FIG. 5). This reflection light of the second pumping component R2 is condensed through a second condenser lens 62 and enters the emission side mirror FM. As described above, a second split path B2 is formed in C shape. In this manner, the first pumping component R1, which transmits through the beam splitter BS3, and reflection light of the second pumping component R2, which is reflected from the third reflection mirror M33, face each other along the same axis, so that the first pumping component R1 and the second pumping component R2 enter the rear side mirror RM and the emission side mirror FM, respectively, and the laser is oscillated.

Embodiment 4

Figure 6:
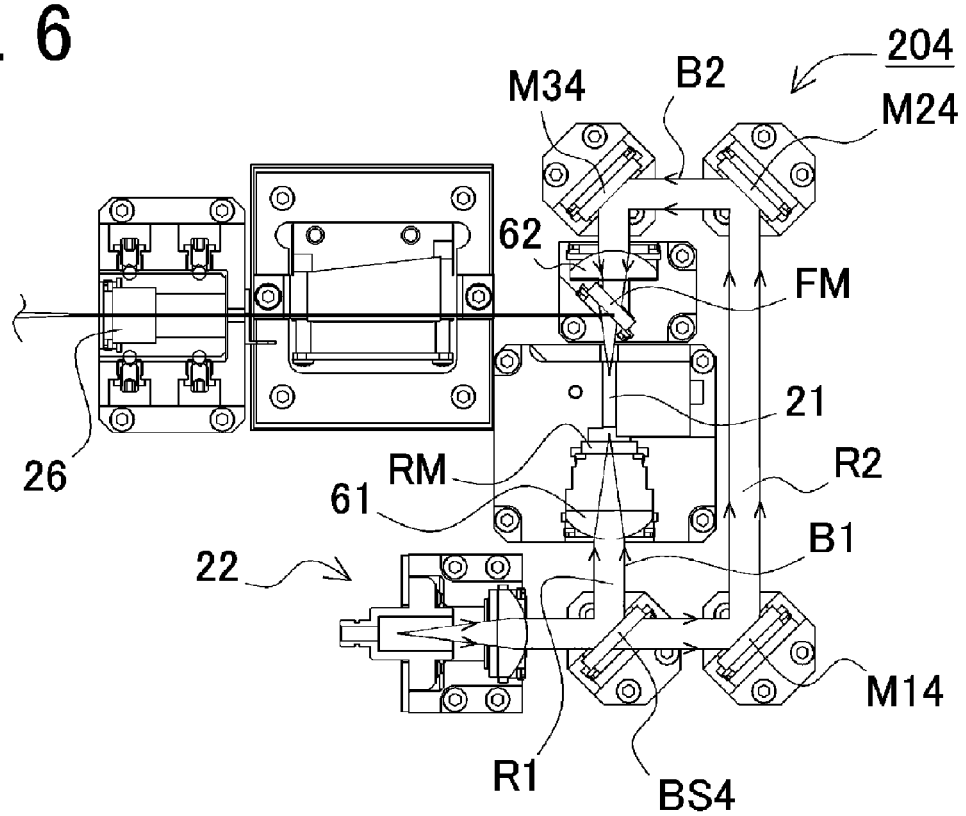
FIG. 6 is a plan view showing an example of the arrangement of optical members in the laser resonant portion according to Embodiment 4.

FIG. 6 shows an example of the arrangement of the optical members of the solid laser oscillator according to Embodiment 4 as yet another example of the layout. In a laser resonant portion 204 shown in this figure also, a solid laser medium 21, a rear side mirror RM and an emission side mirror FM are arranged on one long side of the split path formed in rectangular form (left side in FIG. 6). Here, a beam splitter BS4 is arranged at the apex along the same long side and on the side close to the rear side mirror RM. Further, an pumping light coupling part 22 is arranged in close proximity to the beam splitter BS4 so that pumping light enters in a direction perpendicular to the long side (from left side of apex in FIG. 6). Furthermore, in the arrangement of the optical members, in the same manner as in FIG. 5, the beam splitter BS4 is arranged at the lower left apex of the rectangular form, which is long in the longitudinal direction, a first reflection mirror M14 is arranged at the lower right apex, a second reflection mirror M24 is arranged at the upper right apex, and a third reflection mirror M34 is arranged at the upper left apex. Furthermore, the first, second and third reflection mirrors M14 to M34 are secured in such a position as to be inclined in such a direction as to chamfer each apex, that is, in such a direction that the interior angle is 135° relative to each side, so that the entering light is reflected at a right angle. Meanwhile, the beam splitter BS4 is secured at an angle of 45° so as to divide the interior angle of the rectangular form into two equal angles, in order to split the entering light into transmission light, which goes straight, and reflection light, which is reflected at a right angle, in the same manner as in FIG. 3. In the same manner as in FIG. 5, pumping light enters through the pumping light coupling part 22, which is arranged on the left side of the beam splitter BS4, toward the right in FIG. 6, and pumping light is split into transmission light which goes straight, which is a second pumping component R2, and reflection light reflected in the perpendicular direction (in the upward direction in FIG. 6), which is the second pumping component R2. A first pumping component R1, which is reflection light, is condensed through a first condenser lens 61 and enters the rear side mirror RM. In this example also, the first split path B1 is formed in linear form.

Meanwhile, the second pumping component R2, which transmits through the beam splitter BS4 and goes straight toward the right in FIG. 6, is reflected from the first reflection mirror M14, which is secured in such a position as to be inclined by 45° relative to the entering light, in the same manner as in FIG. 5, in the perpendicular direction (in the upward direction in FIG. 6). The reflection light goes parallel with the light reflected from the beam splitter BS4, and is reflected from the second reflection mirror M24, which is secured in such a position as to be inclined by 45° relative to the entering light in the horizontal direction (toward the left in FIG. 6). Furthermore, the light is reflected from the third reflection mirror M34, which is secured in such a position as to be inclined by 45° relative to the entering light in a perpendicular direction (in the downward direction in FIG. 6). The reflection light of the second pumping component R2 is condensed through a second condenser lens 62 and enters into the emission side mirror FM. As described above, a second split path B2 is formed in C shape. In this manner, the first pumping component R1 reflected from the beam splitter BS4 and reflection light of the second pumping component R2 reflected from the third reflection mirror M34 face each other along the same axis, so that the first pumping component R1 and the second pumping component R2 enter the rear side mirror RM and the emission side mirror FM, respectively, and the laser is oscillated.

Embodiment 5

Figure 7:
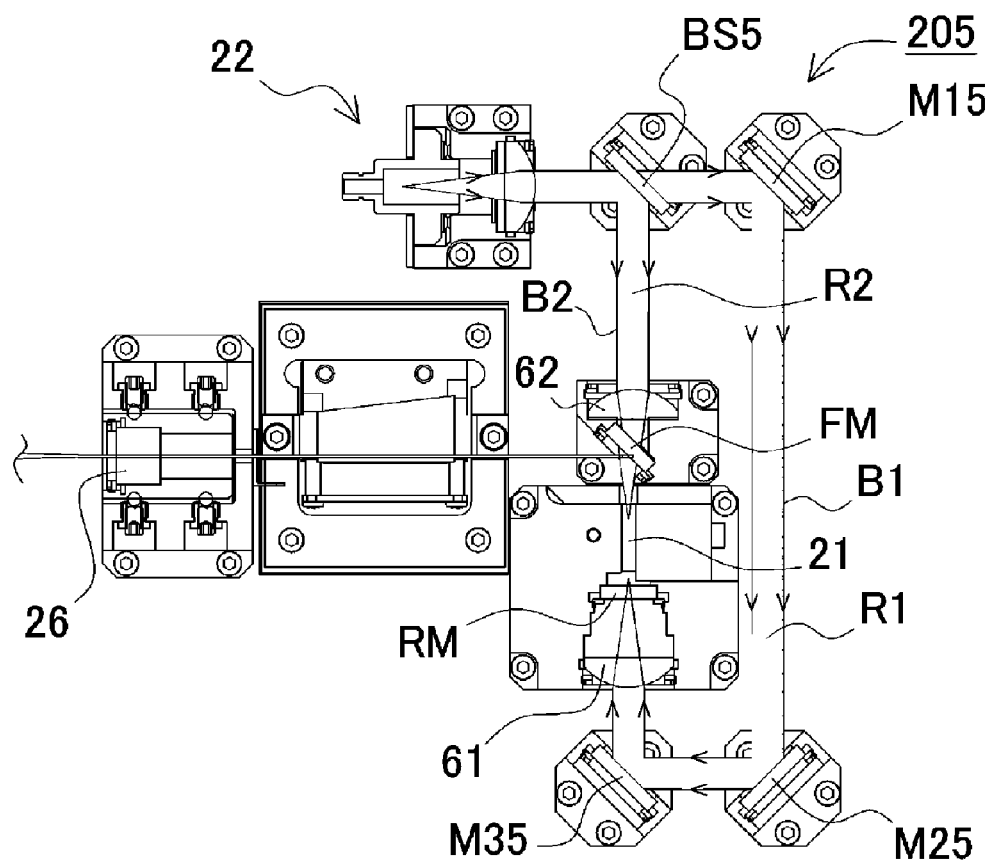
FIG. 7 is a plan view showing an example of the arrangement of optical members in the laser resonant portion according to Embodiment 5.

Furthermore, FIG. 7 shows an example of the arrangement of the optical members of the solid laser oscillator according to Embodiment 5 as another example of the layout. In a laser resonant portion 205 shown in this figure also, a solid laser medium 21, a rear side mirror RM and an emission side mirror FM are arranged along one long side of the split path formed in rectangular form (left side in FIG. 7). Here, a beam splitter BS5 is placed at the apex along the same long side, on the side close to the emission side mirror FM. An pumping light coupling part 22 which is arranged in close proximity to the beam splitter BS5 is arranged in such a manner that pumping light enters in the direction perpendicular to the long side (left side of the apex in FIG. 7). In the arrangement of the optical members, the beam splitter BS5 is arranged at the upper left apex of the rectangular form, which is long in the longitudinal direction, a first reflection mirror M15 is arranged at the upper right apex, a second reflection mirror M25 is arranged at the lower right apex, and a third reflection mirror M35 is arranged at the lower left apex. Furthermore, the first, second and third reflection mirrors M15 to M35 are secured in such a position as to be inclined in such a direction as to chamfer each apex, that is, in such a direction that the interior angle is 135° relative to each side. Meanwhile, the beam splitter BS5 is secured at an angle of 45° so as to divide the interior angle of the rectangular form into two equal angles, in order to split the entering light into transmission light, which goes straight, and reflection light, which is reflected at a right angle, in the same manner as in FIG. 3. Here, pumping light enters through an pumping light coupling part 22, which is arranged on the left side of the beam splitter BS5 toward the right in FIG. 7, and pumping light is split into transmission light which goes straight, which is a first pumping light component R1, and reflection light reflected in a perpendicular direction (in the downward direction in FIG. 7), which is a second pumping component R2. The second pumping component R2, which is reflection light, is condensed through a second condenser lens 62 and enters the emission side mirror FM. In this example, a second split path B2 is formed in linear form.

Meanwhile, the first pumping component R1, which transmits through the beam splitter BS5 and goes straight toward the right in FIG. 7, is reflected from the first reflection mirror M15, which is secured in such a position as to be inclined by 45° relative to the entering light in the perpendicular direction (in the downward direction in FIG. 7). The reflection light goes parallel with the light reflected from the beam splitter BS5 and is reflected from the second reflection mirror M25, which is secured in such a position as to be inclined by 45° relative to the entering light in the lateral direction (toward the left in FIG. 7). Furthermore, the light is reflected from the third reflection mirror M35, which is secured in such a position as to be inclined by 45° relative to the entering light in the perpendicular direction (in the upward direction in FIG. 7). This light reflected from a first pumping component R1 is condensed through a first condenser lens 61 and enters the rear side mirror RM. As described above, the first split path B1 is formed in C shape. In this manner, the second pumping component R2 reflected from the beam splitter BS5 and reflection light of the first pumping component R1 reflected from the third reflection mirror M35 face each other along the same axis, so that the first pumping component R1 and the second pumping component R2 enter the rear side mirror RM and the emission side mirror FM, respectively and the laser is oscillated.

Embodiment 6

Figure 8:
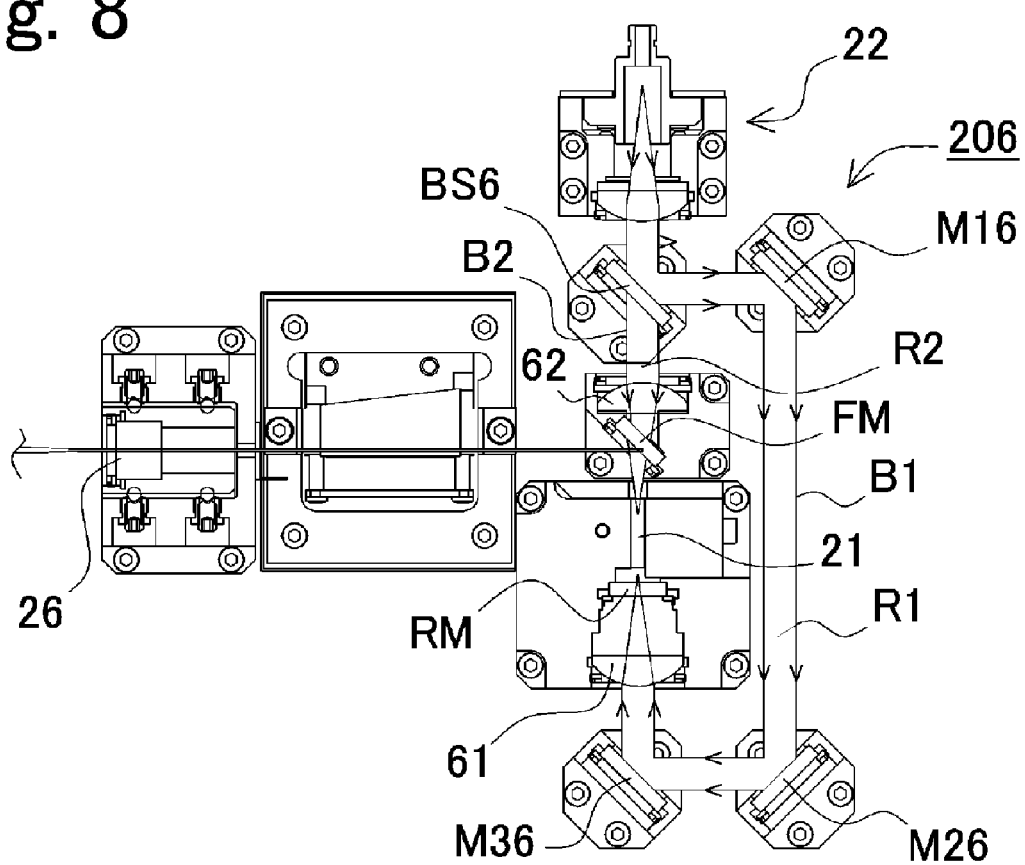
FIG. 8 is a plan view showing an example of the arrangement of optical members in the laser resonant portion according to Embodiment 6.

Moreover, FIG. 8 shows an example of the arrangement of the optical members of the solid laser oscillator according to Embodiment 6 as another example of the layout. In a laser resonant portion 206 shown in this figure also, a solid laser medium 21, a rear side mirror RM and an emission side mirror FM are arranged along one long side of the split path formed in rectangular form (to the left in FIG. 8). Here, the beam splitter BS6 is arranged at the apex along the same long side and on the side close to the emission side mirror FM. Further, an pumping light coupling part 22 is arranged in close proximity to the beam splitter BS6 so that pumping light enters in a direction which coincides with the long side (upper side of the apex in FIG. 8). Furthermore, in the arrangement of the optical members, the beam splitter BS6 is arranged at the upper left apex of the rectangular form, which is long in the longitudinal direction, a first reflection mirror M16 is arranged at the upper right apex, a second reflection mirror M26 is arranged at the lower right apex, and a third reflection mirror M36 is arranged at the lower left apex, in the same manner as in FIG. 7. Furthermore, the first, second and third reflection mirrors M16 to M36 are secured in such a position as to be inclined in such a direction as to chamfer each apex, that is, in such a direction that the interior angle is 135° relative to each side, in order to reflect the entering light at a right angle. Meanwhile, the beam splitter BS6 is secured at an angle of 45° so that the interior angle of the rectangular form is divided into two equal angles, in order to split the entering light into transmission light, which goes straight, and reflection light, which is reflected at a right angle, in the same manner as in FIG. 3. Here, pumping light enters through an pumping light coupling part 22, which is arranged on the upper side of the beam splitter BS6 in the downward direction in FIG. 8, and pumping light is divided into transmission light which goes straight, which is a second pumping component R2, and reflection light reflected in the horizontal direction (to the right in FIG. 8), which is a first pumping component R1. The second pumping component R2, which is transmission light, is condensed through a second condenser lens 62 and enters an emission side mirror FM. In this example also, a second split path B2 is formed in linear form.

Meanwhile, the first pumping component R1, which is reflected from the beam splitter BS6 and goes straight toward the right in FIG. 8, is reflected from the first reflection mirror M16, which is secured in such a position as to be inclined by 45° relative to the entering light, in the same manner as in FIG. 7, in the perpendicular direction (in the downward direction in FIG. 8). The reflection light goes parallel with light which transmits through the beam splitter BS6 and is reflected from the second reflection mirror M26, which is secured in such a position as to be inclined by 45° relative to the entering light in the horizontal direction (toward the left in FIG. 8). Furthermore, the light is reflected from the third reflection mirror M36, which is secured in such a position as to be inclined by 45° relative to the entering light in a perpendicular direction (in the upward direction in FIG. 8). This reflection light of the first pumping component R1 is condensed through a first condenser lens 61 and enters through a rear side mirror RM. As described above, a first split path B1 is formed in reverse C shape. In this manner, the second pumping component R2, which transmits through the beam splitter BS6, and reflection light of the first pumping component R1, which is reflected from the third reflection mirror M36, face each other along the same axis, so that the first pumping component R1 and the second pumping component R2 enter the rear side mirror RM and the emission side mirror FM, respectively, and the laser is oscillated.

Embodiment 7

Figure 9:
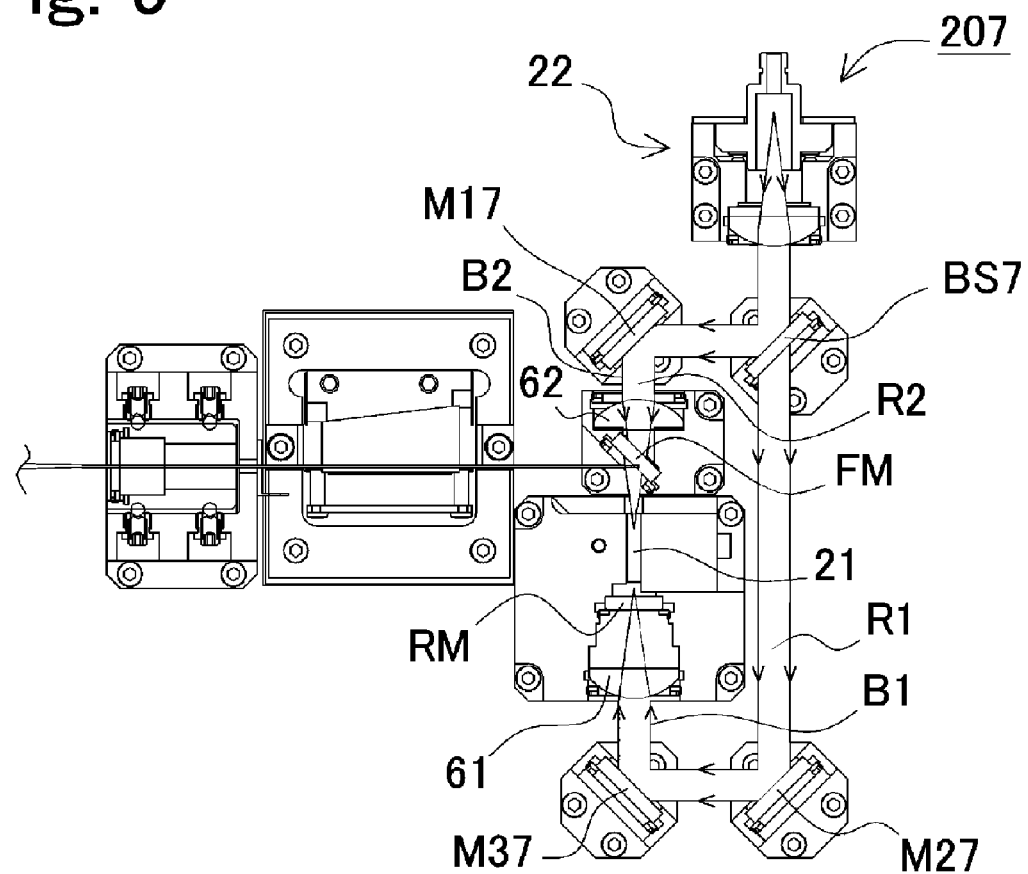
FIG. 9 is a plan view showing an example of the arrangement of optical members in the laser resonant portion according to Embodiment 7.

Furthermore, FIG. 9 shows an example of the arrangement of optical members of the solid laser oscillator according to Embodiment 7 as another example of the layout. In a laser resonant portion 207 shown in this figure also, a solid laser medium 21, a rear side mirror RM and an emission side mirror FM are arranged along one long side of the split path formed in rectangular form (left side in FIG. 9). Here, a beam splitter BS7 is placed at the apex along the other long side (right side in FIG. 9) on the side close to the emission side mirror FM. Further, an pumping light coupling part 22 is arranged in close proximity to the beam splitter BS7 so that pumping light enters in a direction which coincides with this long side (upper side of the apex in FIG. 9). Furthermore, in the arrangement of optical members, the beam splitter BS7 is arranged at the upper right apex of the rectangular form, which is long in the longitudinal direction, a first reflection mirror M17 is arranged at the lower right apex, a second reflection mirror M27 is arranged at the lower left apex, and a third reflection mirror M37 is arranged at the upper left apex Furthermore, the first, second and third reflection mirrors M17 to M37 are secured in such a position as to be inclined in such a direction as to chamfer each apex, that is, in such a direction that the interior angle is 135° relative to each side, in order to reflect the entering light at a right angle. Meanwhile, the beam splitter BS7 is secured at an angle of 45° so that the interior angle of the rectangular form is divided into two equal angles, in order to split the entering light into transmission light, which goes straight, and reflection light, which is reflected at a right angle, in the same manner as in FIG. 3, and the like. Here, pumping light enters through an pumping light coupling part 22, which is arranged on the upper side of the beam splitter BS7 in the downward direction in FIG. 9, and the pumping light is split into transmission light which goes straight, which is a first pumping component R1, and reflection light reflected in the horizontal direction (toward the left in FIG. 9), which is a second pumping component R2. The third reflection mirror M37 is secured on the left side of the beam splitter BS7 in such a manner as to be inclined by 45° relative to the entering light, and reflects a second pumping component R2 in the downward direction. This reflection light is condensed through a second condenser lens 62 and enters the emission side mirror FM. As described above, a second split path B2 is formed in reverse L shape.

Meanwhile, the first pumping component R1, which transmits through the beam splitter BS7 and goes straight in the downward direction in FIG. 9 is reflected from the first reflection mirror M17, which is secured in such a position as to be inclined by 45° relative to the entering light in the horizontal direction (toward the left in FIG. 9). The reflection light goes parallel with light reflected from the beam splitter BS7 and is reflected from the second reflection mirror M27, which is secured in such a position as to be inclined by 45° relative to the entering light in the perpendicular direction (in the upward direction in FIG. 9). This reflection light of the first pumping component R1 is condensed through a first condenser lens 61 and enters the rear side mirror RM. As described above, the first split path B1 is formed in U shape. In this manner, the second pumping component R2 reflected from the third reflection mirror M37 and reflection light of the first pumping component R1 reflected from the second reflection mirror M27 face each other along the same axis, so that the first pumping component R1 and the second pumping component R2 enter the rear side mirror RM and the emission side mirror FM, respectively, and the laser is oscillated.

Embodiment 8

Figure 10:
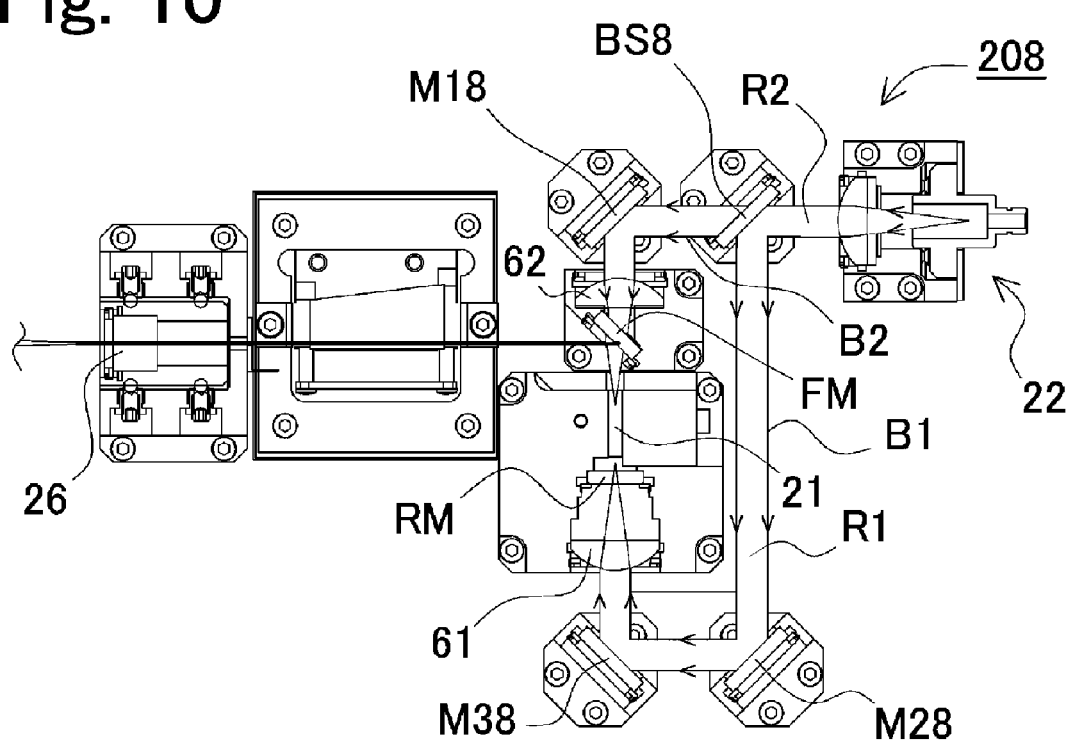
FIG. 10 is a plan view showing an example of the arrangement of optical members in the laser resonant portion according to Embodiment 8.

Furthermore, FIG. 10 shows an example of the arrangement of optical members of the solid laser oscillator according to Embodiment 8 as an example of another layout. In a laser resonant portion 208 shown in this figure also, a solid laser medium 21, a rear side mirror RM and an emission side mirror FM are arranged along one long side of the split path, which is formed in rectangular form (on the left side in FIG. 10). Here, a beam splitter BS8 is arranged at the apex along the other long side (on the right side in FIG. 10), and on the side close to the emission side mirror FM. Further, an pumping light coupling part 22 is arranged in close proximity to the beam splitter BS8 so that pumping light enters in the direction perpendicular to the long side (on the right side of the apex in FIG. 10). Furthermore, in the arrangement of optical members, the beam splitter BS8 is arranged at the upper right apex of the rectangular form, which is long in the longitudinal direction, a first reflection mirror M18 is arranged at the lower right apex, a second reflection mirror M28 is arranged at the lower left apex, and a third reflection mirror M38 is arranged at the upper left apex, in the same manner as in FIG. 9. Furthermore, the first, second and third reflection mirrors M18 to M38 are secured in such a position as to be inclined in such a direction as to chamfer each apex, that is, in such a direction that the interior angle is 135° relative to each side, in order to reflect the entering light at a right angle. Meanwhile, the beam splitter BS8 is secured at an angle of 45° so that the interior angle of the rectangular form is divided into two equal angles, in order to split the entering light into transmission light, which goes straight, and reflection light, which is reflected at a right angle, in the same manner as in FIG. 3. Here, pumping light enters through the pumping light coupling part 22, which is arranged on the right side of the beam splitter BS8 toward the left in FIG. 10, and the pumping light is split into transmission light which goes straight, which is a second pumping component R2, and reflection light, which is reflected in the perpendicular direction (in the downward direction in FIG. 10), which is a first pumping component R1. The third reflection mirror M38 is secured on the left side of the beam splitter BS8 in such a manner as to be inclined by 45° relative to the entering light, and reflects the second pumping component R2 that transmits through the medium in the downward direction. This reflection light is condensed through a second condenser lens 62 and enters the emission side mirror FM. As described above, the second split path B2 is formed in reverse L shape.

Meanwhile, the first pumping component R1, which is reflected from the beam splitter BS8 and goes downward in FIG. 10, is reflected from the first reflection mirror M18, which is secured in such a position as to be inclined by 45° relative to the entering light in the horizontal direction (toward the left in FIG. 10). The reflection light goes parallel with light that transmits through the beam splitter BS8 and is reflected from the second reflection mirror M28, which is secured in such a position as to be inclined by 45° relative to the entering light in the perpendicular direction (in the upward direction in FIG. 10). This reflection light of a first pumping component R1 is condensed through a first condenser lens 61 and enters into a rear side mirror RM. As described above, the first split path B1 is formed in U shape. In this manner, the second pumping component R2, which is reflected from the third reflection mirror M38, and the reflection light of the first pumping component R1, which is reflected from the second reflection mirror M28, face each other along the same axis, so that the first pumping component R1 and the second pumping component R2 enter the rear side mirror RM and the emission side mirror FM, respectively, and the laser is oscillated.

As described above, the split path of pumping light is formed in rectangular form, and thus, the arrangement of the solid laser medium 21 and an pumping light source 11 for allowing pumping light to enter the solid laser medium can be simplified. Modifications of this arrangement pattern are collectively shown in the schematic diagram of FIG. 11. In this figure, numbers within parentheses correspond to the numbers used in the embodiments. Thus, the split path B, which is a combination of the first split path and the second split path, is formed in rectangular form in such a manner that a solid laser medium 21 is arranged along the axis of one side of the rectangular form (here, the long side), and furthermore, pumping light enters one of the apexes of the rectangular form along one of the sides. Therefore, the location of the pumping light source 11 in the arrangement can be easily changed while maintaining the split path B in rectangular form. In this manner, the design in terms of the layout can be easily changed, and two-directional pumping can be achieved in an extremely simple and compact configuration.

Figure 11:
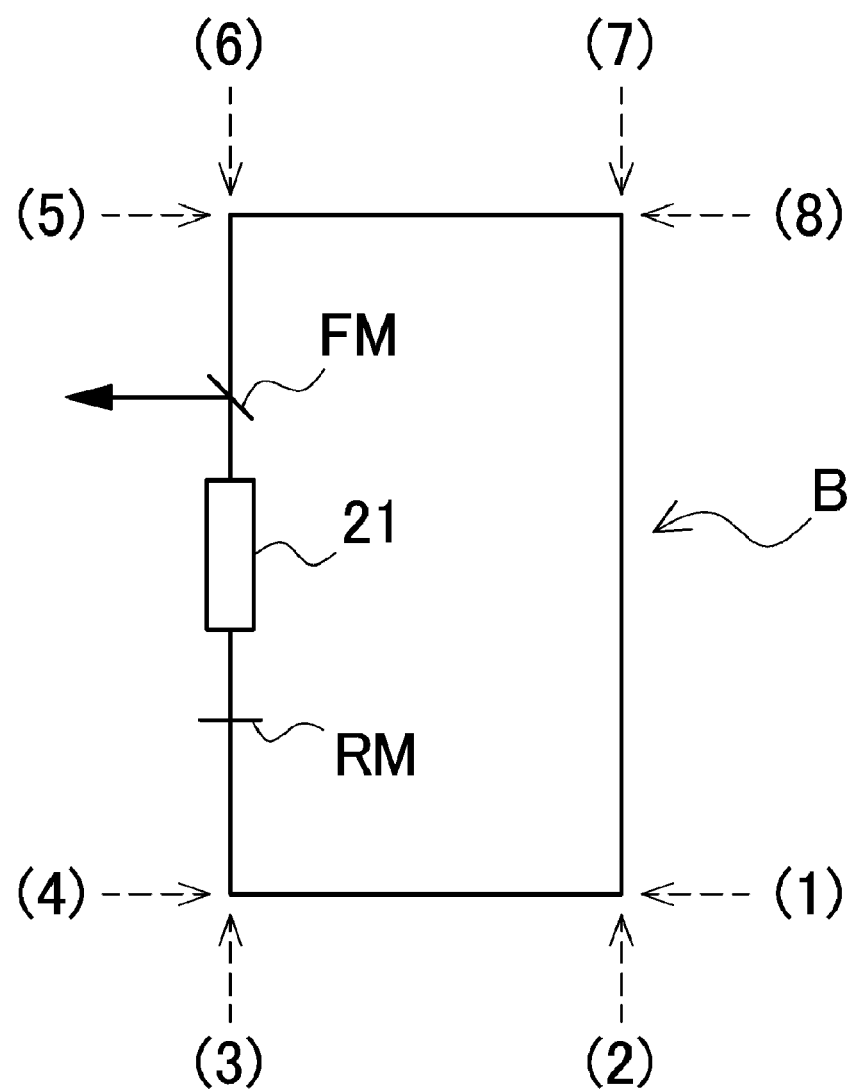
FIG. 11 is a schematic diagram showing modifications of the arrangement pattern for optical members.
Figure 12:
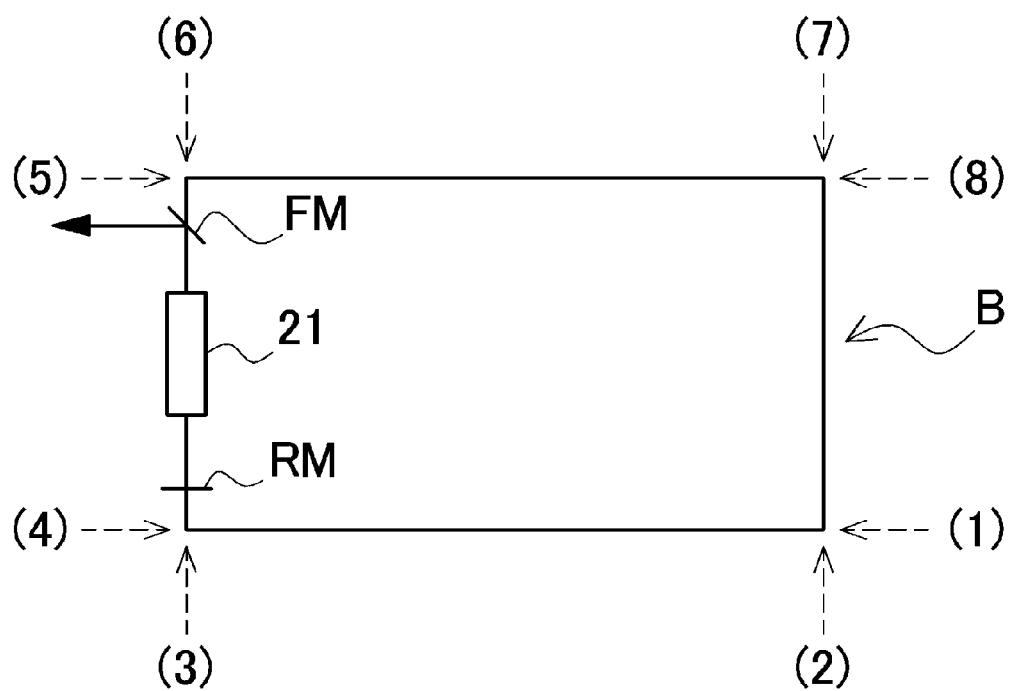
FIG. 12 is a schematic diagram showing other modifications of the arrangement pattern for optical members.
Figure 13:
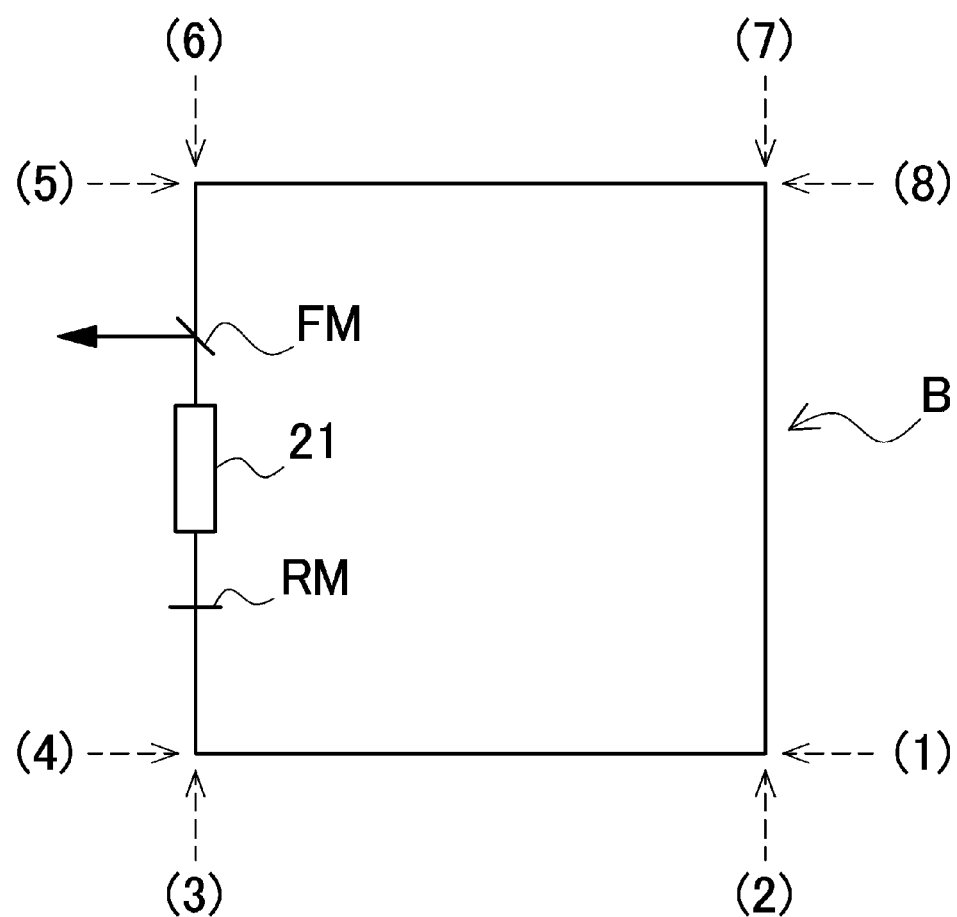
FIG. 13 is a schematic diagram showing still other modifications of the arrangement pattern for optical members.

It is desirable for the solid laser medium 21 to be placed along one of the long sides of the rectangular form, as shown in FIG. 11. The side along which the solid laser medium 21 is arranged needs a certain length along which to arrange the rear side mirror RM, the emission side mirror FM and the like, in addition to a solid laser medium 32, but it is not necessary to arrange these on the short sides, and therefore, this portion can be made short, so that the rectangular form of the split path can be made compact and miniaturization of the laser resonator can be achieved. Here, some layouts for the laser resonator allow for arrangement on the short side, as shown in FIG. 12. Further, the split path is not limited to having a rectangular form, and may be formed in square form, as shown in FIG. 13. As a result, the solid laser medium 21 can be arranged along any sides, and therefore, the freedom in terms of the layout can further be increased. That is, appropriate arrangement can be provided for the respective optical members in accordance with the requirements in terms of the physical space and the layout, and thus, an efficient arrangement can be adopted.

Here, as described below, keeping in mind that a large amount of split component of pumping light can enter the rear surface side of the solid laser medium 21, it can be said that Embodiment 3, Embodiment 4 and Embodiments 1 and 2, where the number of times of reaction between reflection mirrors is small with little loss, are preferable. In particular, the first split component, which enters the rear surface side, can be allowed to enter through the first end surface without being reflected in Embodiment 3, which is thus preferable from the point of view of reduction in loss. Here, the same effects can, of course, be gained in the other embodiments, by adjusting the ratio of split using the beam splitter. The system can be designed taking loss through the reflection mirrors into consideration by adjusting the beam splitter, and thus, free arrangement becomes possible, without any limitations in terms of the layout.

(Solid Laser Medium 21)

The solid laser medium 21 is a crystal which extends in one direction and has two end surfaces in the longitudinal direction. Here, the end surfaces are a first end surface which forms a surface through which pumping light enters, and a second end surface which is on the side opposite to the first end surface and forms a surface through which pumping light enters and pumping light is emitted. In the example of FIG. 3, the second end surface is referred to as emission surface, and the first end surface is referred to as rear surface (entrance surface). Further, the emission surface and the rear surface face the emission side mirror FM and the rear side mirror RM, respectively. Furthermore, pumping light is split into a first pumping component R1 and a second pumping component R2 by the beam splitter BS, and the first pumping component R1 and the second pumping component R2 enter the rear surface side and the emission surface side, respectively.

In the above described example, an Nd:YVO$_4$ crystal in rod form is used as the solid laser medium 21. Further, the wavelength of the semiconductor laser for exciting the solid laser medium 21 is set in the vicinity of 808 nm, which is the center wavelength of the absorption spectrum of the Nd:YVO$_4$. Here, YAG, LiSrF, LiCaF YLF, NAB, KNP, LNP, NYAB, NPP, GGG and the like doped with a rare earth element, for example, are examples of the solid laser media 21 which can be used in other examples. Furthermore, a wavelength converting element can be combined with the solid laser medium 21 so that the wavelength of the outputted laser beam can be converted to any wavelength. As the wavelength converting element, KTP(KTiPO$_4$), organic nonlinear optical materials and other inorganic nonlinear optical materials, such as KN(KNbO$_3$), KAP(KAsPO$_4$), BBO, LBO and bulk type polarization reversing elements (LiNbO$_3$ (Periodically Polled Lithium Niobate: PPLN), LiTaO$_3$) can be used. A semiconductor laser for an pumping light source for a laser due to up conversion using fluoride fibers doped with a rare earth element, such as Ho, Er, Tm, Sm or Nd, can also be used. As described above, appropriate laser generating sources of various types can be used in the present embodiments.

(Nd Concentration)

The solid laser medium 21 crystal in rod form may be either in columnar form or prism form for use. Here, an Nd:YVO$_4$ crystal in rectangular parallelepiped form having end surfaces of 3 mm (H)×3 mm (W) and a length (L) of 15 mm is used as the solid laser medium 21 crystal in prism form. Furthermore, it is preferable for the concentration of Nd to be 1% or less.

In general, the higher the concentration of Nd is, the better the laser beam is absorbed. However, in the case where the concentration is too high, pumping light does not penetrate in deep portions of the crystal, and only a small region near the surface tends to be excited. In particular, Nd:YVO$_4$ crystal has a low coefficient of thermal conduction, and therefore, there is a risk that a thermal lens may be generated and the crystal broken in the case where the LD unit has a high output. Further, YVO$_4$ crystal is a uniaxial crystal having such properties as to provide excellent cleavage, and therefore, is easy to break along the C axis. Thus, when a crystal having a high concentration is used, a strong thermal lens is easily generated, and the operation of the resonator becomes unstable, and thus the quality of the beam lowers, and at the same time, there is a risk that the crystal may crack when pumping light suddenly enters. In particular, YVO$_4$ crystal is a uniaxial crystal having such properties as to provide excellent cleavage, and therefore, is easy to break along the C axis. In order to prevent this, it is effective to lower the concentration of Nd.

Though the total amount of absorption in the crystal increases when the concentration of Nd is lowered, spatial matching between the laser beam mode and the absorbing portion lowers, and therefore, the state cannot allow pumping light to be effectively used, and thus, the efficiency of absorption lowers. Further, in the case where a crystal having a low concentration is used, a problem arises, such that the crystal becomes sensitive to the wavelength of LD, which is the pumping light source 11, and thus, a stable wavelength can be gained. Accordingly, it is necessary to adjust the concentration of Nd to an appropriate concentration taking the above into consideration.

Figure 14:
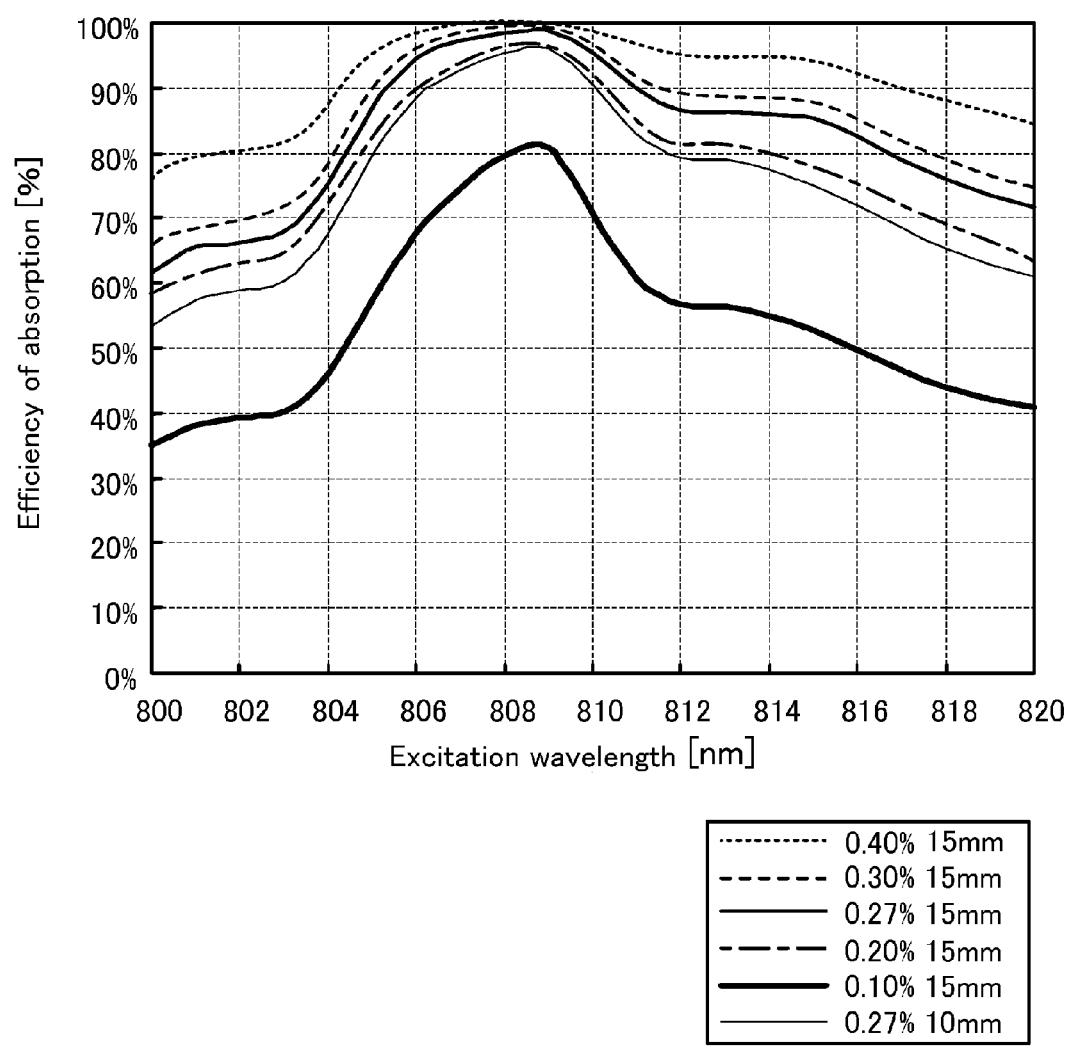
FIG. 14 is a graph showing the change in the efficiency of absorption for the wavelength of pumping light in $Nd:YVO_4$ crystal.

FIG. 14 is a graph showing the change in the efficiency of absorption for the wavelength of pumping light in Nd:YVO$_4$ crystal. Here, the ratio of light absorption for the total pumping light was compared for a number of crystals where the length of crystal and the concentration of Nd vary in Nd:YVO$_4$ crystal in parallelepiped form with end surfaces of 3 mm×3 mm. Concretely, measurement was carried out for the respective examples, where the concentration of Nd in the case where the length of the crystal is 15 mm was 0.10%, 0.20%, 0.27%, 0.30% and 0.40%, and the length of the crystal was changed to 10 mm in the case where the concentration of Nd was 0.27%. As shown in this figure, in general, the higher the concentration of Nd was, the higher the efficiency of absorption of the laser beam was. Further, the peak in the efficiency of absorption appeared in the vicinity of the wavelength of pumping light of 808 nm to 809 nm in all cases. Here, when the concentration of Nd was too high, the crystal became unstable and broke due to heat. Therefore, the concentration of Nd in the solid laser medium 21 is 1% or lower, preferably in a range from 0.1% to 0.4%. Here, there was inconsistency of approximately +/−0.03% to 0.05% in the concentration of Nd in the actual manufactured solid laser medium 21 crystal, and therefore, the concentration of Nd is set to approximately 0.22% to 0.32%, taking this into consideration. The efficiency of absorption can be maintained with good balance when the concentration of Nd is in the vicinity of 0.27%, which is most preferable. Furthermore, a tendency of the efficiency of absorption to lower when the length of the crystal (L) was short was observed, and therefore, the length of the crystal should be set to approximately 10 mm to 20 mm, preferably to 13 mm to 17 mm, and more preferably a crystal having a length in the vicinity of 15 mm is used.

Here, it suffices for the cross section of the solid laser medium 21 crystal to be greater than the diameter of the spot of pumping light, and the form of the crystal is not limited to a rectangular parallelepiped form, and columnar form and other appropriate forms can be used. In the case where the diameter of the spot of pumping light is φ1 mm, for example, a columnar form of the same size may be used. Here, in the case where the solid laser medium 21 crystal is narrow, a problem arises, such that the crystal easily breaks, and in addition, it is advantageous for the area of the end surfaces of the crystal and the form of the crystal to be constant, taking the ease of handling of the crystal at the time of assembly into consideration, and therefore, the end surfaces of the crystal is 3 mm×3 mm with the crystal in rectangular parallelepiped form.

Further, the thermal lens effects can be reduced by plating the sides of Nd:YVO$_4$ crystal with gold if necessary, so that the oscillation mode of the solid laser medium 21 is strengthened.

(Two-Directional Pumping System)

In the laser processing apparatus where the solid laser medium 21 is excited, 30% to 40% of the pumping power becomes heat and is lost due to the limits of quantum efficiency. Therefore, it is necessary to solve various problems with heat, such as thermal birefringence, thermal lens and thermal complex lens, which surface due to intense pumping, and destruction due to heat, in order to gain limitative performance. In particular, in the LD pumping solid laser processing apparatus, heat emitted as a result of pumping light absorbed by the solid laser medium 21 induces a lens effect in the crystal itself so as to generate a thermal lens. The thermal lens greatly hinders the stability of the laser resonator and becomes a great hindrance to the design of the resonator. A two-directional pumping system is adopted in the present embodiment in order to solve these problems, and one pumping light source 11 is used as the laser pumping portion 10 so that light is divided in such a manner that light enters through the respective end surfaces in the configuration, and thus, thermal lens can successfully be prevented from being generated. In addition to this, effects are gained, such that the stability in terms of the wavelength of pumping light and the increase properties are improved.

(Stability in Change in Wavelength)

Figure 15:
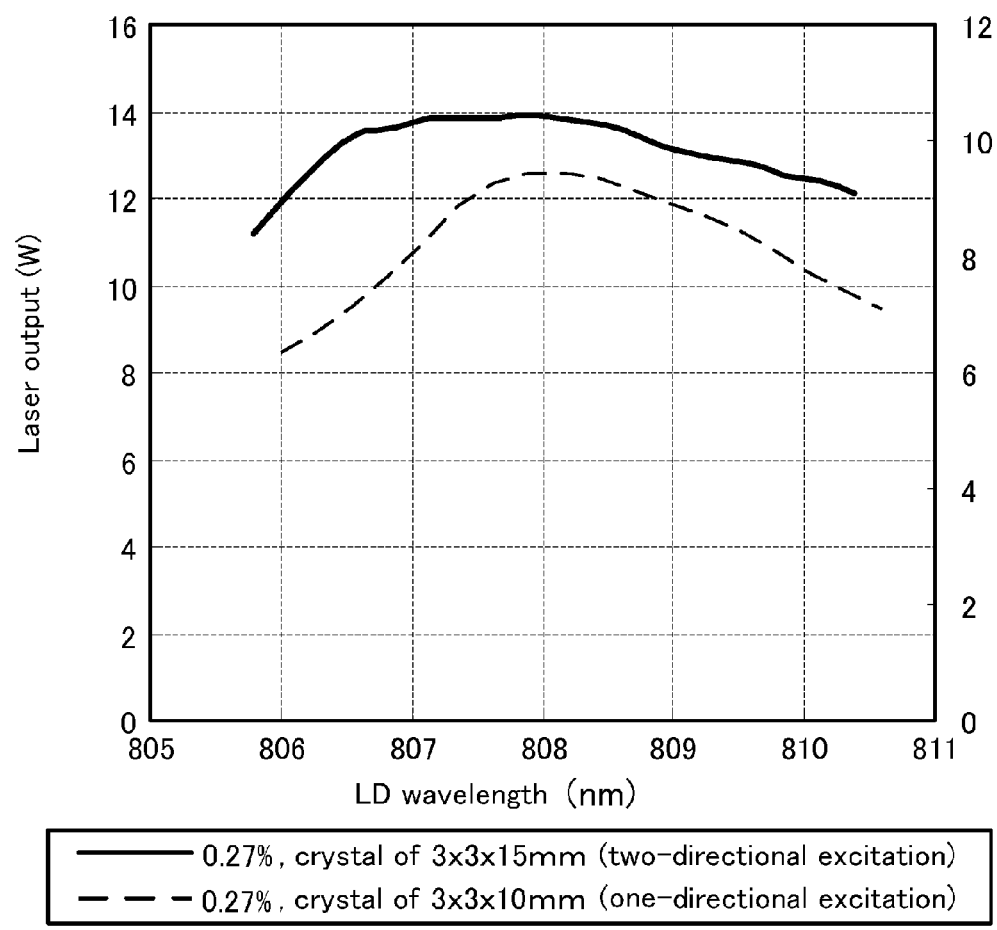
FIG. 15 is a graph for comparing the change in the laser output beam for the wavelength of the pumping source between one-directional pumping and two-directional pumping.

FIG. 15 is a graph showing a comparison of the change in the laser output beam for the wavelength of the LD unit between one-directional pumping and two-directional pumping. Here again, the Nd:YVO$_4$ crystal used was in rectangular parallelepiped form with end surfaces of 3 mm×3 mm, and the Nd concentration was 0.27% and the length of the crystal was 10 mm for one-directional pumping, while the Nd concentration was 0.27% and the length of the crystal was 15 mm for two-directional pumping. As shown in this figure, in one-directional pumping, when the wavelength of the pumping light shifts with 808 nm at the center, the laser output beam changes greatly. Therefore, the laser output changes, due to inconsistency in the peak wavelength of the LD unit, and it becomes difficult to gain a uniform laser processing apparatus. In particular, there is generally a difference in individual semiconductor light emitting elements, and inconsistency tends to be easily caused in the wavelength, and therefore, it is usually necessary to take error of approximately +/−2 nm to 3 nm into consideration. Furthermore, the wavelength of the pumping light is temperature-dependent, and therefore, temperature control becomes necessary in the LD element, where a Pelletier element or the like is used. For the above reasons, conventional laser processing apparatuses are designed for the lowest laser output, taking inconsistency in the wavelength into consideration, and thus, the inherent output is not used effectively.

In contrast, the laser output beam is stable in two-directional pumping, even when the pumping light shifts from 808 nm. As a result, it can be confirmed that the dependency of pumping light on the wavelength is limited through two-directional pumping, and thus, a laser output beam which is stable, irrespectively of change in the wavelength of the LD unit, can be gained.

(Increase Properties)

Figure 16:
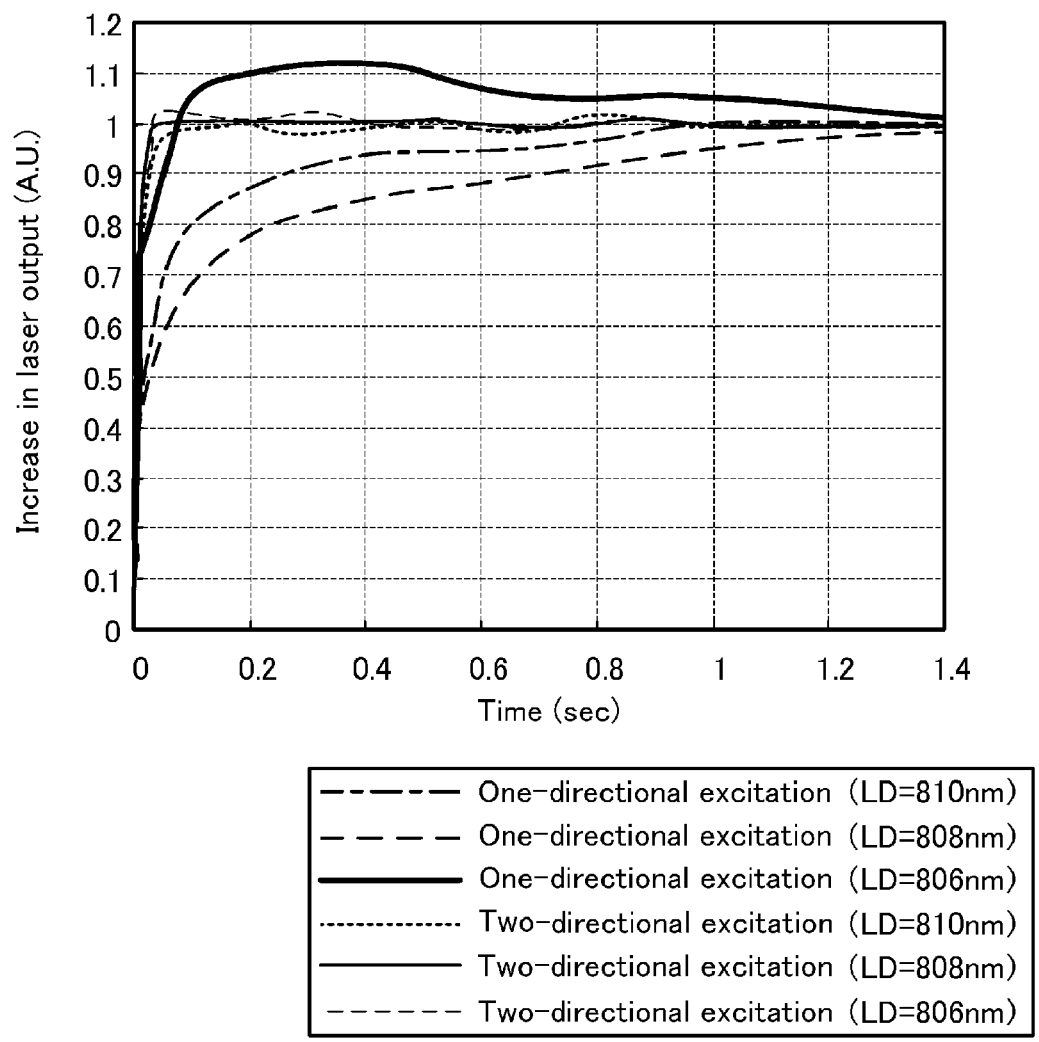
FIG. 16 is a graph for comparing the change over time of the laser output beam between one-directional pumping and two-directional pumping.

Furthermore, FIG. 16 is a graph showing a comparison of the change in the laser output beam over time between one-directional pumping and two-directional pumping. In this figure also, the change in the laser output beam over time was measured when Nd:YVO$_4$ crystal in rectangular parallelepiped form with end surfaces of 3 mm×3 mm where the Nd concentration is 0.27% was used, the wavelength of the LD unit was 806 nm, 808 nm and 810 nm, and the current in the LD unit was changed from 0 A to 35 A for one-directional pumping and two-directional pumping, respectively. Here, the length of the crystal was 10 mm (one-directional pumping) and 15 mm (two-directional pumping) for the sake of convenience in the test for comparison. As shown in this figure, a gentle increase is shown for one-directional pumping when the pumping wavelength is 808 nm and 810 nm, while overshoot was generated for 806 nm, where approximately 1.4 sec was required before the output became stable. Meanwhile, in two-directional pumping, steep increase and quick stabilization are shown for all wavelengths, and thus, it was confirmed that the increase properties of the laser were excellent. Further, overshoot at 806 nm was kept at an extremely low level.

Figure 17:
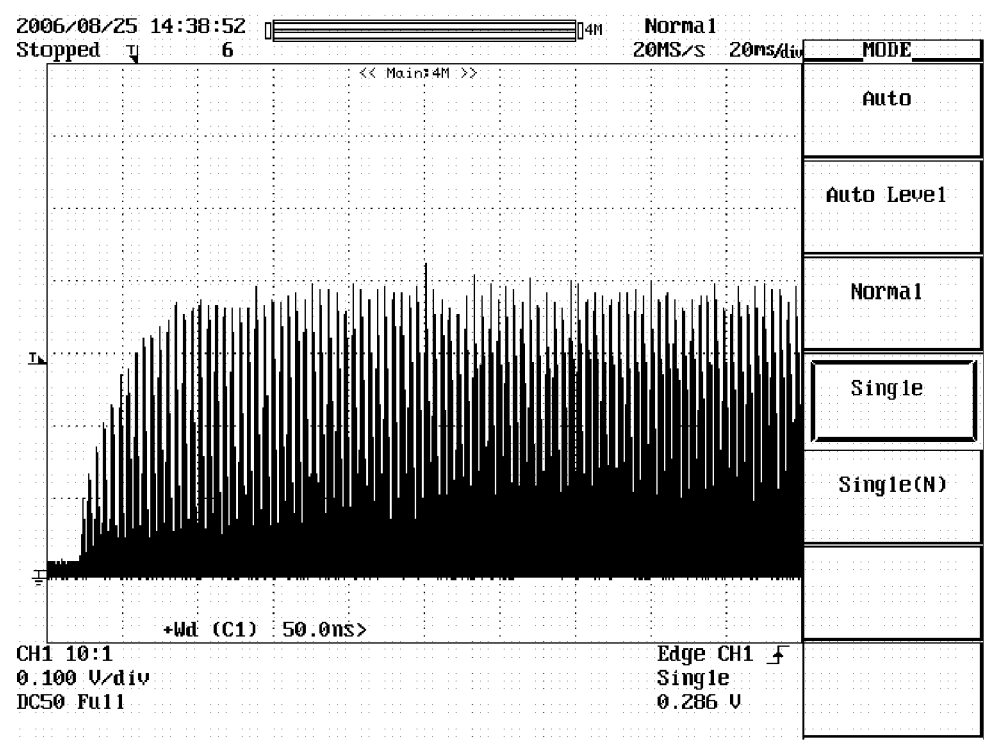
FIG. 17 is a graph showing the change over time of the laser output beam when the current from the pumping source is changed from 0 A to 45 A in two-directional pumping.

Furthermore, in order to confirm this, FIG. 17 shows a waveform of the change in the laser output beam over time as measured using a photodiode when the current in the LD unit is changed from 0 A to 45 A for two-directional pumping using Nd:YVO$_4$ crystal in rectangular parallelepiped form of 3 mm×3 mm×15 mm with an Nd concentration of 0.27%, which is the same as in FIG. 16. As is clear from this figure, the laser output beam reached a desired level in an extremely short period of time of approximately 20 ms, and thus, it can be confirmed that stable output was gained without causing overshoot. Thus, in accordance with the conditions of the present embodiment, the time required for the output to be stabilized when the laser output beam increases can be reduced to 1/10 or less of the prior art, as a result of increase in the speed. Further, as a result, a high-speed process where response and tracking are higher and the standby time is shortened while precision in processing is maintained can be implemented. In conventional laser processes, the laser output cannot be changed for each block in the laser processing pattern due to problems with the response of the laser output, and standby time for the output to be stabilized (for example 300 ms) is required when the laser output is changed. In contrast, the above described configuration makes the stability at the time of increase excellent, and also makes high-speed tracking possible, and thus, it becomes possible to change the laser output for each block in the laser processing pattern, which is difficult in the prior art.

As described above, the change in the laser output for the wavelength of the LD unit is restricted when the above described configuration is adopted, and furthermore, excellent advantages are gained, such that tracking of the outputted laser beam is quick in response to change in the laser output value. In accordance with the tests conducted by the present inventors, tracking of the actually outputted laser output beam was 300 msec when the setting of the laser output beam was changed from 0% to 100% in the prior art, while 20 msec was achieved in the present embodiment.

(Adjustment of Ratio of Split by Splitting Part 23)

Laser pumping light split in two directions from the single pumping light source 11 pumps the solid laser medium 21 through the respective end surfaces in the longitudinal direction. At this time, the intensity of pumping light entering through the rear side mirror RM side is higher than the intensity of the pumping light entering through the emission side mirror FM side. As a result of diligent research conducted on thermal lenses by the present inventors, it was found out that the inside of the resonator is affected less by the thermal lens generated on the rear side of the solid laser medium than by that generated on the emission side. In the configuration of FIG. 3, the reflectance of the beam splitter BS is used to adjust the ratio of the split between the rear side mirror RM and the emission side mirror FM. That is, the higher the reflectance is, the higher the intensity of light with which the emission surface is irradiated becomes, and the lower the reflectance is, that is, the higher the transmittance is, the higher intensity of pumping light with which the rear surface is irradiated becomes. Here, it is preferable for the ratio of the split in the beam splitter BS of light entering through the crystal end surface on the rear surface side to be 50% or more of the total power in the configuration.

Figure 18:
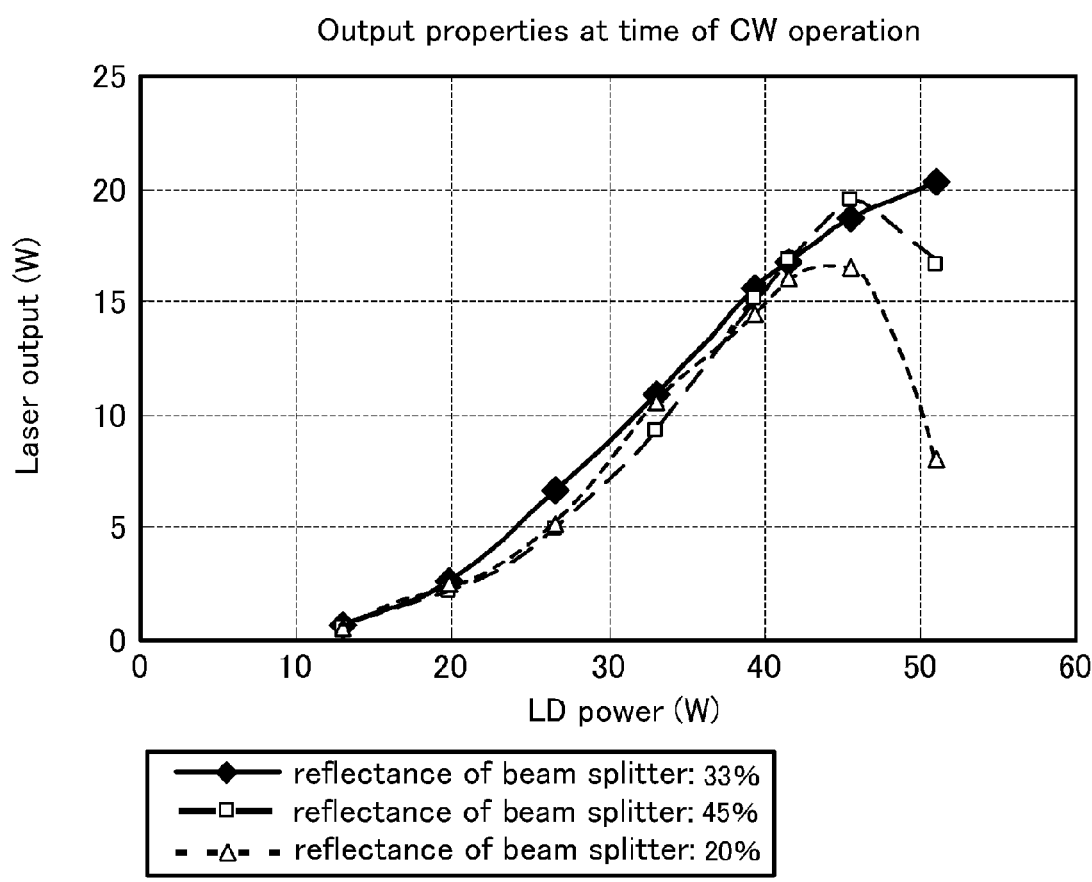
FIG. 18 is a graph where the laser output beam is measured for the power of the pumping light source in accordance with the reflectance of the beam splitter at the time of CW operation in the two-directional pumping system.
Figure 19:
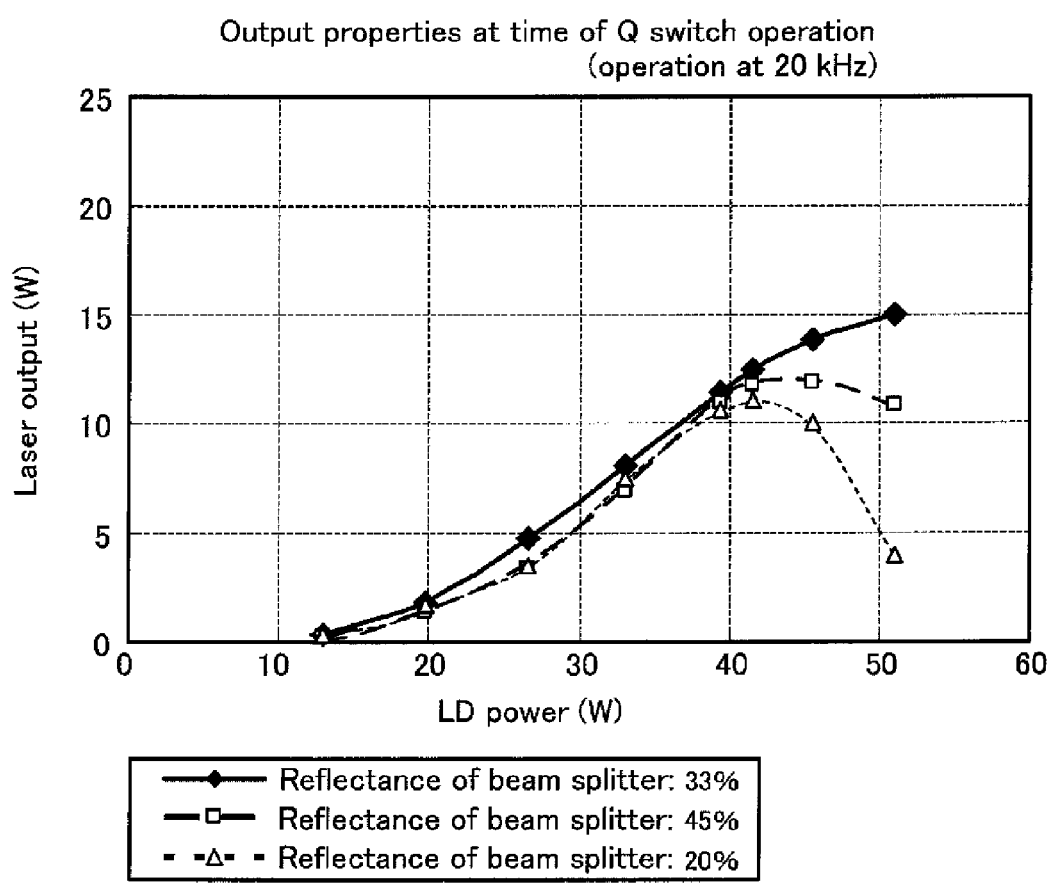
FIG. 19 is a graph where the laser output beam is measured for the power of the pumping light source in accordance with the reflectance of the beam splitter at the time of the Q switch operation in the two-directional pumping system.

Further, FIGS. 18 and 19 show the results of measurement of the power of the laser output beam relative to the power of the LD, which is the pumping light source, by changing the reflectance of the beam splitter in the two-directional pumping system in order to optimize the reflectance. In these figures, the typical output properties are measured when the reflectance of the beam splitter was 20%, 33% and 40%, and FIGS. 18 and 19 show the output at the time of CW operation and at the time of Q switch operation, respectively. As is clear from these figures, the higher the LD power of the pumping light source is, the more the laser output increases, and saturation and reduction of the output, which are characteristics of the thermal lens, start becoming visible in the vicinity of 45 W at the time of CW, and in the vicinity of 40 W at the time of Q switch operation. In this state, deterioration of the beam mode was also observed. It was confirmed from the above that reduction in the laser output becomes significant when the reflectance is too low. It is preferable for the reflectance to be in a range from 30% to 50% in practice. Further, the reflectance is most preferably set in the vicinity of 33%, that is, the ratio of the split of entering light by the beam splitter between the rear surface and the emission surface is set to approximately 2:1. The highest laser output was gained in the vicinity of this value, and it was confirmed that highly efficient operation was gained, with a minimal reduction in the laser output. The superiority of the above described numeral range was confirmed both at the time of CW operation and at the time of Q switch operation. Here, the laser output is as a whole lower at the time of Q switch operation than at the time of CW operation, and in addition, reduction starts at a stage where the level of the pumping light is low, and thus, it was confirmed that the system is easily affected by the thermal lens.

Here, in the case where the ratio of the split on the rear side is too high, the pumping light is more widely distributed on the rear side, and the risk of a thermal lens being generated on this surface becomes high, and therefore, the ratio of the split of entering light between the rear surface and the emission surface has an upper limit in the proximity of 4:1.

(Reflectance of Output Mirror)

Meanwhile, the reflectance of the output mirror determines the amount of energy that can be taken out from the resonator. Therefore, it is necessary to set an optimum reflectance. In general, when the reflectance of the resonator is high, the energy that is contained inside the resonator becomes high, and therefore, the risk of damaging the optical members that form the inside of the resonator becomes high. Therefore, it is desirable for the design to be such that the reflectance in the output mirror at a low value, in order to reduce the load on the optical members. However, it is necessary to increase the density of pumping inside the crystal in order to achieve this, and there is a limit in terms of how much the density of pumping can be increased for conventional one-directional pumping, due to the thermal lens and damage in the crystal.

Figure 20:
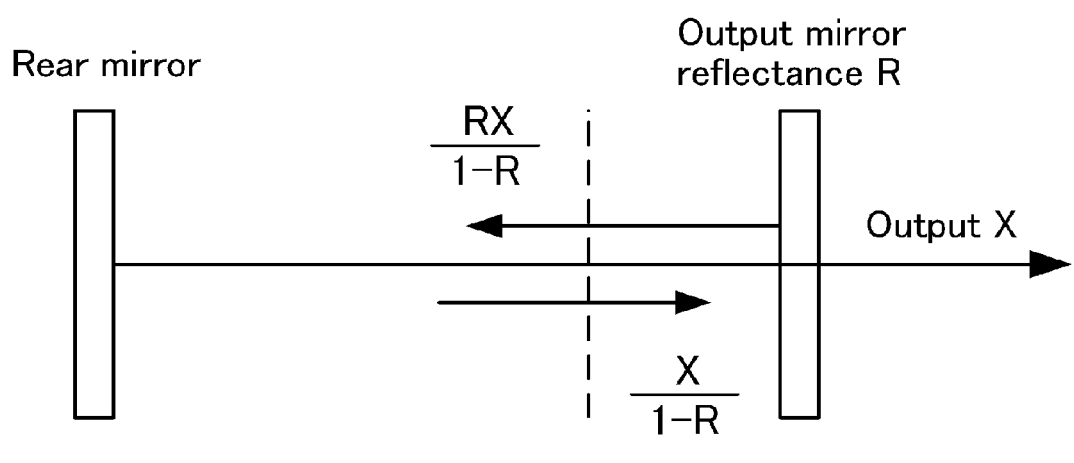
FIG. 20 is a schematic diagram showing a formula for calculating the energy inside a resonator.

Here, FIG. 20 shows the formula for calculating the energy inside the resonator. As shown in this figure, the energy Ersn which is contained inside the resonator can be expressed as Ersn={(1+R)X}/(1−R), where X is the output emitted from the output mirror and R is the reflectance of the output mirror. Here, in the case where a laser processing apparatus for gaining a laser output beam of 10 W is designed, energy of 190 W accumulates inside the resonator when the reflectance of the output mirror is 90%. Such high energy causes heat to be generated in the optical members which form the resonator, and in some cases, causes the quality of the laser beam to deteriorate, due to optical thermal strain generated in the mirrors and the like. In particular, a peak power of several tens of kW is generated in the pulse laser where a Q switch is mounted, and as a result, the optical members which form the resonator are damaged.

Therefore, the reflectance of the output mirror can be reduced from 90% to 70%, and thus, the energy accumulated inside the resonator can be reduced to approximately one third. Furthermore, when the reflectance is reduced to 50%, the energy can be reduced to approximately one half. Thus, it is desirable for the design to be such that the reflectance of the output mirror is low. Preferably, the power can be taken out efficiently when the reflectance is 70% or less. Further, the reflectance can be set at approximately 50%, in order to maintain stability, and thus, an advantage is gained, such that the reliability is higher, though the power is slightly lower.

(Setting of Lower Limit for Reflectance of Output Mirror)

Figure 21:
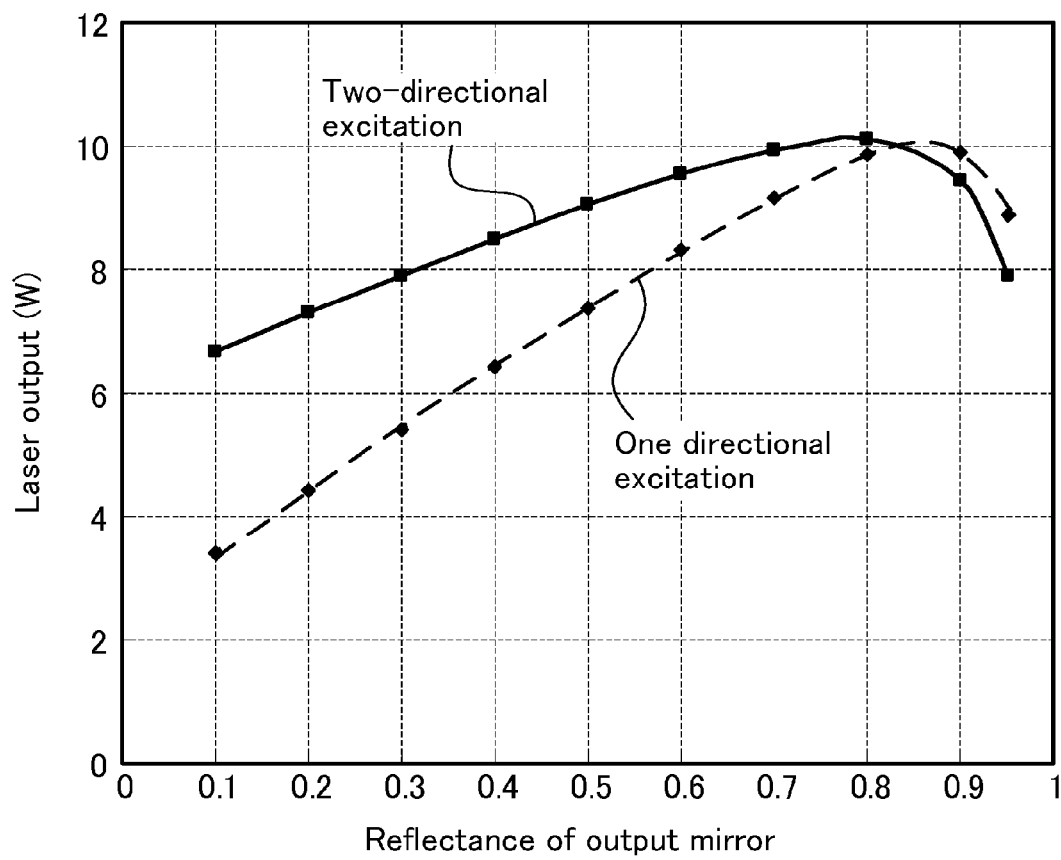
FIG. 21 is a graph showing the change in the laser output for the reflectance of the output mirror in the two-directional pumping system.
Figure 22:
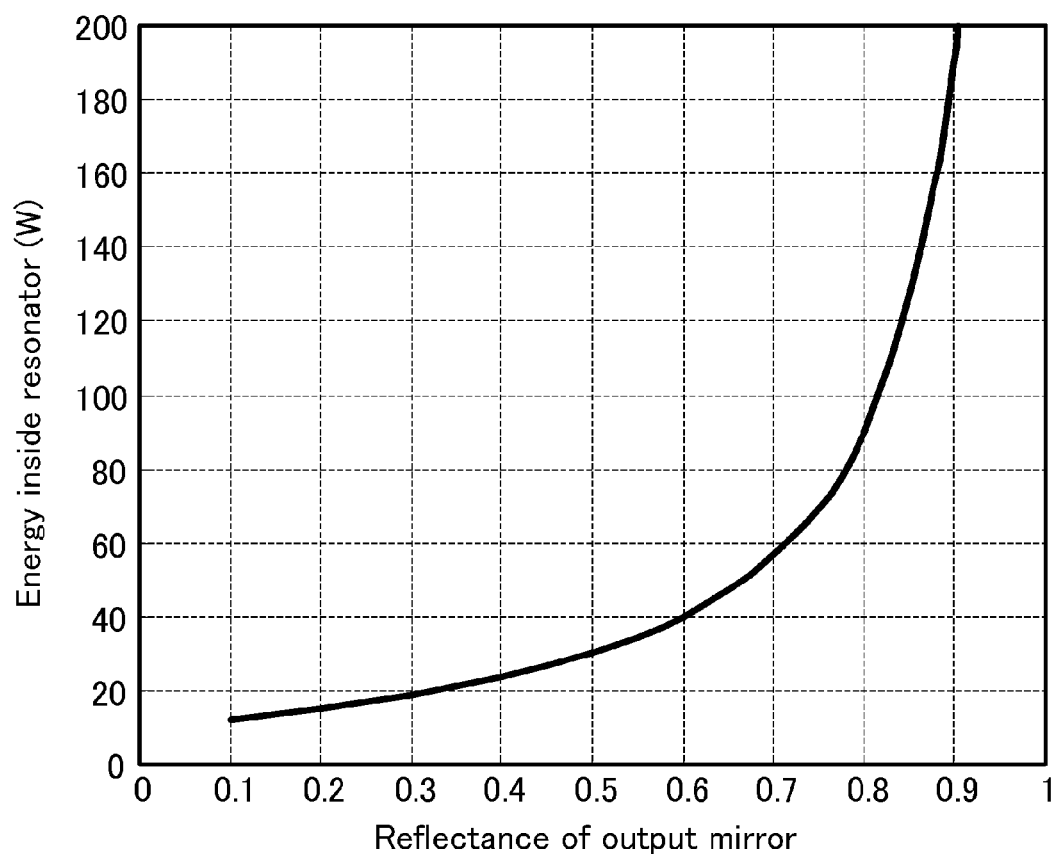
FIG. 22 is a graph showing the change in the energy inside a resonator relative to the reflectance of the output mirror.

Meanwhile, there is a risk that a problem may arise in the case where the reflectance of the output mirror is too low. FIGS. 21 and 22 show the change in the laser output relative to the reflectance of the output mirror in the two-directional pumping system and the change in the energy inside the resonator relative to the reflectance of the output mirror, respectively.

It can be seen from FIG. 21 that maximum output can be provided when the reflectance of the output mirror is approximately 70% to 80%. Further, an output of almost 90% in the above described range can be maintained when the reflectance is 50% to 60%, and the energy contained inside the resonator can be kept low, as in FIG. 22. Judging from the above, it is preferable for the reflectance of the output mirror to be set at 50% to 60%, in order to reduce the energy inside the resonator.

Meanwhile, even when the reflectance of the output mirror is set further lower, at 30% to 50%, 80% or more of the output can be expected in accordance with FIG. 21, and in addition, it seems possible from FIG. 22 to further reduce the energy contained inside the resonator, and therefore, this would seem to be a preferable configuration upon first consideration to secure reliability, even if the output is slightly sacrificed. However, in the case where the reflectance is set at 30% or lower, the energy contained inside the resonator cannot be reduced by the amount by which the output is lowered.

Figure 23:
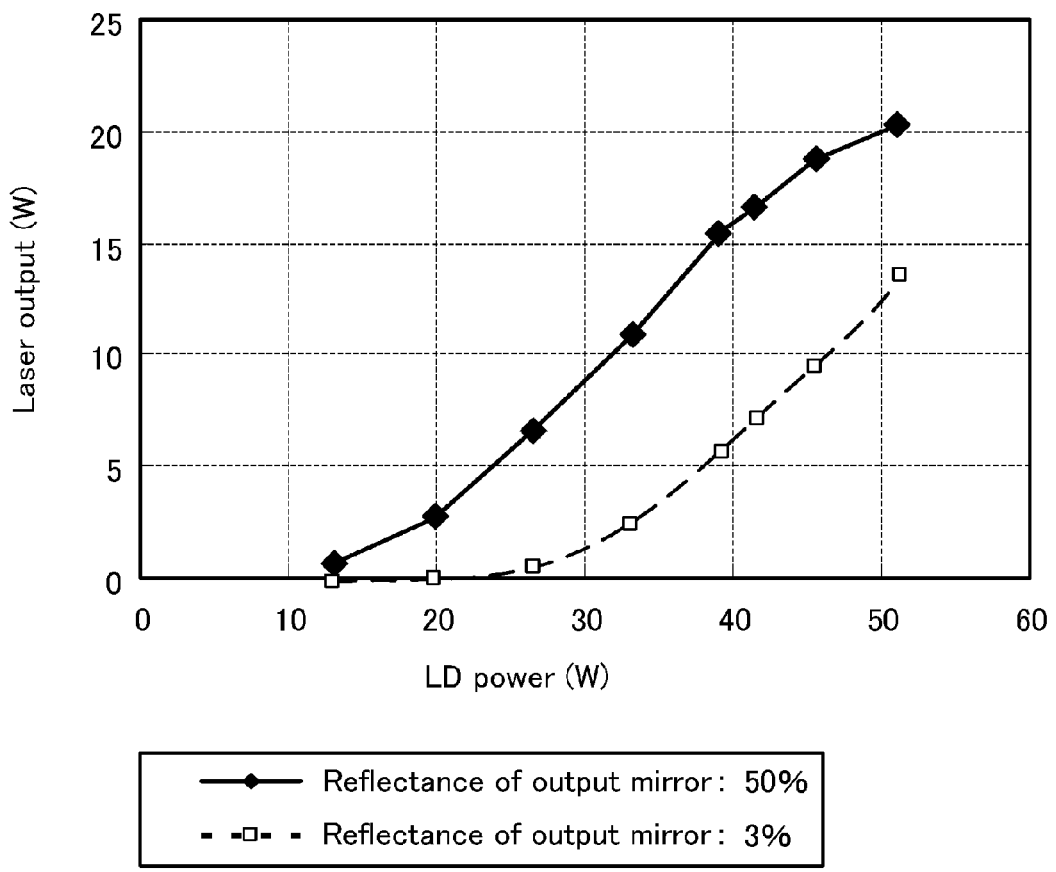
FIG. 23 is a graph where the laser output beam is measured for the power of the pumping light source at the time of CW operation in the two-directional pumping system both for the case where the reflectance of the beam splitter is high and when it is low.

In particular, in the case where the selected reflectance is as low as that above, a problem arises, in the case where the pumping power is changed step by step, as well as in the case where the output is changed with a low output, even in the case where a certain output can be secured with maximum pumping power. In general, the design in terms of the reflectance of the output mirror is determined based on data gained under the assumption that maximum pumping power is gained when maximum output is generated. However, actual laser processing apparatuses are not necessarily always used at maximum output, but in different pumping ranges below maximum. In this case, a problem arises, such that the threshold value of the laser oscillation increases when the output mirror reflectance is extremely low. FIG. 23 shows a graph where the power of the laser output beam is measured relative to the power of the LD, which is the pumping light source, in the case where the reflectance of the beam splitter is high (50%) and in the case where it is low (3%) relative to FIG. 18. As shown in this figure, when the reflectance is low, the threshold value of the laser oscillation resulting from pumping light which can be gained by the laser output beam increases from approximately 13 W to 20 W. This is because the gain inside the solid laser medium is lower, that is, the pumping density is lower, when the power of the LD unit is low, and as a result, the optimal reflectance of the output mirror becomes relatively high in comparison with cases where the power of the LD unit is high. Therefore, in the case where the power of the LD unit is low, low efficiency oscillation is forced with a design which is different from that for optimal reflectance. In the case of such oscillation efficiency, a problem arises, such that the output become unstable and change in the laser output beam becomes great, due to inappropriate temperature and deterioration of the mirror coating over time. Therefore, no merits can be gained when the reflectance of the output mirror is extremely low as a whole. Taking this into consideration, it is preferable for the reflectance of the output mirror to be in a range from 30% to 70%. It is more preferable for it to be 40% to 50%.

(Advantages in Reducing Reflectance of Output Mirror)

Here, the formula for calculating the laser output P is examined. The transmittance of the output mirror is denoted by T, the loss inside the resonator is Loss, the cross sectional area of the solid laser medium (effective pumping cross sectional area) is denoted by A, the length of the crystal of the solid laser medium (effective pumping length) is denoted by L, small signal gain generated inside the solid laser medium is denoted by $g_0$, and the saturation constant is denoted by Is ($=hv/\delta\tau_f$). At this time, the laser output P can be represented by the following Formula 1.

$$P=T\cdot(T+\text{Loss})\cdot A\cdot Is\cdot g_0\cdot L-T\cdot A\cdot Is/2 \qquad \text{[Formula 1]}$$

In the case where the above described formula 1 is regarded as an equation for T, the power that can be taken out from the output mirror become maximum when T is Topt, which provides the maximum value. Accordingly, in order to calculate Topt, the following Formula 2 is used.

$$Topt=((\text{sqrt}(2\cdot g_0\cdot L/\text{Loss})-1)\text{Loss} \qquad \text{[Formula 2]}$$

It can be seen from Formula 2 that the optimum transmittance Topt of the output mirror becomes great, and thus the reflectance R of the output mirror becomes small, when the small signal gain $g_0$ is great. As described above, the reflectance R of the output mirror which can take out the energy most efficiently can be made small when the design allows the small signal gain $g_0$ to be great. Meanwhile, the power contained inside the resonator can be expressed by the following Formula 3, as shown in FIG. 20, when R is the reflectance of the output mirror and X is the output that can be taken out from the output mirror.

$$(1+R) \cdot X/(1-R) \quad \text{[Formula 3]}$$

It can be seen from the above that the smaller the reflectance R of the output mirror is, the smaller the energy contained inside the resonator is, and the risk of damaging the coating on the output mirror, the rear side mirror and the end surfaces of the solid laser medium becomes small.

Meanwhile, the above described small signal gain $g_0$ can be expressed by the following Formula 4.

$$g_0 = \sigma \cdot N_0 \cdot W_p \tau_f \quad \text{[Formula 4]}$$

In the above formula, $\sigma$ is the induction release cross sectional area, and $\tau_f$ is the life of fluorescence; both are property values determined by the type of solid laser medium (whether it is Nd:YVO$_4$ or Nd:YLF). Meanwhile, $N_0$ and Wp are respective pumping rates for the pumping source (number of atoms) which exist per volume unit, and the product of these $N_0 \cdot W_p$ is the number of atoms which are excited per time unit and volume unit. Accordingly in order to design a laser processing apparatus having a large $g_0$, pumping light is condensed to a small volume, which is thus excited, so that the number of atoms excited per volume unit increases, and thus, increase in the pumping density leads to increase in $g_0$. As a result, $g_0$ becomes great in the case where the design allows the pumping volume to be small and the pumping density is high at the time of pumping, and as a result, a laser can be efficiently taken out from the output mirror, even when the reflectance of the output mirror is low. As a result, the risk of the coating used on the optical members that form the resonator being damaged can be reduced.

From the above described point of view, design for increasing the pumping density is preferable. However, the output calculated using the above described formula cannot actually be gained, due to the thermal lens generated inside the solid laser medium. The thermal lens generated inside the solid laser medium causes the mode to deteriorate, and in some cases hinders stable operation of the resonator, and thus, there may be some cases where the laser is not oscillated. Accordingly, it can be said to be preferable to increase the pumping density based on the above described theory, under the assumption that the amount of generated thermal lens is the same. In particular, the total amount of generated thermal lens can be reduced in comparison with conventional one-directional pumping by dispersing pumping light in two-directional pumping. As a result, it becomes possible, in two-directional pumping, to implement a state where a thermal lens is generated at the same level as conventional one-directional pumping, even when the pumping density is increased, and it also becomes possible to lower the reflectance of the output mirror by the same amount. As described above, it becomes possible to disperse heat using two-directional pumping, as well as to cause pumping with a density which is higher by the same amount, and as a result, the reflectance of the output mirror can be lowered, so that the energy stored inside the resonator can be reduced.

(Mode Matching)

Furthermore, the diameter of the spot of pumping light in two-directional pumping is made smaller than in the TEM$_{00}$ beam mode of the solid laser medium, and thus, further increase in the efficiency can be achieved. In conventional two-directional pumping, the diameter of the spot of pumping light for irradiating the respective end surfaces of the solid laser medium is made slightly greater in size than in the TEM$_{00}$ mode of the solid laser medium, and thus, the pumping is concentrated in a small area, so that a problem of a thermal lens and the effects of a strong thermal lens being generated can be avoided. According to this method, however, it is difficult to achieve increase in the gain inside the solid laser medium crystal in the case where an LD unit having a high output is used, through cases where the output of the LD unit is low can be dealt with. Therefore, the crystal is excited with high density within a diameter of the spot for pumping which is smaller than in the TEM$_{00}$ mode generated inside the resonator, and thus, the gain generated inside the solid laser crystal increases.

In further detail, the TEM$_{00}$ beam mode is a mode in which a single wavelength can be oscillated (single mode), and when a laser is oscillated in this mode, the phase of the laser output light becomes uniform and output light of high quality with no disturbance can be gained. In order to gain the TEM$_{00}$ mode, only the area for the TEM$_{00}$ mode of the end surfaces of the solid laser medium is excited using an aperture or the like. Conventionally it was thought that a thermal lens can be easily generated when excited in a small area. Further, once a thermal lens is generated, the output light spreads due to the thermal lens effect, even when light is condensed using an aperture or the like, and thus the TEM$_{00}$ mode can be gained. As a result, a thermal lens is avoided through pumping which is slightly greater than in the TEM$_{00}$ mode. Here, when a broad area is excited, single and multiple modes are mixed. Meanwhile, when the diameter of the spot is small for pumping, a thermal lens is generated, as described above, and thus, the single mode is not gained. In the case of a laser processing apparatus having a low output of, for example, approximately 2 W to 3 W, the single mode can be gained, even at the time of narrow pumping. However, the single mode cannot be gained for an output in the 10 W class through narrow pumping, due to the effects of heat. Therefore, concentration of heat is reduced, by adopting the two-directional pumping system described above, and as a result, pumping in single mode can be gained even when a spot of a small diameter is excited. As described above, two-directional pumping and adjustment of the diameter of the spot are used together, so that only a necessary area can be excited intensely, and thus, a high quality laser output beam can be gained with high efficiency. For example, a resonator output of 9 W can be gained by inputting an LD unit of 30 W in conventional systems, while in accordance with the present embodiment, the efficiency is improved through combination of two-directional pumping and mode matching, so that a resonator output of which the average output is 10 W or higher and the peak power is 30 kW or higher can be gained by inputting an LD unit of 40 W. Furthermore, the average output may be 15 W, and the peak power may be 100 kW.

Furthermore, output in the single mode is made possible by adjusting the diameter of the spot in the TEM$_{00}$ mode to 1.3 or lower, and in addition, the diameter of the spot in the TEM$_{00}$ mode can be reduced to 1.3 or lower when the laser output beam is in an output range of 0.5 W to 15 W.

The diameter of the spot is adjusted using a condenser lens. The condenser lens condenses parallel light which is reflected from the reflection mirror or reflected from or transmits through the splitting part 23 to a spot of a predetermined diameter, and thus, light enters through the end surfaces of the solid laser medium.

(Laser Beam Scanning System 30)

A work region on a workpiece W is scanned with the laser output beam generated by the laser resonant portion, as described above, in a desired processing pattern using a laser beam scanning system 30, so that the workpiece is processed. The laser resonant portion 20 and the laser beam scanning system 30 are optically connected, and bend the laser output beam emitted from the output mirror 26, for example as in FIG. 3, so that the laser output beam is transmitted to the laser beam scanning system 30 placed beneath.

The laser beam scanning system 30 is provided with scanners which reflect the laser beam and output it in a desired direction so that the surface of the workpiece W is scanned with the laser output beam for processing. Each scanner is provided with a galvano mirror, which is a total reflection mirror, as a reflection surface for reflecting light, a galvano motor for rotating the galvano mirror, which is secured to the rotational axis, and a position detecting portion for detecting the rotational position of the rotational axis, and outputs the result as a position signal. Further, the scanners are connected to a scanner driving portion 35 for driving the scanners. The scanner driving portion 35 is connected to a control portion 50 and receives a control signal for controlling the scanners from the control portion 50, and thus, drives the scanners based on this. For example, the scanner driving portion 35 adjusts the drive current for driving the scanners based on the control signal. Furthermore, the scanner driving portion 35 is provided with an adjusting mechanism for adjusting how the rotational angle of each scanner changes over time in response to the control signal. The adjusting mechanism is formed of semiconductor paths, for example a variable resistor for adjusting the respective parameters of the scanner driving portion 35.

The laser beam scanning system 30 shown in FIG. 1 is provided with an X axis scanner 31 and a Y axis scanner 32, which form a pair, and galvano motors 33 and 34 for rotating these, respectively. The galvano motors 33 and 34 are driven by the scanner driving portion 35. The scanner driving portion 35 drives the galvano motors 33 and 34 based on a scan signal provided from the control portion 50, and thus, rotates the total reflection mirrors of the X axis scanner 31 and the Y axis scanner 32, which are provided around the output axes of the galvano motors 33 and 34 so that the laser output beam oscillated by the solid laser medium 21 is deflected and used for scanning. The surface of the workpiece W is irradiated and scanned with the deflected laser output beam and thus marked via a work region light condensing portion 40 provided approximately in the direction of deflection. The work region light condensing portion 40 is provided so that the deflected laser output beam enters at the center as parallel light in such a state that the scanners are in a neutral position.

A work region light condensing lens, such as an fθ lens, is used for the work region light condensing portion 40. The laser beam is reflected from the galvano mirror, and after that condensed through the work region light condensing lens so that the irradiated surface is irradiated. A beam expander 36 is placed in front of the galvano mirror, as shown in FIG. 1, in order to effectively condense light to a small spot, and thus, the beam diameter of the laser beam outputted from the laser oscillation portion 50 is expanded. The beam emitted from the beam expander 36 is reflected from an optical member, for example a mirror, so as to be led to the galvano mirror of the laser beam scanning system 30. Here, the work region light condensing portion, for example the fθ lens, can be omitted when the Z axis scanner functions as the work region light condensing portion, as described below.

Figure 24:
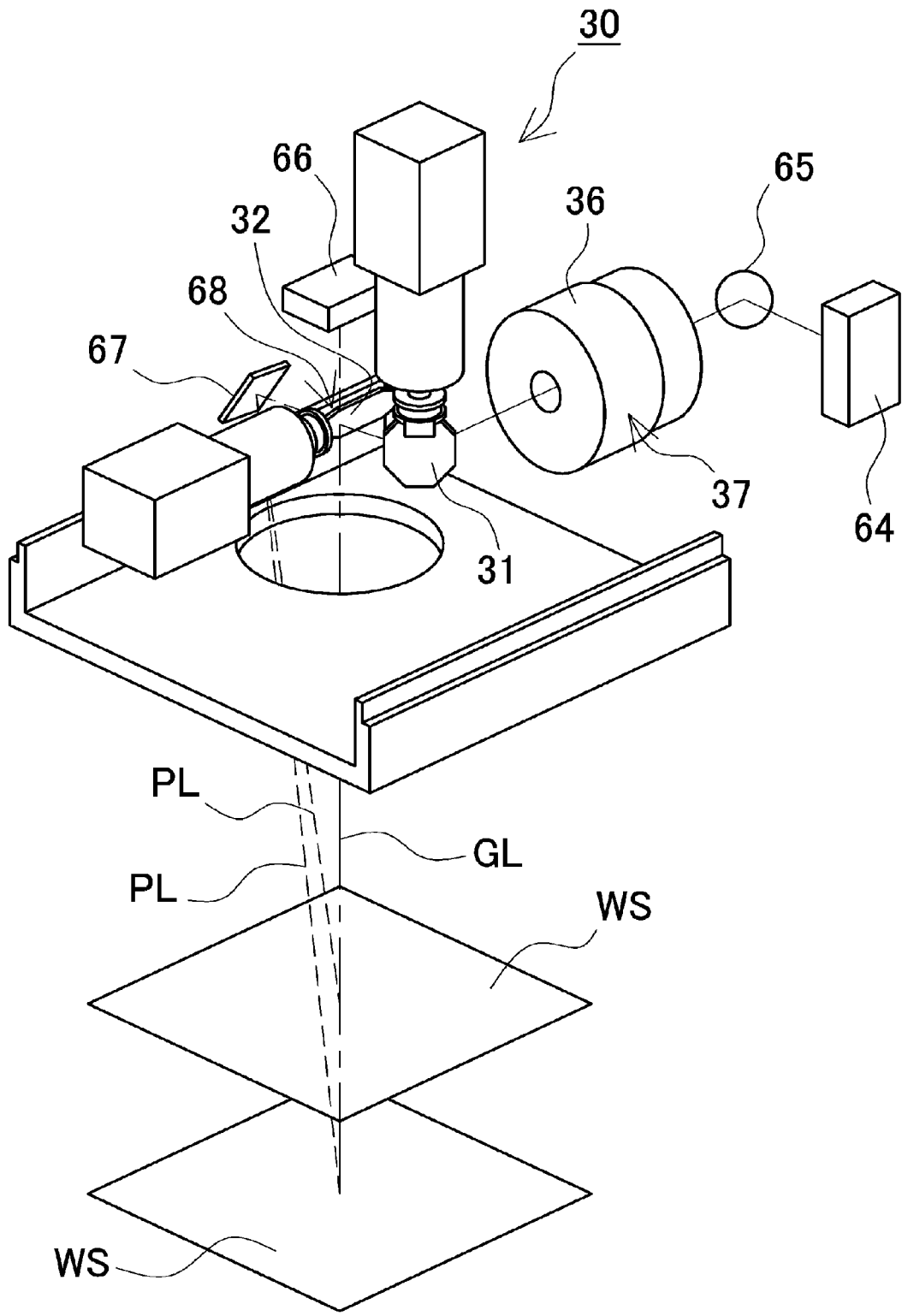
FIG. 24 is a perspective view showing the configuration of a laser output portion including the laser beam scanning system of a laser processing apparatus.
Figure 25:
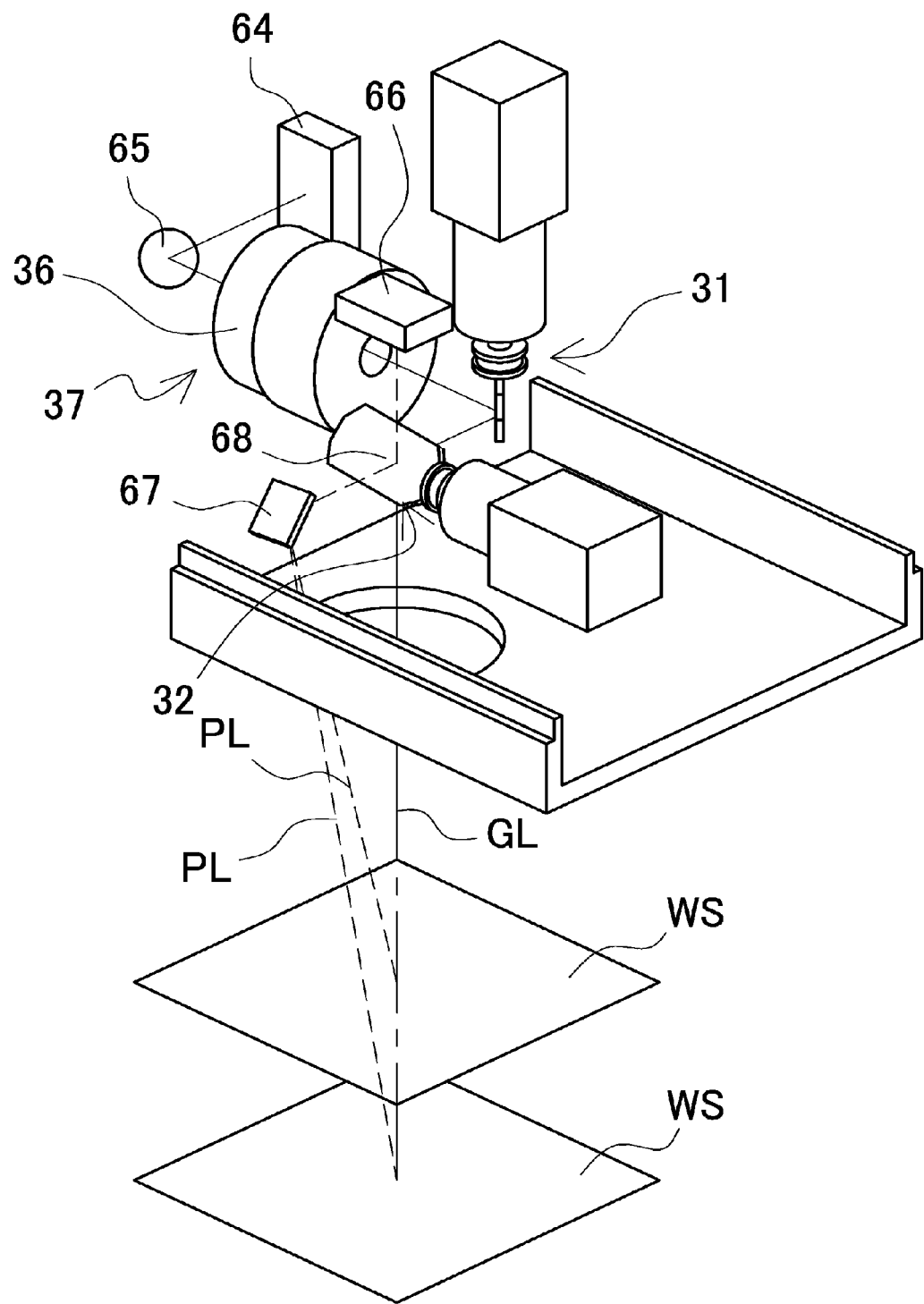
FIG. 25 is a perspective view showing the configuration in FIG. 24 as viewed from the back.
Figure 26:
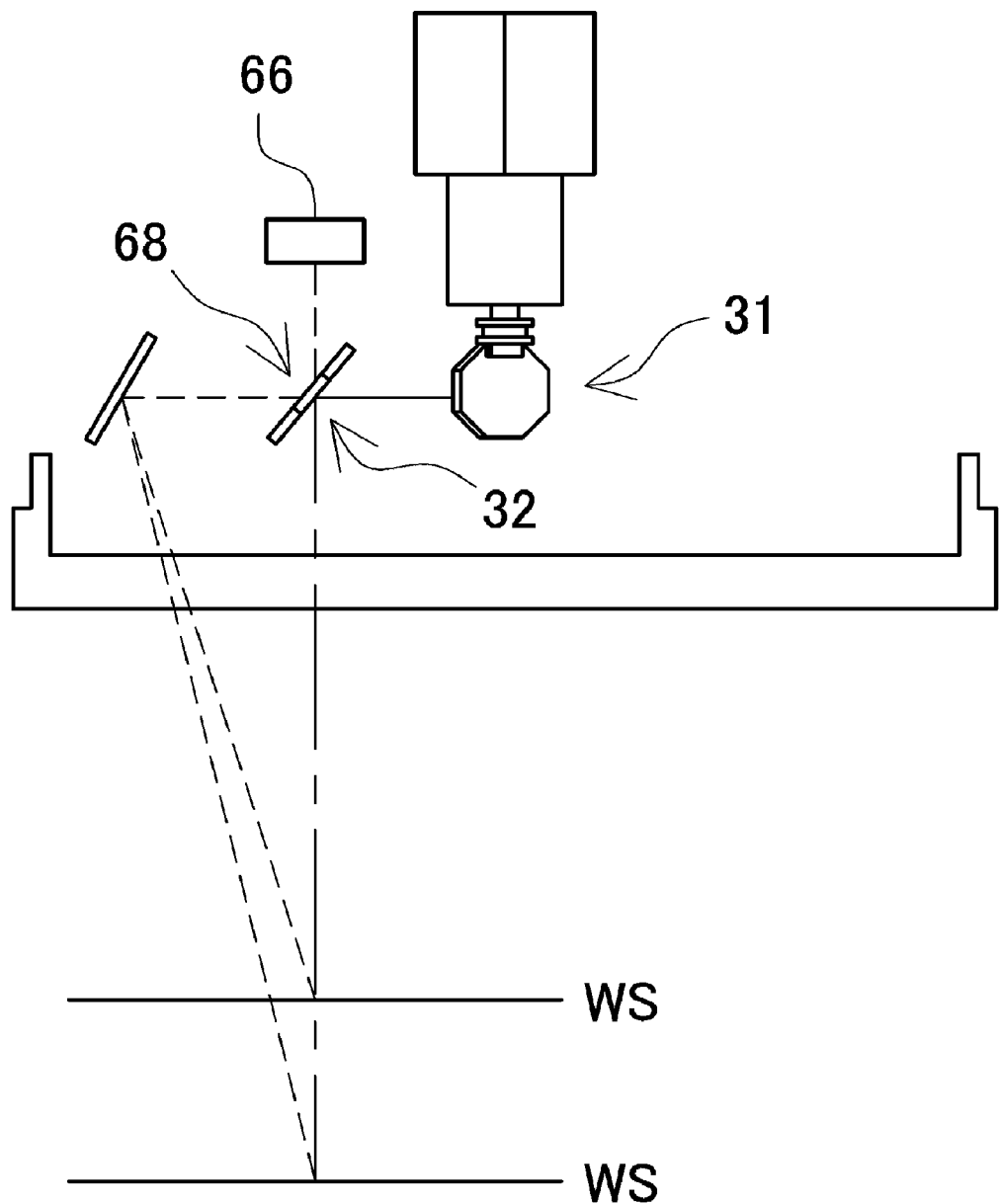
FIG. 26 is a side view showing the configuration of FIG. 24 as viewed from the side.

FIGS. 24, 25 and 26 show an example of the laser beam scanning system 30. In these figures, FIG. 24 is a perspective view showing the configuration of the laser beam scanning system 30 in the laser processing apparatus, FIG. 25 is a perspective view showing the configuration of FIG. 24 as viewed in the opposite direction, and FIG. 26 is a side view. The laser processing apparatus shown in these figures is provided with a beam expander 36 in which a Z axis scanner of which the light path coincides with that in the laser resonant portion 20 for generating a laser output beam is built in, an X axis scanner 31 and a Y axis scanner 32, which is arranged in such a manner as to cross the X axis scanner 31 perpendicularly. This laser beam scanning system 30 can allow the work region WS to be two-dimensionally scanned with the laser output beam emitted from the laser resonant portion 20 using the X axis scanner 31 and the Y axis scanner 32, and furthermore, can adjust the working distance, that is, the focal distance, in the direction of the height, using the Z axis scanner 37, so that three-dimensional processing becomes possible. Here, the X axis scanner, the Y axis scanner and the Z axis scanner of course function in the same manner even when switched. For example, the laser output beam emitted from the Z axis scanner may be received by the Y axis scanner in the configuration, or the X axis scanner may control the Y axis and the Y axis scanner control the Z axis in the arrangement. Here, the fθ lens, which is the work region light condensing lens, is not shown in the figures.

Figure 27A:
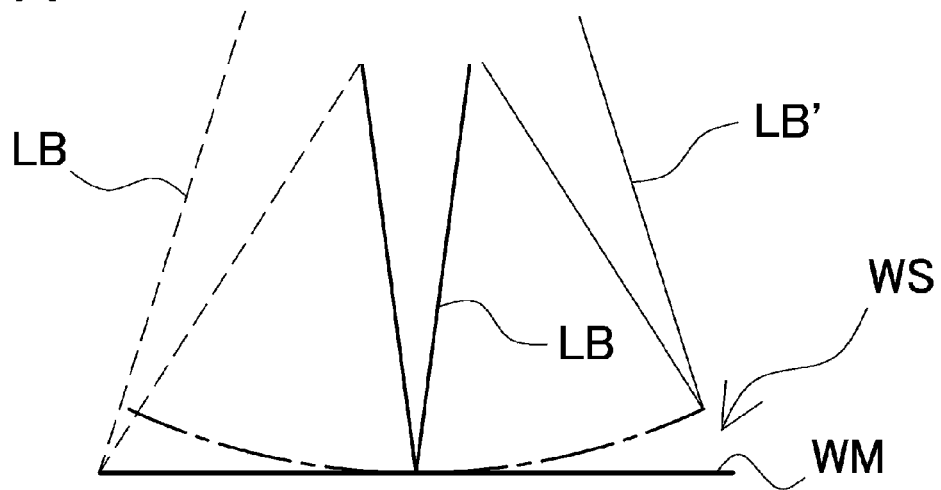
FIGS. 27A and 27B are views illustrating the state where the location of the focal point of the laser output beam of the laser processing apparatuses changes depending on the work location.
Figure 27B:
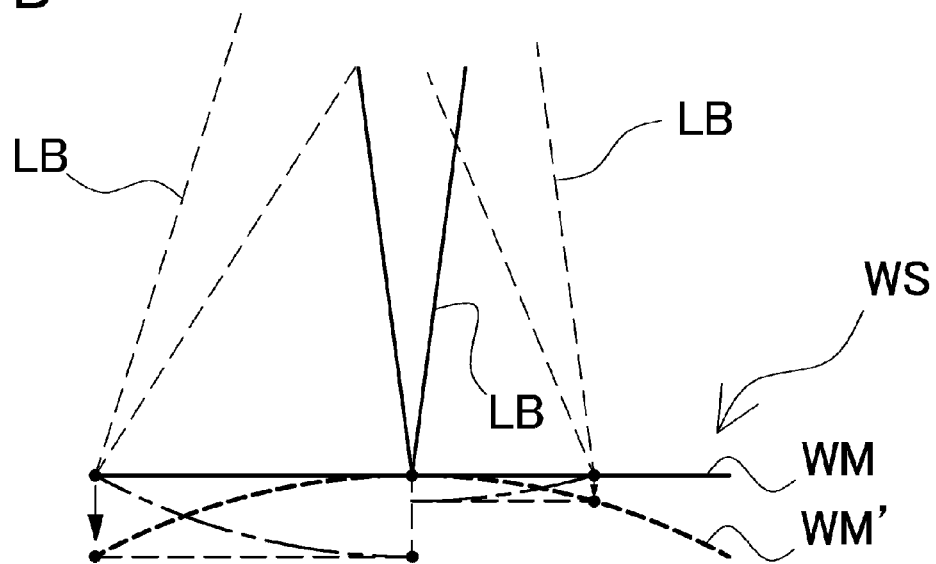

In general laser processing apparatuses, a work region light condensing lens, such as fθ lens, is arranged between the Y axis scanner and the work region in order to condense the laser output beam reflected from the Y axis scanner, so that the work region is irradiated. The fθ lens carries out correction in the Z axis direction. Concretely, as shown in FIG. 27A, the focal distance is longer as the focal point is closer to the end portion of the work region WS, so that the focal point is located on the surface of the object to be processed of the workpiece W. The focal point of the laser output beam forms a track in arc form, and therefore, in the case where the surface of the object to be processed is flat, the distance between the focal point and the surface of the object to be processed becomes greater (laser output beam LB') and the beam becomes out of focus, reducing the precision in processing, as the distance between the focal point and the center of the plane WM of the surface of the object to be processed becomes greater, that is, the focal point becomes closer to the periphery of work region WS when the focal point is set and adjusted at the center in FIG. 27A, which is the location directly beneath the source of the laser output beam. Therefore, as shown in FIG. 27B, the beam is corrected with an fθ lens, so that the focal distance of the laser output beam LB becomes greater as the focal point becomes closer to the end portion of the work region WS. The plane WM, which is the surface of the object to be processed, is virtually converted to the corrected surface of a curved surface in protruding form shown by WM', and thus, the focal point of the laser output beam LB can be located on the plane WM.

In the laser processing apparatus, it is preferable to arrange an fθ lens in the case where a beam of which the diameter of the spot is smaller than approximately 50 µm, for example, is desired to be formed. Meanwhile, in the case where a beam of which the diameter of the spot is greater than the diameter of the above described small spot and approximately 100 µm (diameter of spot usually used) is adopted, the Z axis light condensing lens, which is provided in the beam expander on the Z axis scanner side, is moved in the Z axis direction, and thus, correction of the beam in the Z axis direction as carried out by the fθ lens can be carried out as correction control. As a result, it also becomes possible to omit the fθ lens in the case where the diameter of the spot is great. In the above described example of FIG. 27A, correction of the beam in the Z axis direction is carried out with the fθ lens is carried out through correction control of the Z axis scanner. Meanwhile, in the case where the diameter of the spot is small, adjustment of the location of the focal point becomes insufficient through correction by the Z axis scanner, and therefore, an fθ lens is used, as described above. In the present embodiment, three types of diameters: small spot, standard and wide spot, are prepared for the spot of the laser output beam, and the distortion in the end portion of the work region WS is corrected using the fθ lens when a small spot type is selected from among the above, while correction is carried out using the Z axis scanner for the standard and wide spot, without using an fθ lens.

In the case where correction control in the direction of the Z axis is carried out using a Z axis light condensing lens provided with the beam expander of the Z axis scanner, correction similar to the above described correction using and fθ lens is carried out. The height of the correction surface WM' shown in FIG. 27B, that is, the Z coordinate, is singularly defined by the XY coordinates. Therefore, the Z coordinate after correction is related to every XY coordinate, and thus, it becomes possible to always process at the focal point in the case where Z axis scanner is moved to the related Z coordinate as the XY axis scanner moves. The related data is stored in the memory portion 72 of the laser process data setting apparatus shown in FIG. 28. Alternatively the data may be stored in the memory portion 52 provided in the laser control portion 1 of the laser processing apparatus and transferred. As a result, the Z coordinate after correction is determined following the movement of the XY coordinates within the work region, and therefore, the work region can be irradiated with a laser output beam of which the focal points are adjusted approximately uniformly.

(Z Axis Scanner 37)

Figure 29:
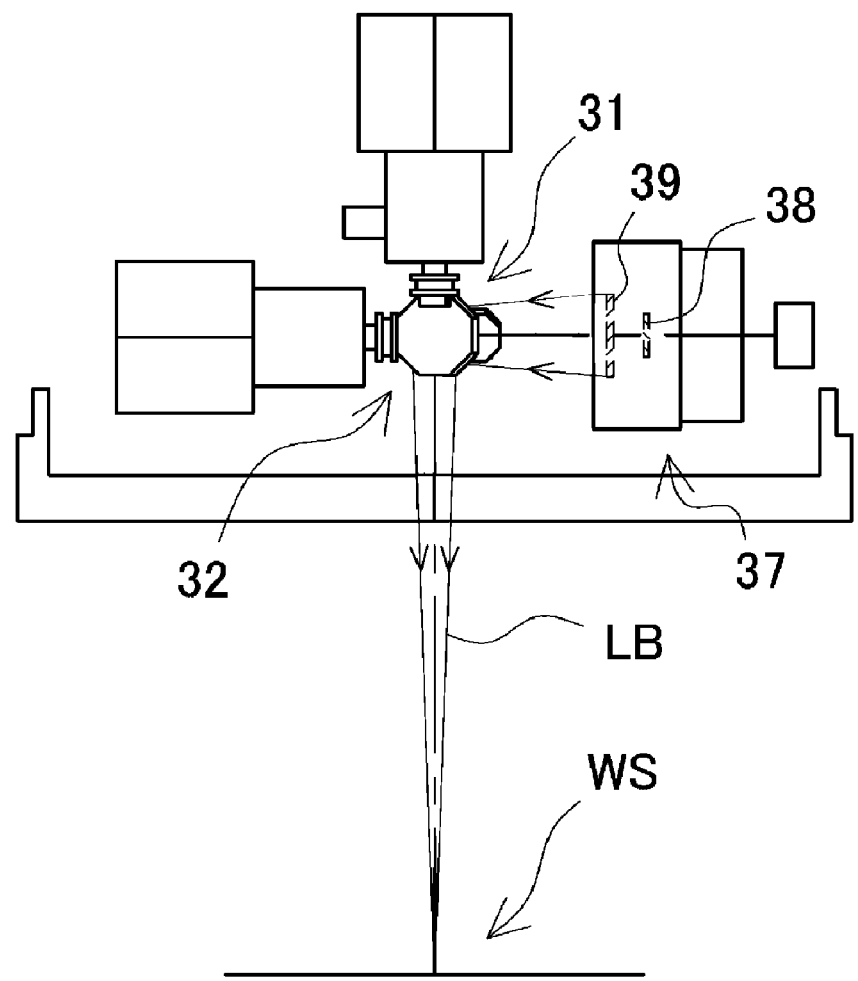
FIG. 29 is a side view showing the laser beam scanning system in the case where the focal distance is long.
Figure 30:
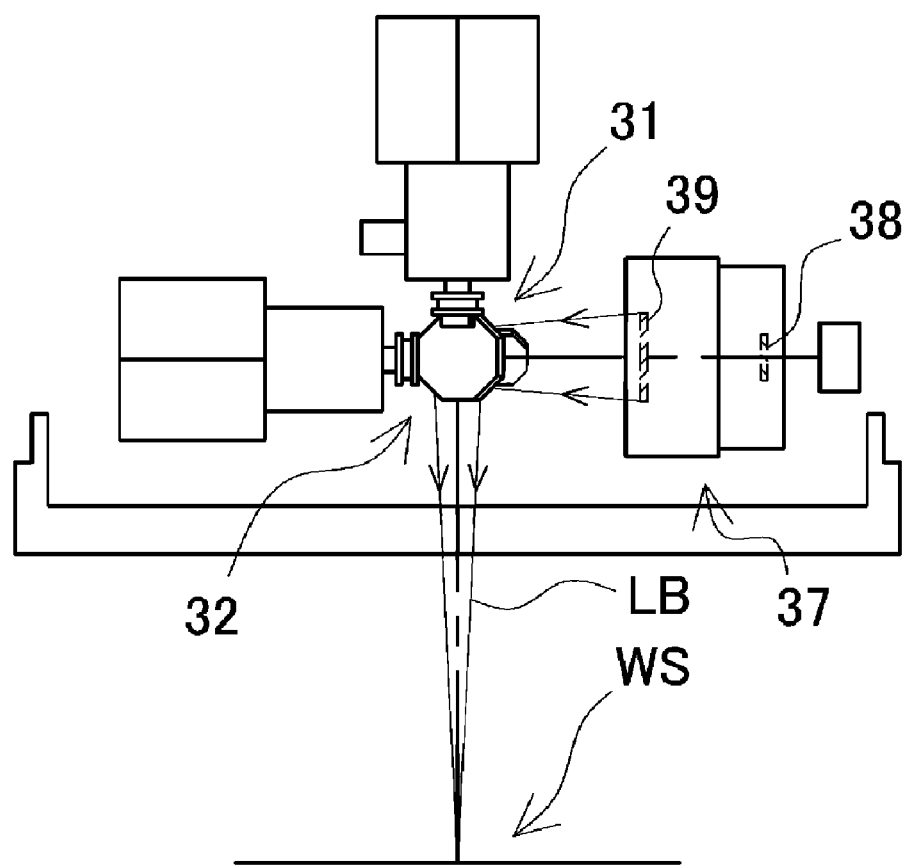
FIG. 30 is a side view showing the laser beam scanning system in the case where the focal distance is short.
Figure 31A:
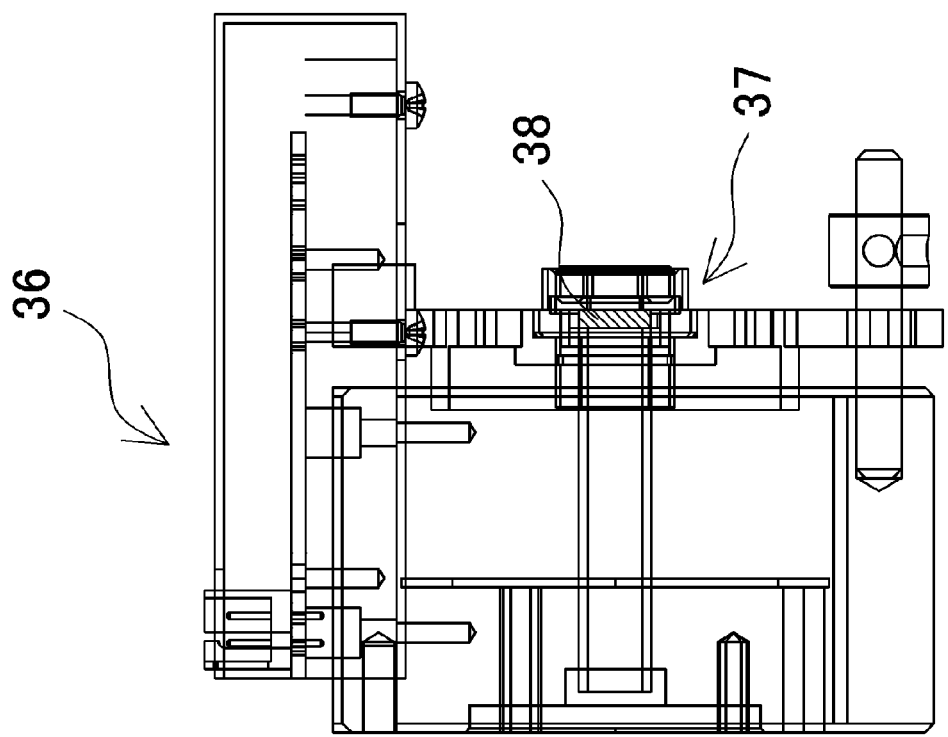
FIG. 31A is a front view showing a Z axis scanner and FIG. 31B is a cross-sectional view a cross section of the Z axis scanner.
Figure 31B:
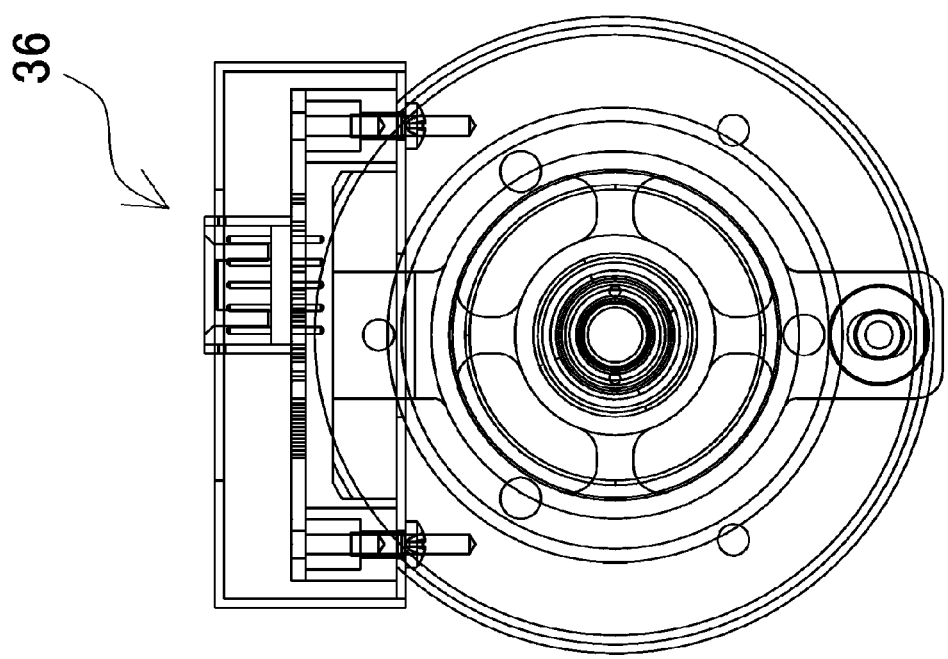

A Z axis scanner 37 adjusts the diameter of the spot of the laser output beam, and thus, forms a beam expander 36 for adjusting the focal distance. That is, the beam expander 36 can change the relative distance between the lens through which light enters and the lens from which light is emitted, and thus, the diameter of the laser output beam can be made larger/smaller, and the location of the focal point can also be changed. The beam expander 36 effectively condenses light to a small spot, and therefore, is placed on the front stage of the galvano mirror, as shown in FIG. 24, so that the diameter of the laser output beam outputted from the laser resonant portion 20 is adjusted and the location of the focal point of the laser output beam is adjustable. A method according to which the Z axis scanner 37 adjusts the working distance is described in reference to FIGS. 29 to 31. FIGS. 29 and 30 are side views of a laser beam scanning system 30; FIGS. 29 and 30 show a case where the distance of the focal point of the laser output beam is made long and a case where the distance of the focal point of the laser output beam is made short, respectively. Further, FIG. 31A is a front view showing the Z axis scanner 37 and FIG. 31B is a cross-sectional view of the Z axis scanner 37. As shown in these figures, the Z axis scanner 37 includes a lens 38 through which light enters which faces the laser resonant portion 20 side, and a lens 39 through which light is emitted which faces the laser emission side so that the relative distance between these lenses can be changed. In the example of FIGS. 29 to 31, the lens 39 through which light is emitted is secured and the lens 38 through which light enters is slidable using a drive motor or the like in the direction of the optical axis. In FIGS. 31A and 31B, the lens 39 through which light is emitted is not shown, and the drive mechanism of the lens 38 through which light enters is shown. In this example, a movable member is slidable in the axial direction by means of a coil and a magnet, and the lens 38 through which light enters is secured to the movable member. Here, it is also possible to secure the lens through which light enters side so that the lens through which light is emitted side is movable, as well as to make both the lens through which light enters and the lens through which light is emitted movable.

As shown in FIG. 29, when the distance between the lens 38 through which light enters and the lens 39 through which light is emitted is close, the location of the focal point becomes far, and the focal distance (working distance) becomes greater. Meanwhile, when the distance between the lens 38 through which light enters and the lens 39 through which light is emitted becomes great, as shown in FIG. 30, the location of the focal point becomes closer, so that the focal distance becomes small.

Here, in a laser processing apparatus where three-dimensional processing is possible, that is, processing on a workpiece is possible in the direction of the height, it is possible to use other systems, for example to physically move the work region light condensing lens, to make the laser output portion or the marking head movable, or to move the stage on which a workpiece is mounted, in addition to the system where the Z axis scanner is adjusted, as in FIG. 30.

(Distance Pointer)

A guide pattern which indicates the location for irradiation when the work region WS is scanned with the laser output beam can be displayed, in order to adjust the focal location to the center of the work region in a laser processing apparatus which makes three-dimensional processing possible. The laser beam scanning system 30 in the laser processing apparatus shown in FIGS. 24 and 25 is provided with a guiding light source 64 and a half mirror 65, which is one form of the guide light optical system for making the guide light GL from the guiding light source 64 coincide with the optical axis of the laser beam scanning system 30, which form the distance pointer, and at the same time, provided with a light source 66 for a pointer which emits pointer light PL, a scanner mirror 68 for a pointer formed on the rear surface of a Y axis scanner 32, and a fixed mirror 67 for further reflecting pointer light PL from the light source 66 for a pointer that is reflected from the scanner mirror 68 for a pointer so that the light is emitted toward the location of the focal point, which form the pointer light adjusting system. This distance pointer allows the pointer light PL indicating the location of the focal point of the laser output beam to be emitted from the light source 66 for a pointer, and adjusts the pointer light so that the approximate center of the guide pattern displayed with the guide light GL is irradiated with the point light PL, and thus, the location of the focal point of the laser output light is indicated.

Here, in the above described example, a mechanism for adjusting the focal distance of the laser output beam is provided in the laser beam scanning system 30, and thus, a three-dimensional process is possible. Here, the location of the stage on which a workpiece is mounted can be adjusted in the upward and downward direction, and thus, the height of the stage is adjusted under control, so that the focal point of the laser output beam is located on the work surface of the workpiece and a three-dimensional process can be carried out in the same manner. Further, the corresponding scanner in the laser beam scanning system can be omitted when the stage is movable in the X axis and Y axis direction. This configurations are appropriate for use in a form where a workpiece is mounted on a stage for processing instead of a form where a workpiece is conveyed along a processing line.

The above described configurations allow the work region to be three-dimensionally scanned with a laser output beam gained by the laser resonator in the laser beam scanning system 30. Further, the amount of movement of the Z axis scanner, of which the response properties are generally inferior to those of the XY axis scanners, is kept small, and thus, three-dimensional processing becomes possible at higher speed, with high controllability. Furthermore, correction is carried by the Z axis scanner, so that the focal distance at each location in the work region can be kept constant, and this correction is stopped during the time when the emission of the laser output beam is turned of, so that the amount of movement of the Z axis scanner, of which the response properties are generally inferior to those of the XY axis scanners, can be kept small, and three-dimensional processing becomes possible at higher speed, with high controllability. Furthermore, the Z axis scanner adjusts the laser output beam so that the focal distance becomes approximately uniform within the work region and the precision in processing can be prevented from lowering in the vicinity of the ends of the work region without separately preparing a work region light condensing lens and the like. Further, the Z axis scanner is moved to the Z coordinate in the location where the next process is expected to start, and thus, the next process can be started smoothly. Alternatively, the tracking operation of the Z axis scanner can be stopped so as to be held at a constant location, and thus, the XY axis scanners can be moved to the next location for processing at high speed without being affected by the response time of the Z axis scanner, and as a whole, the scanning speed is higher.

However, the angle at which the emission light spreads changes due to the thermal lens properties of the solid laser medium, and therefore, a problem arises, such that the location of the focal point may shift, depending on the setting of the power for the point to be processed. The amount of this shift can be calculated in the operation, so that the shift is corrected by the Z axis scanner and the precision of the process can be maintained even when a thermal lens is generated.

(System Configuration of Laser Processing Apparatus)

Figure 32:
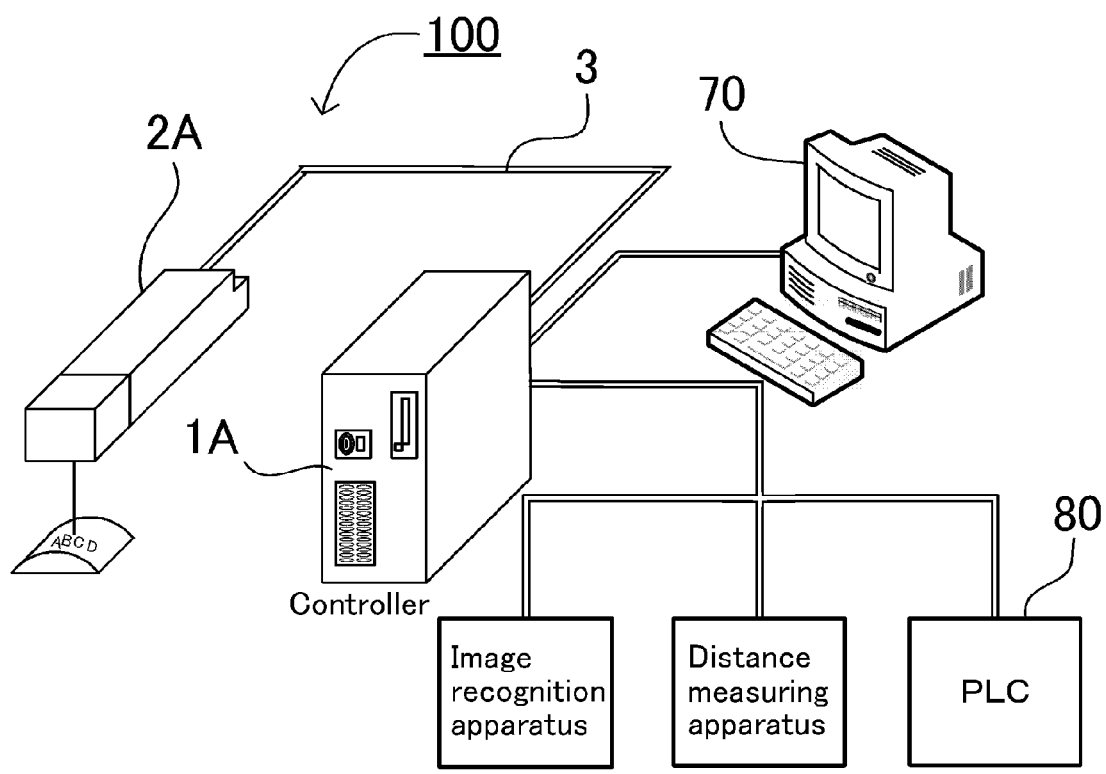
FIG. 32 is a block diagram showing the system configuration of a laser processing apparatus where three-dimensional processing is possible.
Figure 33:
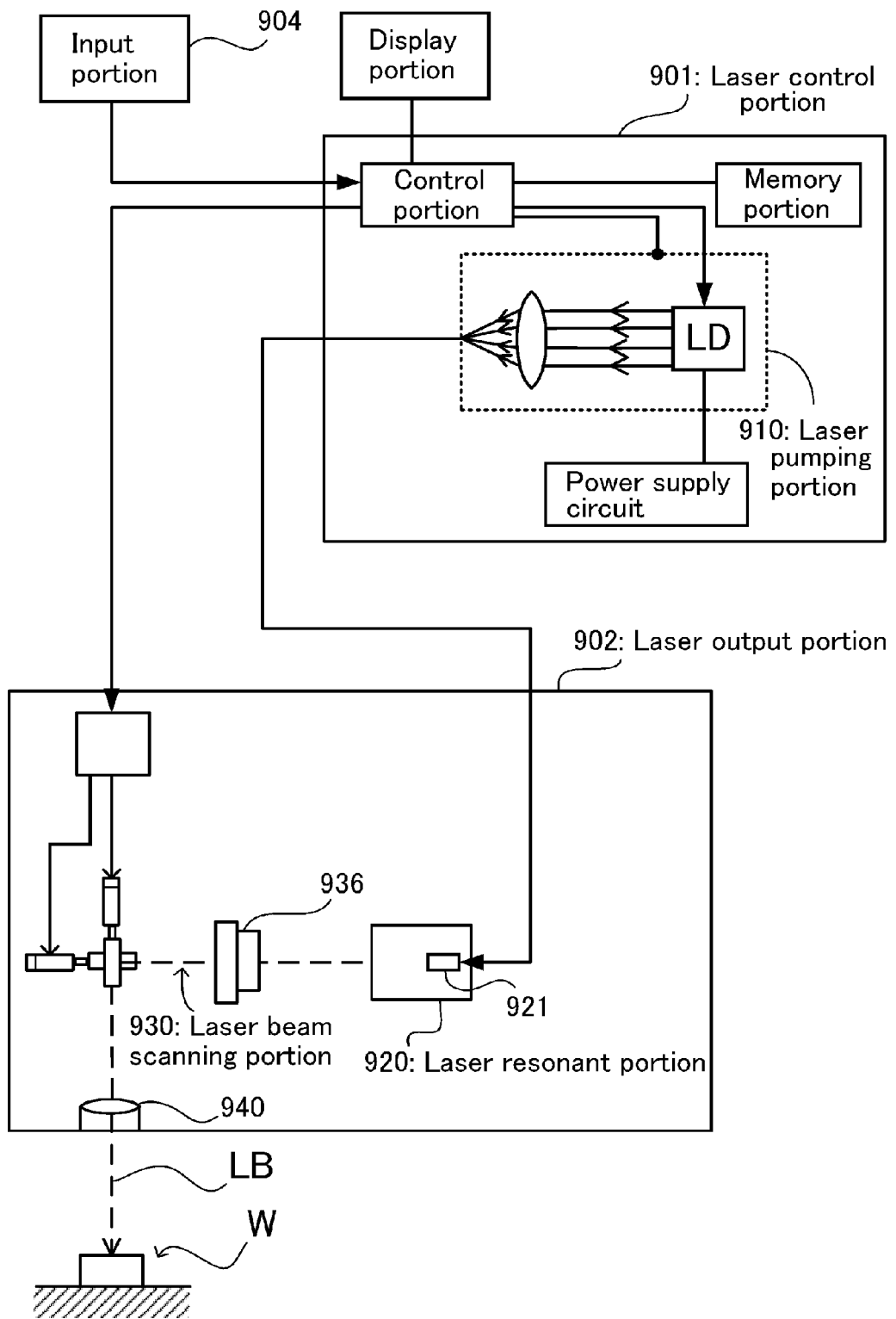
FIG. 33 is a block diagram showing the configuration of a laser processing apparatus in accordance with a conventional end pumping system.
Figure 34:
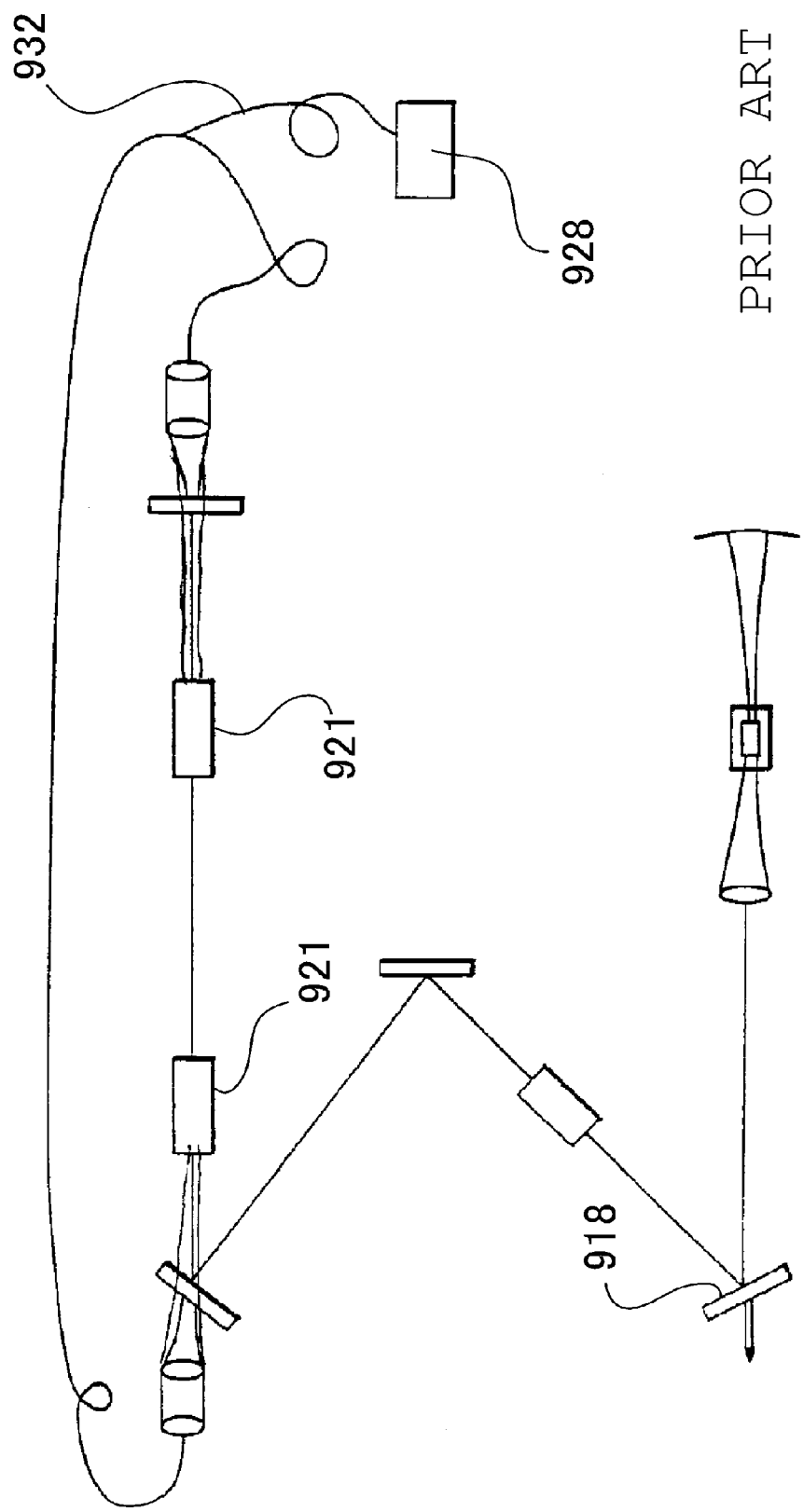
FIG. 34 is a block diagram showing the configuration of a two-directional pumping system.

Next, FIG. 32 shows the system configuration of a laser processing apparatus which can carry out three-dimensional processing. The laser processing system shown in this figure includes a marking head 2A, which forms a laser output portion, a controller 1A, which is a laser control portion 1 connected to the marking head 2A to control it, and a laser processing data setting apparatus 70, which is connected to the controller 1A in such a manner that data communication is possible and sets a processing pattern for the controller 1A as three-dimensional laser processing data. The marking head 2A and the controller 1A form a laser processing apparatus 100. Further, the laser processing data setting apparatus 70 installs a laser processing data setting program in the computer in the example of FIG. 32 so that a laser processing data setting function is implemented. A programmable logic controller (PLC) to which a touch panel is connected, as well as other dedicated hardware, in addition to a computer, can be used as the laser processing data setting apparatus. Furthermore, the laser processing data setting apparatus can function as a control apparatus for controlling the operation of the laser processing apparatus. For example, one computer may have a combined function, both as a laser processing data apparatus and as a controller for the laser output portion provided with a laser output portion. Furthermore, the laser processing data setting apparatus may be formed of other members than the laser processing apparatus or combined with the laser processing apparatus, and a laser processing data setting circuit or the like can be incorporated in the laser processing apparatus, for example.

Furthermore, various types of external devices 80 can be connected to the controller 1A if necessary. An image recognition apparatus, such as an image sensor for detecting the type, location and the like of a workpiece which is conveyed along the processing line, a distance measuring apparatus, such as a displacement gauge for acquiring information on the distance between the workpiece and the marking head 2A, a PLC for controlling a device in accordance with a predetermined sequence, and a sensor, of any type, for example a PD sensor for detecting whether or not the workpiece has passed, for example, are installed, and the controller 1A can be connected to these so that data communication is possible.

(Laser Processing Data Setting Apparatus)

Figure 28:
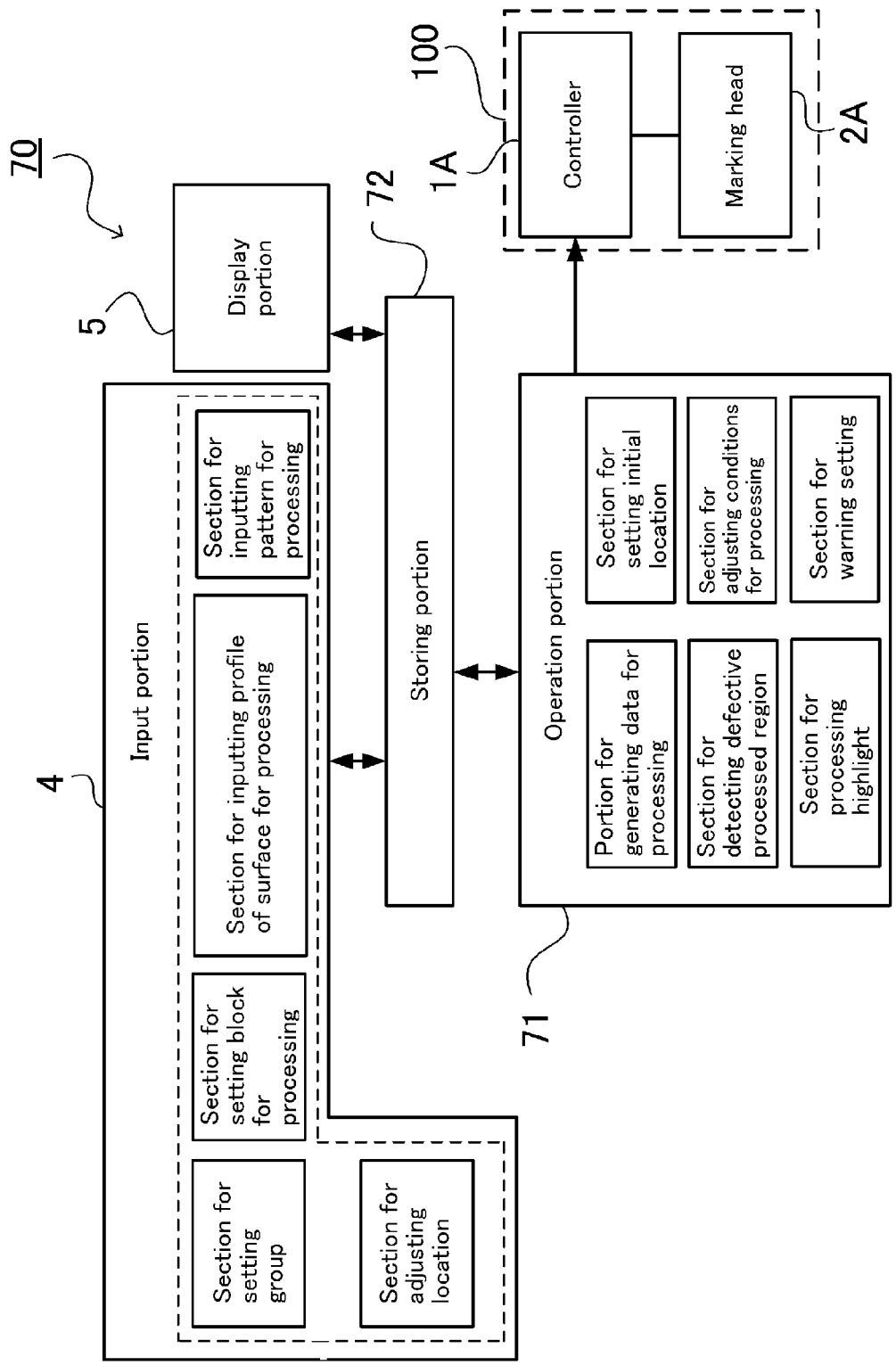
FIG. 28 is a block diagram showing a laser processing system.

The laser processing data, which is information to be set in order to three-dimensionally process processing data in plane form, is set by a laser processing data setting apparatus 70. FIG. 28 is a block diagram showing an example of the laser processing data setting apparatus 70. The laser processing data setting apparatus 70 shown in this figure includes an input portion 4 for inputting various types of settings, an operation portion 71 which forms a processing data generating section for generating laser processing data based on information inputted through the input portion 4, a display portion 5 for displaying the setting contents and laser processing data after operation, and a storage portion 72 for storing a variety of setting data. The display portion 5 includes a processing image display portion, which can display a three-dimensional image of the surface of the object to be surfaced, and a head image displaying section, which can display an image of the marking head 2A when a three-dimensional image of the surface of the object to be processed is displayed on the processing image display portion. The input portion 4 works as a processing condition setting portion for inputting processing conditions for processing in a desired processing pattern, and functions as a processed surface profile inputting section for inputting profile information showing the three-dimensional form on the processed surface of a workpiece, a processing pattern inputting section for inputting processing pattern information, a processing block setting section for setting a number of processing blocks inside the work region, which can set a processing pattern for each processing block, a group setting section for setting a processing group where a number of processing blocks which are set by the block setting section are collected, and a location adjusting section which can adjust the location of a processing pattern placed on the surface of the object to be processed. The processed surface profile inputting section further functions as a basic figure designating section for designating a basic figure representing the surface of the object to be processed and a three-dimensional form data inputting section for inputting three-dimensional form data representing the surface of the object to be processed from the outside. The storing portion 72 corresponds to the memory portion 52 in FIG. 1, and is a member for storing such information as profile information set in the input portion 4 and processing pattern information, and a storing medium, such as a fixed memory apparatus or a semiconductor memory, can be used for the storing portion. A dedicated display may be provided as the display portion 5, or the monitor of a computer connected to the system may be used. For the processing conditions set by this laser processing data setting apparatus 70, the processing power (laser output) and scanning speed, in addition to the working distance, the amount of defocus, the diameter of the spot and the type of workpiece (black coloring process on iron, black coloring process on stainless steel, material for workpiece, for example an ABS resin, a polycarbonate resin or a phenol resin, and purpose of processing, such as fusion of resin or roughening of surface), are set if necessary. Further, a number of processing blocks may be set, and processing pattern information may be set in processing block units. In particular, the power of the laser output beam and the diameter of the beam can be freely changed in the settings, such as the material for the workpiece, which is the object to be processed for each processing block, the processing pattern, the finished state or the time for processing, in laser processing apparatuses which can achieve a laser output beam having excellent increase properties. Furthermore, the processing parameters for the processing conditions that are once set are stored as setting data and can be called out when necessary.

The response properties of the scanner, that is, the response time required to complete the actual operation after an operation instruction is supplied to the scanner, depend on the scanner in general laser beam scanning systems. In laser processing apparatuses having X, Y and Z axis scanners which can carry out three-dimensional processing, for example, the response properties of the Z axis scanner generally tend to be inferior to those of the X and Y axis scanners. As shown in FIG. 24, for example, the X and Y axis scanners perform scanning using a mirror which rotates by means of a galvano scanner, while the Z axis scanner has a mechanism where the lens itself is translated in the direction of the optical axis. Therefore, the response properties of the Z axis scanner are disadvantageous in comparison with the X and Y axis scanners, due to the operation mechanism where the rotational movement using a motor is converted to translation. Further, though the Z axis scanner can be driven by a cylinder, a piston or the like without using a motor, even in this case, the Z axis scanner becomes disadvantageous in comparison with the X and Y axis scanners in terms of the response speed. As a result, there is standby time in the control of the scanners, by the amount by which the response time of the motor for driving the Z axis scanner is delayed from the X and Y axis scanners. Therefore, the control portion 50 selects the optimal movement path in accordance with the processing pattern, so that an appropriate movement path can be selected in accordance with the response properties of the used scanners and the form of the workpiece. Preferably a path which prevents as much as possible use of a scanner having inferior response performance is selected, and thus, high-speed movement can be implemented.

Furthermore, the optical properties can be corrected using the Z axis scanner, as shown in FIG. 27. That is, in the case where the Z axis scanner allows the location of the focal point to be corrected by an fθ lens, the tracking function of the Z axis scanner can be used so that the Z coordinate is involved. In this case also, the tracking function is turned off when the emission of the laser output beam is tuned off, and thus, excessive standby time is prevented, the response properties improved, and the time required for processing can be shortened. As described above, tracking of the Z axis is changed in accordance with the turning ON/OFF of the emission of the laser output beam, and in particular, excessive movement in the Z direction can be prevented when the emission is turned off, and thus, the scanner can be driven efficiently.

The laser processing apparatus and the solid laser resonator according to the present invention are widely applicable in processes using irradiation with a laser, for example, marking, drilling, trimming, scribing, surface processing, material processing, spectrometry, wafer inspection, medical diagnosis and laser printing, and can be used for such applications as microscopic processing for semiconductors, display repair, trimming systems and the like.

What is claimed is:

1. A laser processing apparatus, comprising:

a laser control portion including a laser pumping portion for generating a laser beam;

an pumping light transfer medium for transferring a laser beam generated by said laser control portion; and a laser output portion including a laser beam scanning system for performing scanning with a laser beam transferred through said pumping light transfer medium, wherein said laser output portion includes:

a crystal solid laser medium extending in one direction, has two end surfaces and generates laser oscillation when pumping light from said laser pumping portion through said pumping light transfer medium enters through said two end surfaces;

a splitting part for splitting pumping light outputted from said laser pumping portion into two paths so that different pumping components of pumping light enter through said respective end surfaces of said solid laser medium along said respective split paths;

dichroic mirrors placed along said split paths in such a manner as to face said respective end surface, allow pumping light to transmit and reflect laser oscillation light toward said end surfaces;

an output mirror placed in such a location as no-interference with said split paths and oriented in a direction approximately perpendicular to said laser oscillation light, and outputs said laser oscillation light from said dichroic mirrors; and condenser lenses placed along said split paths in such a manner as to face said dichroic mirrors and condense pumping light that transmits through said dichroic mirrors so that the diameter of the spot where said end surfaces of said solid laser medium are pumped becomes smaller than in the $TEM_{00}$ mode of said solid laser medium, and is formed so that pumping light enters through said respective end surfaces of said solid laser medium and said solid laser medium is pumped, wherein said laser beam scanning system in said laser output portion includes:

a Z axis scanner which has a lens through which light enters and a lens through which light is emitted, and can adjust the focal distance of said laser beam by changing the relative distance between said lens through which light enters and said lens through which light is emitted along said optical axes of said laser light emitted from said laser pumping portion and said lenses through which light enters and is emitted in such a state that these optical axes coincide;

an X axis scanner or Y axis scanner for performing scanning with a laser beam which transmits through Z axis scanner in the direction of the X or Y axis; and a Y axis scanner or X axis scanner for performing scanning with said laser beam with which the X axis scanner or Y axis scanner performs scanning in the direction of the Y or X axis.

2. A laser processing apparatus, comprising:

a laser control portion including a laser pumping portion for generating a laser beam;

an pumping light transfer medium for transferring a laser beam generated by said laser control portion; and a laser output portion including a laser beam scanning system for performing scanning with a laser beam transferred through said pumping light transfer medium, wherein said laser output portion includes:

a crystal solid laser medium extending in one direction, has two end surfaces and generates laser oscillation when pumping light from said laser pumping portion through said pumping light transfer medium enters through said two end surfaces, where said end surfaces are a first end surface which forms a surface through which pumping light enters, and a second end surface which is on the opposite side to said first end surface and forms a surface through which pumping light enters and is emitted;

a splitting part for splitting pumping light outputted from said laser pumping portion into a first split path and a second split path, in such a manner said first and second pumping components of pumping light enter said first and second end surfaces of said solid laser medium through said first and second split paths, respectively;

a first dichroic mirror which is placed along said first split path in such a manner as to face said first end surface, allows pumping light to transmit, and reflects laser oscillation light toward said first end surface side;

a second dichroic mirror which is placed along said second split path in such a manner as to face said second end surface, allows pumping light to transmit, and reflects laser oscillation light;

an output mirror placed in such a location as no-interference with said split paths and oriented in a direction approximately perpendicular to said laser oscillation light, inputs and outputs light reflected from said second dichroic mirror;

a first condenser lens placed along said first split path in such a manner as to face said first dichroic mirror and condense a first pumping component of pumping light that transmits through said first dichroic mirror in such a manner that the diameter of the spot where said first end surface is pumped becomes smaller than in the $TEM_{00}$ mode of said solid laser medium; and a second condenser lens placed along said second split path in such a manner as to face said second dichroic mirror and condense a second pumping component of pumping light that transmits through said second dichroic mirror in such a manner that the diameter of the spot where said second end surface is pumped becomes smaller than in the $TEM_{00}$ mode of said solid laser medium, and is formed so that said first and second pumping components of pumping light enter through said first and second end surfaces of said solid laser medium and said solid laser medium is pumped, wherein said splitting part splits entering light into said first pumping component and said second pumping component at a ratio set to approximately 2:1 to 4:1.

3. The laser processing apparatus according to claim 2, wherein the reflectance of said output mirror is 30% to 70%.

4. The laser processing apparatus according to claim 2, wherein said laser pumping portion comprises a semiconductor laser and pumping light emitted from said semiconductor laser is not polarized.

5. The laser processing apparatus according to claim 2, wherein a Q switch is provided between said output mirror and said second dichroic mirror.

6. The laser processing apparatus according to claim 2, wherein said laser output portion further includes:

a first reflecting mirror for reflecting said first or second pumping component resulting from said split by said splitting part approximately perpendicularly;

a second reflecting mirror for further reflecting said light reflected from said first reflecting mirror or said second or first pumping component resulting from said split by said splitting part in an approximately perpendicular direction; and a third reflecting mirror for reflecting said light reflected from said second reflecting mirror approximately perpendicularly, wherein said split paths, including said first and second split paths, said splitting part and said first, second and third reflecting mirrors, are formed in rectangular form, said solid laser medium and said first and second dichroic mirrors are placed on any side of said rectangular form, and the arrangement allows pumping light from said laser pumping portion to enter through any apex of said rectangular form and a line extending from either side of said rectangular form which includes said apex.

7. The laser processing apparatus according to claim 2, further comprising:

an pumping light coupling part for optically coupling said pumping light transfer medium to said splitting part; and an aperture which is located between said second dichroic mirror and said output mirror and reshapes laser oscillation light.

8. The laser processing apparatus according to claim 2, wherein said laser beam scanning system in said laser output portion includes:

a Z axis scanner which has a lens through which light enters and a lens through which light is emitted, and can adjust the focal distance of said laser beam by changing the relative distance between said lens through which light enters and said lens through which light is emitted along said optical axes of said laser light emitted from said laser pumping portion and said lenses through which light enters and is emitted in such a state that these optical axes coincide;

an X axis scanner or Y axis scanner for performing scanning with a laser beam which transmits through Z axis scanner in the direction of the X or Y axis; and a Y axis scanner or X axis scanner for performing scanning with said laser beam with which the X axis scanner or Y axis scanner performs scanning in the direction of the Y or X axis.

9. A solid laser resonator, comprising:

a pumping light source for generating pumping light;

a crystal solid laser medium which extends in one direction, has two end surfaces and generates laser oscillation when pumping light from said pumping light source enters through said two end surfaces;

a splitting part for splitting pumping light outputted from said pumping light source into two paths in such a manner that different pumping components of pumping light enter through the respective end surfaces of said solid laser medium along the respective split paths;

dichroic mirrors which are placed along said split paths in such a manner as to face the respective end surfaces, allow pumping light to transmit, and reflect laser oscillation light toward said end surfaces;

an output mirror which is placed in such a location as no-interference with said split paths and oriented in a direction approximately perpendicular to said laser oscillation light, and outputs laser oscillation light from said dichroic mirrors; and condenser lenses which are placed along said split paths in such a manner as to face said dichroic mirrors and condense pumping light that transmits through said dichroic mirrors in such a manner that the diameter of the spot where said end surfaces of said solid laser medium are irradiated is smaller than in the $TEM_{00}$ mode of said solid laser medium, and being formed so that pumping light enters the respective end surfaces of said solid laser medium and said solid laser medium is pumped, wherein said splitting part splits entering light into said first pumping component and said second pumping component at a ratio set to approximately 2:1 to 4:1.

10. A laser processing apparatus, comprising:
a laser control portion including a laser pumping portion for generating a laser beam;
a pumping light transfer medium for transferring a laser beam generated in said laser control portion; and
a laser output portion including a laser beam scanning system for performing scanning with a laser beam transferred through said pumping light transfer medium, wherein
said laser output portion includes:
a crystal solid laser medium extending in one direction, has two end surfaces and generates laser oscillation when pumping light from said laser pumping portion through said pumping light transfer medium enters through said two end surfaces, where said end surfaces are
a first end surface which forms a surface through which said pumping light enters, and
a second end surface which is on the opposite side to said first end surface and forms a surface through which said pumping light enters and is emitted;
a splitting part for splitting pumping light outputted from said laser pumping portion into a first split path and a second split path, in such a manner that first and second pumping components of pumping light enter through said first and second end surfaces of said solid laser medium through said first and second split paths, respectively, and said first pumping component being larger than said second pumping component;
a first dichroic mirror which is placed along said first split path in such a manner as to face said first end surface, allows pumping light to transmit, and reflects laser oscillation light toward said first end surface side;
a second dichroic mirror which is placed along said second split path in such a manner as to face said second end surface, allows pumping light to transmit, and reflects laser oscillation light; and
an output mirror placed in such a location as no-interference with said split paths and oriented in a direction approximately perpendicular to laser oscillation light, inputs and outputs light reflected from said second dichroic mirror, and is formed so that said first and second pumping components of pumping light enter said first and second end surfaces of said solid laser medium respectively, and said solid laser medium is pumped; and
wherein said laser beam scanning system in said laser output portion further includes:
a Z axis scanner which has a lens through which light enters and a lens through which light is emitted, and adjust the focal distance of said laser beam by changing the relative distance between said lens through which light enters and said lens through which light is emitted along the optical axes of said laser light emitted from said laser pumping portion and said lenses through which light enters and is emitted in such a state that these optical axes coincide;
an X axis scanner or Y axis scanner for performing scanning with a laser beam which transmits through Z axis scanner in the direction of the X or Y axis; and
a Y axis scanner or X axis scanner for performing scanning with said laser beam with which the X axis scanner or Y axis scanner performs scanning in the direction of the Y or X axis.

11. The laser processing apparatus according to claim 10, wherein the ratio with which said splitting part splits entering light into said first pumping component and said second pumping component is set to approximately 2:1.

12. The laser processing apparatus according to claim 10, wherein a Q switch is provided between said output mirror and said second dichroic mirror.

13. The laser processing apparatus according to claim 10, comprising:
a first condenser lens which is placed along said first split path in such a manner as to face said first dichroic mirror and condenses pumping light that transmits through said first dichroic mirror so that the diameter of the spot where said first end surface is irradiated with said first pumping component becomes smaller than in the $TEM_{00}$ mode of said solid laser medium; and
a second condenser lens which is placed along said second split path in such a manner as to face said second dichroic mirror and condenses pumping light that transmits through said second dichroic mirror so that the diameter of the spot where said second end surface is irradiated with said second pumping component becomes smaller than in the $TEM_{00}$ mode of said solid laser medium.

14. The laser processing apparatus according to claim 10, wherein
said laser output portion further includes:
a first reflecting mirror for reflecting said first or second pumping component resulting from said split by said splitting part approximately perpendicularly;
a second reflecting mirror for further reflecting said light reflected from said first reflecting mirror or said second or first pumping component resulting from said split by said splitting part in an approximately perpendicular direction; and
a third reflecting mirror for reflecting said light reflected from said second reflecting mirror approximately perpendicularly, wherein
said split paths, including said first and second split paths, said splitting part and said first, second and third reflecting mirrors, are formed in rectangular form, said solid laser medium and said first and second dichroic mirrors are placed on any side of said rectangular form, and the arrangement allows pumping light from said laser pumping portion to enter through any apex of said rectangular form and a line extending from either side of said rectangular form which includes said apex.

15. The laser processing apparatus according to claim 10, further comprising:
a pumping light coupling part for optically coupling said pumping light transfer medium to said splitting part; and
an aperture, which is located between said second dichroic mirror and said output mirror, that reshapes laser oscillation light.

16. A laser processing apparatus, comprising:
a laser control portion including a laser pumping portion for generating a laser beam;
a pumping light transfer medium for transferring a laser beam generated in said laser control portion; and a laser output portion including a laser beam scanning system for performing scanning with a laser beam transferred through said pumping light transfer medium, wherein said laser output portion includes:

a crystal solid laser medium which extends in one direction, has two end surfaces and generates laser oscillation when pumping light from said laser pumping portion enters through said two end surfaces, where said end surfaces are a first end surface which forms a surface through which pumping light enters, and a second end surface which is on the side opposite to said first end surface and forms a surface through which pumping light enters and is emitted;

a splitting part for splitting pumping light outputted from said laser pumping portion into a first split path and a second split path, so that first and second pumping components of pumping light enter through said first and second end surfaces of said solid laser medium through said first and second split paths, respectively;

a first reflecting mirror for reflecting said first or second pumping component resulting from said split by said splitting part approximately perpendicularly;

a second reflecting mirror for further reflecting said light reflected from said first reflecting mirror or said second or first pumping component resulting from said split by said splitting part in an approximately perpendicular direction;

a third reflecting mirror for reflecting said light reflected from said second reflecting mirror approximately perpendicularly;

a first dichroic mirror which is placed along said first split path in such a manner as to face said first end surface, allows pumping light to transmit, and reflects laser oscillation light toward said first end surface side;

a second dichroic mirror which is placed along said second split path in such a manner as to face said second end surface, allows pumping light to transmit, and reflects laser oscillation light; and an output mirror which is placed in such a location as no-interference with said split paths and oriented in a direction approximately perpendicular to laser oscillation light, inputs and outputs light reflected from said second dichroic mirror, and is formed so that said solid laser medium and said first and second dichroic mirrors form a laser pumping portion, said first and second pumping components of pumping light enter said first and second end surfaces of said solid laser medium respectively, and said solid laser medium is pumped, and said split paths, including said first and second split paths, said splitting part and said first, second and third reflecting mirrors, are formed in rectangular form, said solid laser medium and said first and second dichroic mirrors are placed on any side of said rectangular form, and the arrangement allows pumping light from said laser pumping portion to enter through any apex of said rectangular form and a line extending from either side of said rectangular form which includes said apex, and wherein said laser light scanning system in said laser output portion further includes:

a Z axis scanner which has a lens through which light enters and a lens through which light is emitted, and can adjust said focal distance of said laser beam by changing the relative distance between said lens through which light enters and said lens through which light is emitted along said optical axes of said laser light emitted from said laser pumping portion and said lenses through which light enters and is emitted in such a state that these optical axes coincide;

an X axis scanner or Y axis scanner for performing scanning with a laser beam which transmits through Z axis scanner in the direction of the X or Y axis; and a Y axis scanner or X axis scanner for performing scanning with said laser beam with which the X axis scanner or Y axis scanner performs scanning in the direction of the Y or X axis.

17. The laser processing apparatus according to claim 16, wherein said splitting part splits pumping light from said laser pumping portion into a first pumping component which transmits in the direction in which said pumping light goes, and a second pumping component which is reflected at an approximately right angle relative to the straight direction in which said first pumping component goes, said first reflecting mirror reflects said first pumping component which goes straight from said splitting part at an approximately right angle so that said first pumping component transmits through said first dichroic mirror and enters through said first end surface of said solid laser medium, said second reflecting mirror reflects said second pumping component at an approximately right angle so that said second pumping component goes in a direction approximately parallel to the straight direction in which said first pumping component goes, said third reflecting mirror reflects said light of said second pumping component which is reflected from said second reflecting mirror at an approximately right angle so that said reflected light transmits through said second dichroic mirror and enters through said second end surface of said solid laser medium, and said light of said first pumping component which is reflected from said first reflecting mirror and said light of said second pumping component which is reflected from said third reflecting mirror are adjusted so as to face each other along the same axial line.

18. The laser processing apparatus according to claim 16, wherein said splitting part splits pumping light from said laser pumping portion into a second pumping component which transmits in the direction in which said pumping light goes, and a first pumping component which is reflected at an approximately right angle relative to the straight direction in which said second pumping component goes, said first reflecting mirror reflects said first pumping component which is reflected from said splitting part at an approximately right angle so that said first pumping component transmits through said first dichroic mirror and enters through said first end surface of said solid laser medium, said second reflecting mirror reflects said second pumping component which goes straight from said splitting part at an approximately right angle, said third reflecting mirror reflects said light of said second pumping component which is reflected from said second reflecting mirror at an approximately right angle so that said reflected light transmits through said second dichroic mirror and enters through said second end surface of said solid laser medium, and said light of said first pumping component which is reflected from said first reflecting mirror and said light of said second pumping component which is reflected from said third reflecting mirror are adjusted so as to face each other along the same axial line.

19. The laser processing apparatus according to claim 16, wherein
said splitting part splits pumping light from said laser pumping portion into a first pumping component which transmits in the direction in which said pumping light goes, and a second pumping component which is reflected at an approximately right angle relative to the straight direction in which said first pumping component goes so that said first pumping component transmits through said first dichroic mirror and enters through said first end surface of said solid laser medium,
said first reflecting mirror reflects said second pumping component which is reflected from said splitting part at an approximately right angle at an approximately right angle,
said second reflecting mirror reflects light of said second pumping component which is reflected from said first reflecting mirror at an approximately right angle,
said third reflecting mirror reflects said light of said second pumping component which is reflected from said second reflecting mirror at an approximately right angle so that said reflected light transmits through said second dichroic mirror and enters through said second end surface of said solid laser medium, and
said transmitting light of said first pumping component which is split by said splitting part and said light of said second pumping component which is reflected from said third reflecting mirror are adjusted so as to face each other along the same axial line.

20. The laser processing apparatus according to claim 16, wherein
said splitting part splits pumping light from said laser pumping portion into a second pumping component which transmits in the direction in which said pumping light goes, and a first pumping component which is reflected at an approximately right angle relative to the straight direction in which said second pumping component goes so that said first pumping component transmits through
said first dichroic mirror and enters through said first end surface of said solid laser medium,
said first reflecting mirror reflects said second pumping component which transmits through said splitting part at an approximately right angle,
said second reflecting mirror reflects light of said second pumping component which is reflected from said first reflecting mirror at an approximately right angle,
said third reflecting mirror reflects said light of said second pumping component which is reflected from said second reflecting mirror at an approximately right angle so that said reflected light transmits through said second dichroic mirror and enters through said second end surface of said solid laser medium, and
said first pumping component which is split by said splitting part and said light of said second pumping component which is reflected from said third reflecting mirror are adjusted so as to face each other along the same axial line.

21. The laser processing apparatus according to claim 16, wherein
said splitting part splits pumping light from said laser pumping portion into a first pumping component which transmits in the direction in which said pumping light goes, and a second pumping component which is reflected at an approximately right angle relative to the straight direction in which said first pumping component goes so that said second pumping component transmits through said second dichroic mirror and enters through said second end surface of said solid laser medium,
said first reflecting mirror reflects said first pumping component which transmits through said splitting part at an approximately right angle,
said second reflecting mirror reflects light of said first pumping component which is reflected from said first reflecting mirror at an approximately right angle,
said third reflecting mirror reflects said light of said first pumping component which is reflected from said second reflecting mirror at an approximately right angle so that said reflected light transmits through said first dichroic mirror and enters through said first end surface of said solid laser medium, and
said second pumping component which is split by said splitting part and said light of said first pumping component which is reflected from said third reflecting mirror are adjusted so as to face each other along the same axial line.

22. The laser processing apparatus according to claim 16, wherein
said splitting part splits pumping light from said laser pumping portion into a second pumping component which transmits in the direction in which said pumping light goes, and a first pumping component which is reflected at an approximately right angle relative to the straight direction in which said second pumping component goes so that said second pumping component transmits through said second dichroic mirror and enters through said second end surface of said solid laser medium,
said first reflecting mirror reflects said first pumping component which is reflected from said splitting part at an approximately right angle,
said second reflecting mirror reflects light of said first pumping component which is reflected from said first reflecting mirror at an approximately right angle,
said third reflecting mirror reflects said light of said first pumping component which is reflected from said second reflecting mirror at an approximately right angle so that said reflected light transmits through said first dichroic mirror and enters through said first end surface of said solid laser medium, and
said second pumping component which is split by said splitting part and said light of said first pumping component which is reflected from said third reflecting mirror are adjusted so as to face each other along the same axial line.

23. The laser processing apparatus according to claim 16, wherein
said splitting part splits pumping light from said laser pumping portion into a first pumping component which transmits in the direction in which said pumping light goes, and a second pumping component which is reflected at an approximately right angle relative to the straight direction in which said first pumping component goes,
said first reflecting mirror reflects said first pumping component which is reflected from said splitting part at an approximately right angle,
said second reflecting mirror reflects said light of said first pumping component which is reflected from said first reflecting mirror at an approximately right angle so that said reflected light transmits through said first dichroic mirror and enters through said first end surface of said solid laser medium, said third reflecting mirror reflects said second pumping component which results from said split by said splitting part at an approximately right angle so that said second pumping component transmits through said second dichroic mirror and enters through said second end surface of said solid laser medium, and said light of said first pumping component which is reflected from said second reflecting mirror and said light of said second pumping component which is reflected from said third reflecting mirror are adjusted so as to face each other along the same axial line.

24. The laser processing apparatus according to claim 16, wherein said splitting part splits pumping light from said laser pumping portion into a second pumping component which transmits in the direction in which said pumping light goes, and a first pumping component which is reflected at an approximately right angle relative to the straight direction in which said second pumping component goes, said first reflecting mirror reflects said first pumping component which is reflected from said splitting part at an approximately right angle, said second reflecting mirror reflects said light of said first pumping component which is reflected from said first reflecting mirror at an approximately right angle so that said reflected light transmits through said first dichroic mirror and enters through said first end surface of said solid laser medium, said third reflecting mirror reflects said second pumping component which results from said split by said splitting part at an approximately right angle so that said second pumping component transmits through said second dichroic mirror and enters through said second end surface of said solid laser medium, and said light of said first pumping component which is reflected from said second reflecting mirror and said light of said second pumping component which is reflected from said third reflecting mirror are adjusted so as to face each other along the same axial line.

25. The laser processing apparatus according to claim 16, wherein said splitting part, said first reflecting mirror, said second reflecting mirror and said third reflecting mirror are placed in the same plane.

26. The laser processing apparatus according to claim 16, wherein said split path, including said first and second split paths, is formed in rectangular form, and said solid laser medium and said first and second dichroic mirrors are placed along either long side of said split path in rectangular form.

27. The laser processing apparatus according to claim 16, wherein said laser output portion further includes:

a first condenser lens which is placed along said first split path in such a manner as to face said first dichroic mirror and condenses pumping light that transmits through said first dichroic mirror so that the diameter of the spot where said first end surface is irradiated with said first pumping component becomes smaller than in the $TEM_{00}$ mode of said solid laser medium; and a second condenser lens which is placed along said second split path in such a manner as to face said second dichroic mirror and condenses pumping light that transmits through said second dichroic mirror so that the diameter of the spot where said second end surface is irradiated with said second pumping component becomes smaller than in the $TEM_{00}$ mode of said solid laser medium.

28. The laser processing apparatus according to claim 16, wherein said laser output portion further includes:

a pumping light coupling part for optically coupling said pumping light transfer medium to said splitting part; and an aperture, which is located between said second dichroic mirror and said output mirror, that reshapes laser oscillation light.

29. A laser processing apparatus, comprising:

a laser control portion including a laser pumping portion for generating a laser beam;

a pumping light transfer medium for transferring a laser beam generated by said laser control portion; and a laser output portion including a laser beam scanning system for performing scanning with a laser beam transferred through said pumping light transfer medium, wherein said laser output portion includes:

a crystal solid laser medium extending in one direction, has two end surfaces and generates laser oscillation when pumping light from said laser pumping portion through said pumping light transfer medium enters through said two end surfaces;

a splitting part for splitting pumping light outputted from said laser pumping portion into two paths so that different pumping components of pumping light enter through said respective end surfaces of said solid laser medium along said respective split paths;

dichroic mirrors placed along said split paths in such a manner as to face said respective end surface, allow pumping light to transmit and reflect laser oscillation light toward said end surfaces;

an output mirror placed in such a location as no-interference with said split paths and oriented in a direction approximately perpendicular to said laser oscillation light, and outputs said laser oscillation light from said dichroic mirrors; and condenser lenses placed along said split paths in such a manner as to face said dichroic mirrors and condense pumping light that transmits through said dichroic mirrors and is formed so that pumping light enters through said respective end surfaces of said solid laser medium and said solid laser medium is pumped, and wherein said laser beam scanning system in said laser output portion includes:

a Z axis scanner which has a lens through which light enters and a lens through which light is emitted, and can adjust the focal distance of said laser beam by changing the relative distance between said lens through which light enters and said lens through which light is emitted along said optical axes of said laser light emitted from said laser pumping portion and said lenses through which light enters and is emitted in such a state that these optical axes coincide;

an X axis scanner or Y axis scanner for performing scanning with a laser beam which transmits through Z axis scanner in the direction of the X or Y axis; and a Y axis scanner or X axis scanner for performing scanning with said laser beam with which the X axis scanner or Y axis scanner performs scanning in the direction of the Y or X axis.

30. The laser processing apparatus according to claim 29, wherein said splitting part splits said pumping light in such a manner that there is more of said first pumping component than said second pumping component.

31. The laser processing apparatus according to claim 30, wherein the ratio at which said splitting part splits entering light into said first pumping component and said second pumping component is set to approximately 2:1.

32. The laser processing apparatus according to claim 29, wherein the reflectance of said output mirror is 30% to 70%.

33. The laser processing apparatus according to claim 29, wherein said laser pumping portion comprises a semiconductor laser and pumping light emitted from said semiconductor laser is not polarized.

34. The laser processing apparatus according to claim 29, wherein a Q switch is provided between said output mirror and said second dichroic mirror.

* * * * *